United States Patent [19]

Claydon et al.

[11] Patent Number: 5,742,622
[45] Date of Patent: Apr. 21, 1998

[54] ERROR DETECTION AND CORRECTION SYSTEM FOR A STREAM OF ENCODED DATA

[75] Inventors: Anthony Peter John Claydon, Bath; Richard John Gammack, Bristol; William Philip Robbins, Cam; Charles Dunlop MacFarlane, Dursley; Thomas Foxcroft; Andrew Peter Kuligowski, both of Clifton; Richard James Thomas, Dover Place, all of United Kingdom

[73] Assignee: Discovision Associates, Irvine, Calif.

[21] Appl. No.: 638,273

[22] Filed: Apr. 26, 1996

[30] Foreign Application Priority Data

Mar. 12, 1996 [GB] United Kingdom ............... 9605190

[51] Int. Cl.⁶ ........................................ H03M 13/12
[52] U.S. Cl. ........................................ 371/46; 371/43
[58] Field of Search .................... 371/43, 46, 37.4

[56] References Cited

U.S. PATENT DOCUMENTS

| | | | |
|---|---|---|---|
| 4,709,377 | 11/1987 | Martinez et al. | 375/265 |
| 4,713,829 | 12/1987 | Eyuboglu | 375/259 |
| 4,748,626 | 5/1988 | Wong | 371/30 |
| 4,918,446 | 4/1990 | Yagi | 341/94 |
| 4,932,029 | 6/1990 | Heichler | 371/43 |
| 5,162,797 | 11/1992 | Murata et al. | 341/107 |
| 5,233,630 | 8/1993 | Wolf | 375/308 |
| 5,363,408 | 11/1994 | Paik et al. | 375/261 |
| 5,408,502 | 4/1995 | How | 375/340 |
| 5,416,787 | 5/1995 | Kodama et al. | 371/43 |
| 5,465,275 | 11/1995 | Blaker et al. | 375/341 |
| 5,497,401 | 3/1996 | Ramaswamy et al. | 375/341 |

FOREIGN PATENT DOCUMENTS

| | | | |
|---|---|---|---|
| 052463 | 5/1982 | European Pat. Off. | H04L 27/02 |
| 0676875A1 | 10/1995 | European Pat. Off. | H04L 1/00 |
| 0682415A1 | 11/1995 | European Pat. Off. | H03M 13/12 |
| 9428656 | 12/1994 | WIPO | H04L 1/00 |

OTHER PUBLICATIONS

Meyr, H./Ascheid, G. Fully Digital Receiver for 100Mbit/s 8-PSK TCM Coded Transmission (DIRECS); Course 577 Advanced Digital Receivers for Mobile Communications: Algorithm, Design Methodology and DSP-tools, Technologies CEI-Europe Oct. 2-5 1995, Italy; Mar. 25-29, 1996, Switzerland.

T.K. Truong et al. "A VLSI Design for a Trace-Back Viterbi Decoder," IEEE Transactions on Communications, vol. 40, No. 3, Mar. 1992.

Fettweis, Gerhard and Heinrich Meyr. "Parallel Viterbi Algorithm Implementation: Breaking the ACS-Bottleneck," IEEE Transaction on Communications, vol. 37, No. 8, Aug. 1989.

(List continued on next page.)

*Primary Examiner*—Stephen M. Baker
*Attorney, Agent, or Firm*—Ronald J. Cla; Robert T. Braun; Arthur S. Bickel

[57] ABSTRACT

The invention provides a decoder of symbols of received data, the data being encoded according to a convolutional encoding scheme and transmitted through a communications channel. The data is punctuated according to a puncturing matrix, and has a plurality of state values which describe a sequence of state transitions. The decoder has a generation unit that accepts the received data for calculating metrics of the transitions thereof. A selector responsive to the generation unit selects a path of transitions corresponding to the path produced by a transmitter of the data stream. A traceback unit maintains historical information representative of sequential decision operations of the selector. A counter is provided for counting illegal state transitions of the path selected by the selector, and a control unit, responsive to the counter, determines a puncture rate and adjusts a puncture phase of the received data. The decoder can be used in a VLSI receiver circuit which is adapted to the reception of QPSK modulated data.

42 Claims, 64 Drawing Sheets

OTHER PUBLICATIONS

J. Sparso et al. "An Area-Efficient Topology for VLSI Implementation of Viterbi Decoders and Other Shuffle-Exhange Type Structures," IEEE Journal of Solid-State Circuits, vol. 26, No. 2, Feb. 1991.

Christopher, Lauren. John Stewart, Kumar Ramaswamy, Paul Wagner, Peter Murphy, Dave Albean, Dave McAllister. "A Fully Integrated Digital Demodulation and Forward Error Correction IC for Digital Satellite Television." IEEE Conf. May 1995, pp. 281–284.

ETS: European Telecommunication Standard 300 421 Dec. 1994 pp. 1–24.

Feygin, Gennady.P.G.Gulak. "Survivor Sequence Memory Management in Viterbi Decoders." IEE Int'l Symposium on Circuits and Systems Jun. 1991, vol. 5: 11–14, pp. 2967–2970.

Gardner, Floyd M. "A BPSK/QPSK Timing–Error Detector for Sampled Receivers." IEEE Transactions on Communications vol. 34, No. 5 1986, pp. 423–429.

Hagenauer, Joachim. "Rate–Compatible Punctured Convolutional Codes (RCPC Codes) and Their Applications." IEEE Transactions on Communications vol. 36, No. 4, Apr. 1988. pp. 389–400.

P.G. Gulak. Gennady Feygin. "Architectural Tradeoffs for Survivor Sequence Memory Management in Viterbi Decoders." IEEE Transactions on Communications vol. 41 No. 3 Mar. 1993 pp. 425–429.

Pellon, Leopold E. "A Double Nyquist Digital Product Detector for Quadrature Sampling." IEEE Transactions on Signal Processing 40, No. 7 Jul. 1992, pp. 1–11.

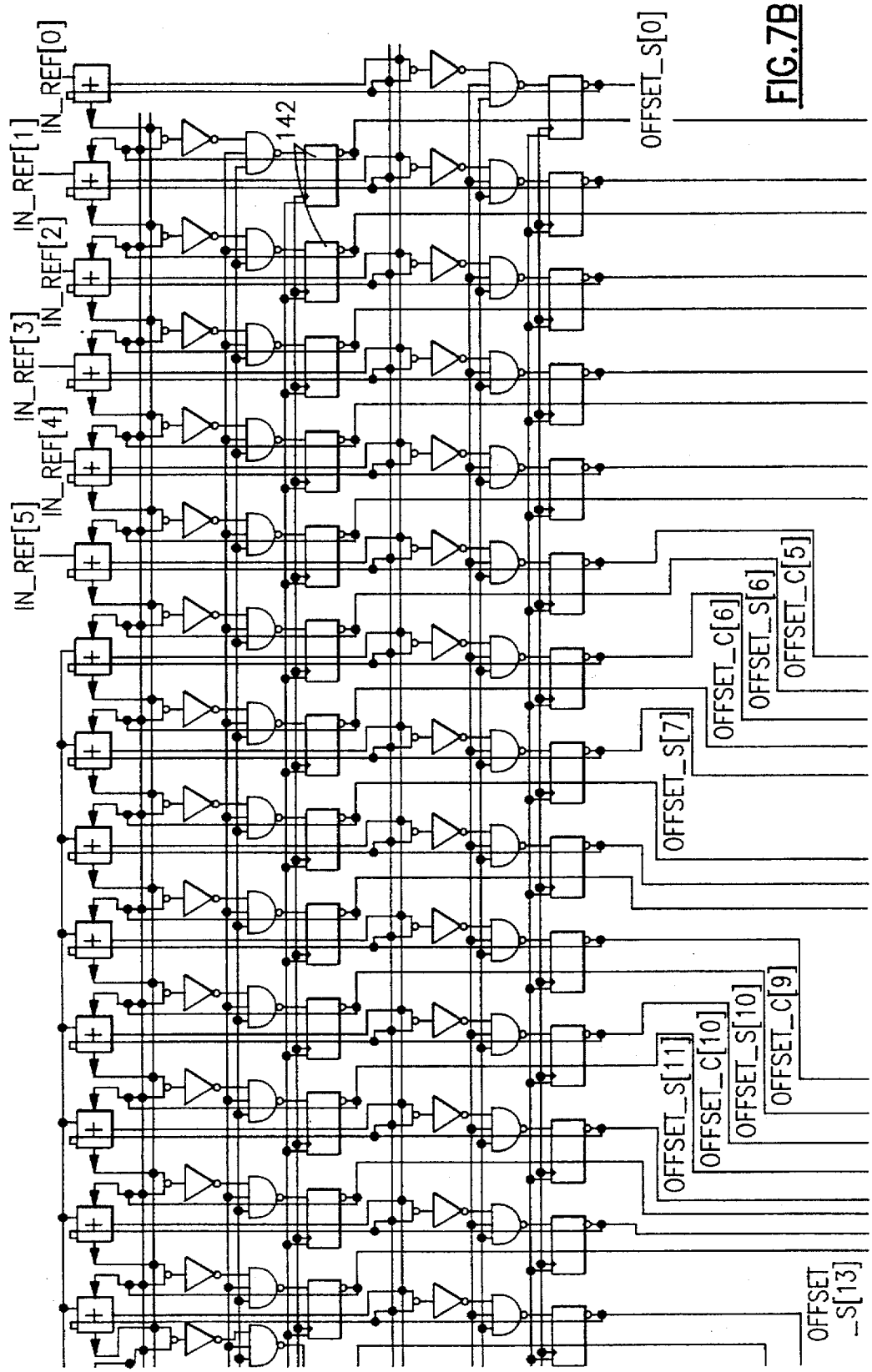

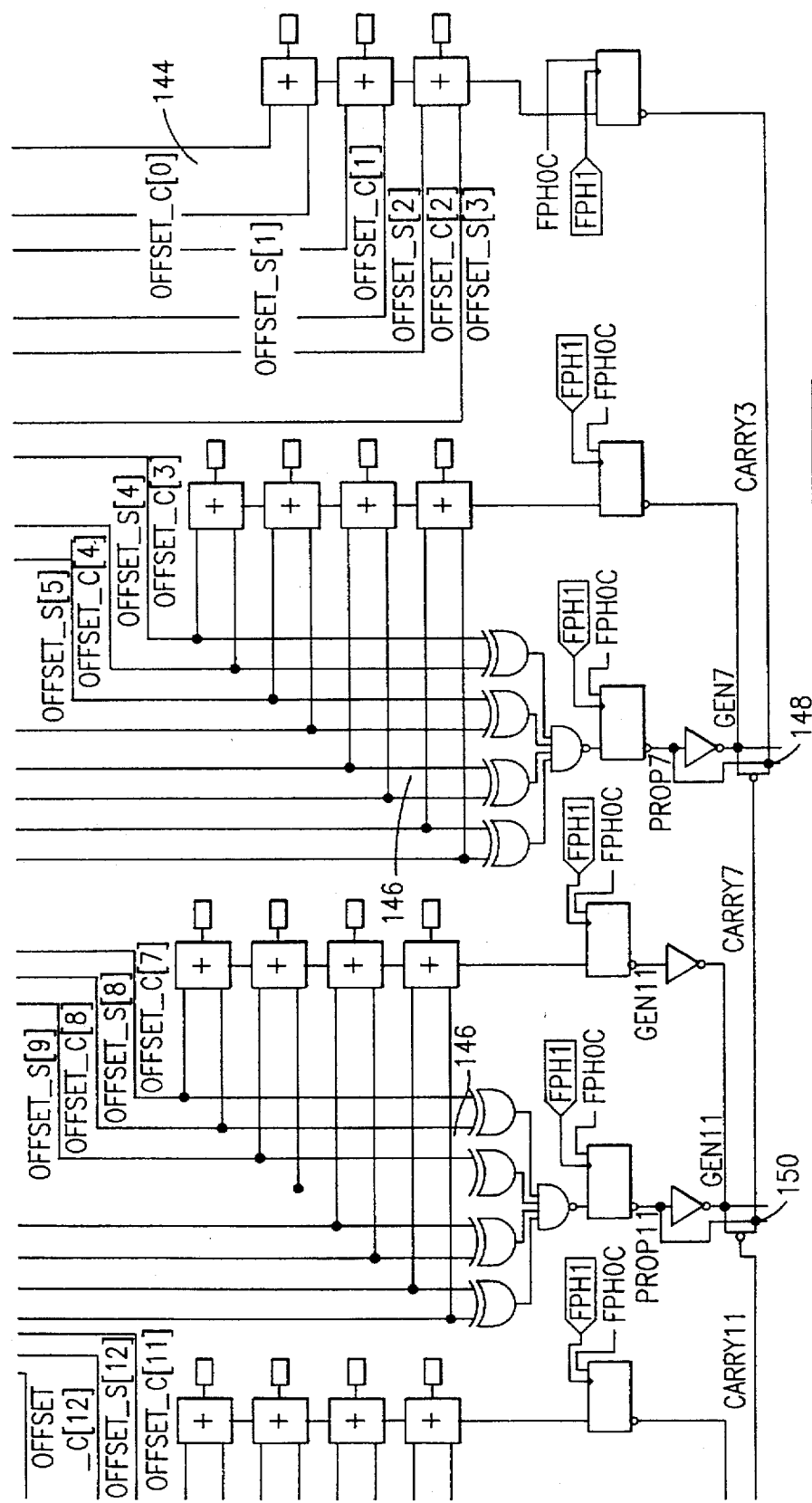

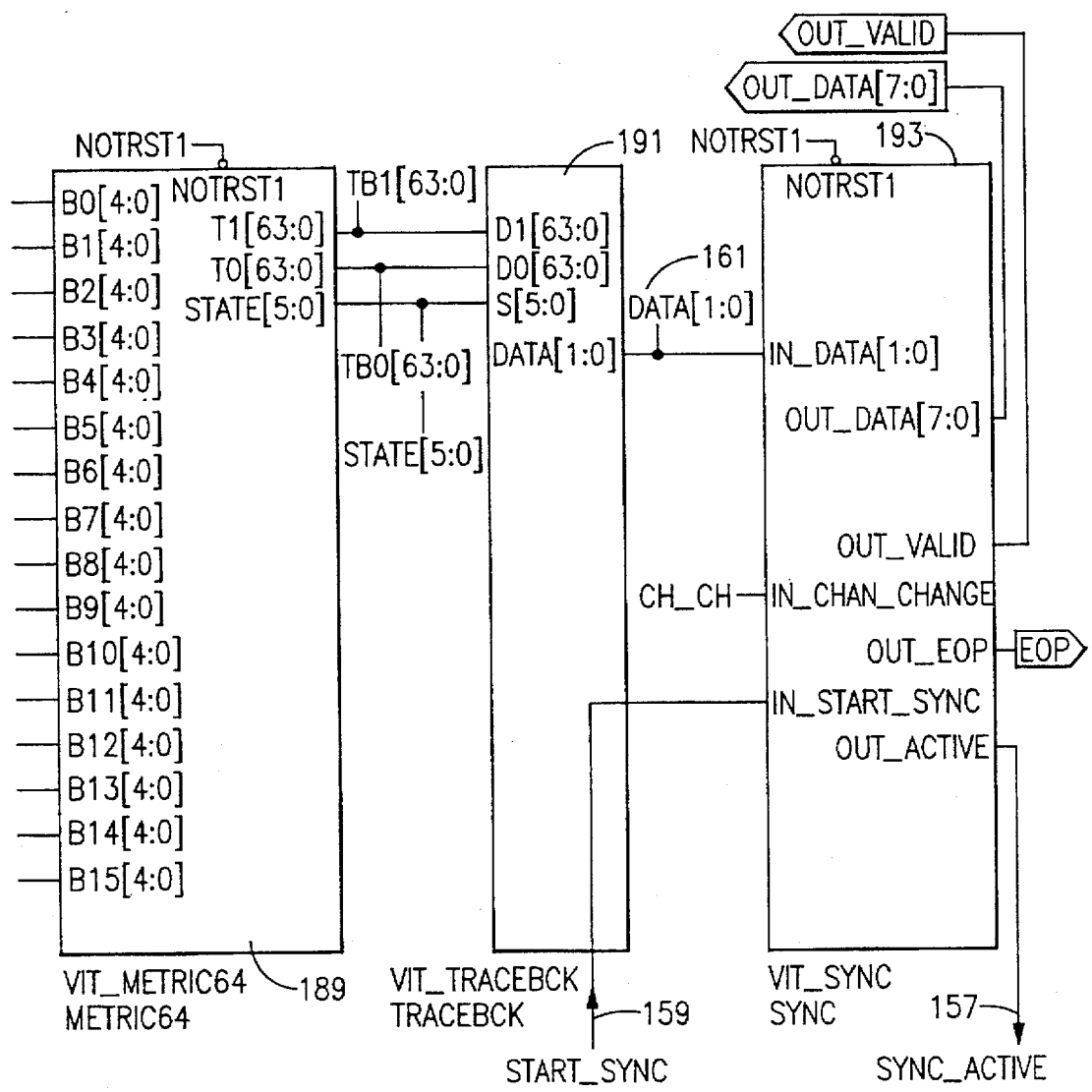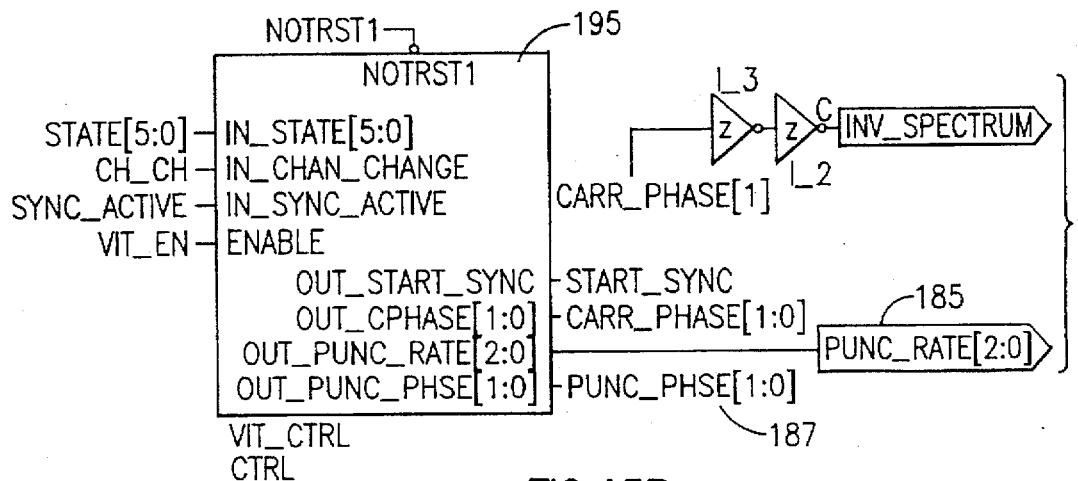
FIG.15B

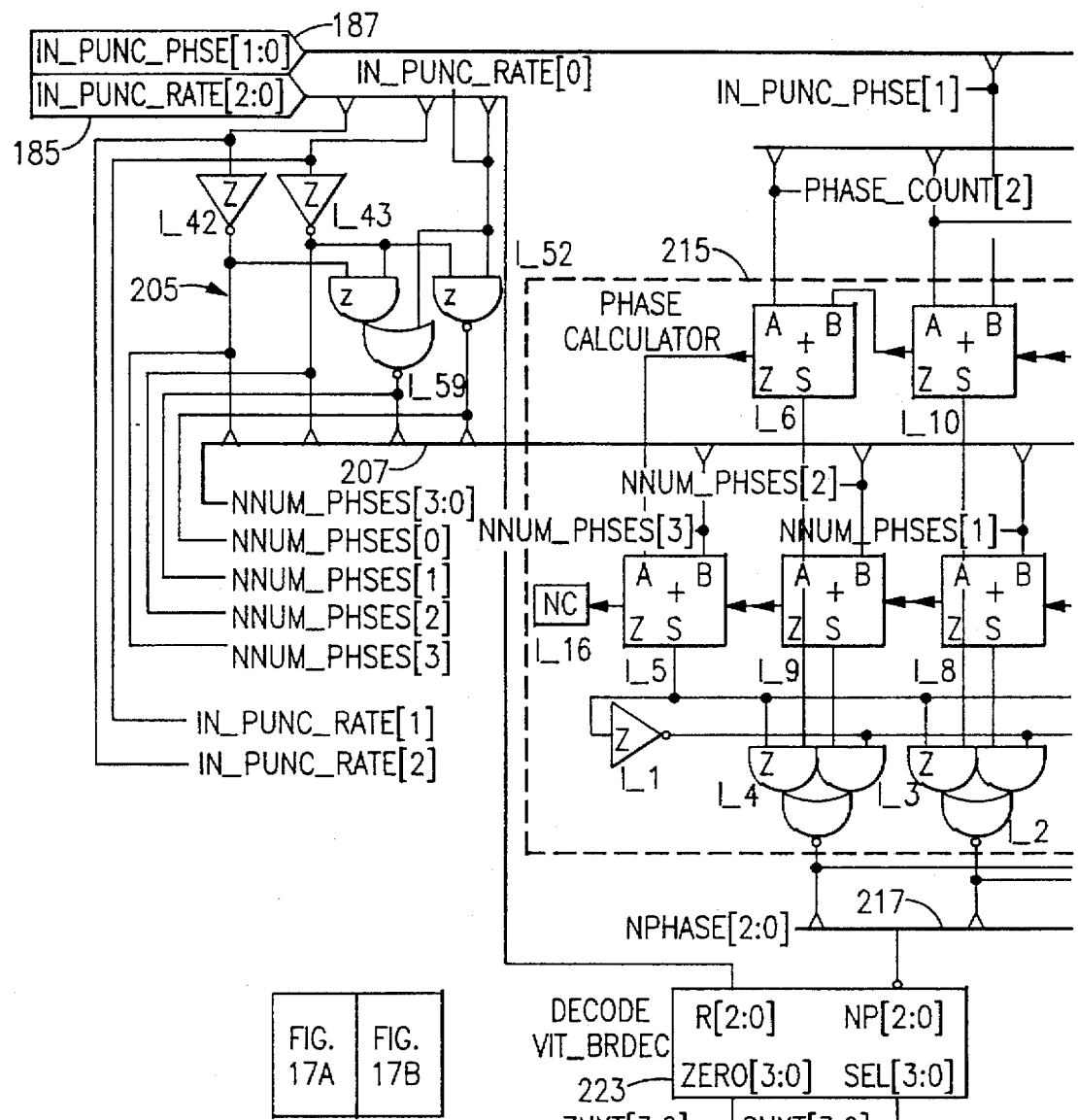
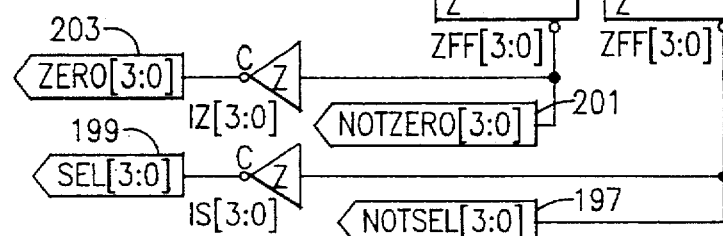
FIG. 17
FIG. 17A

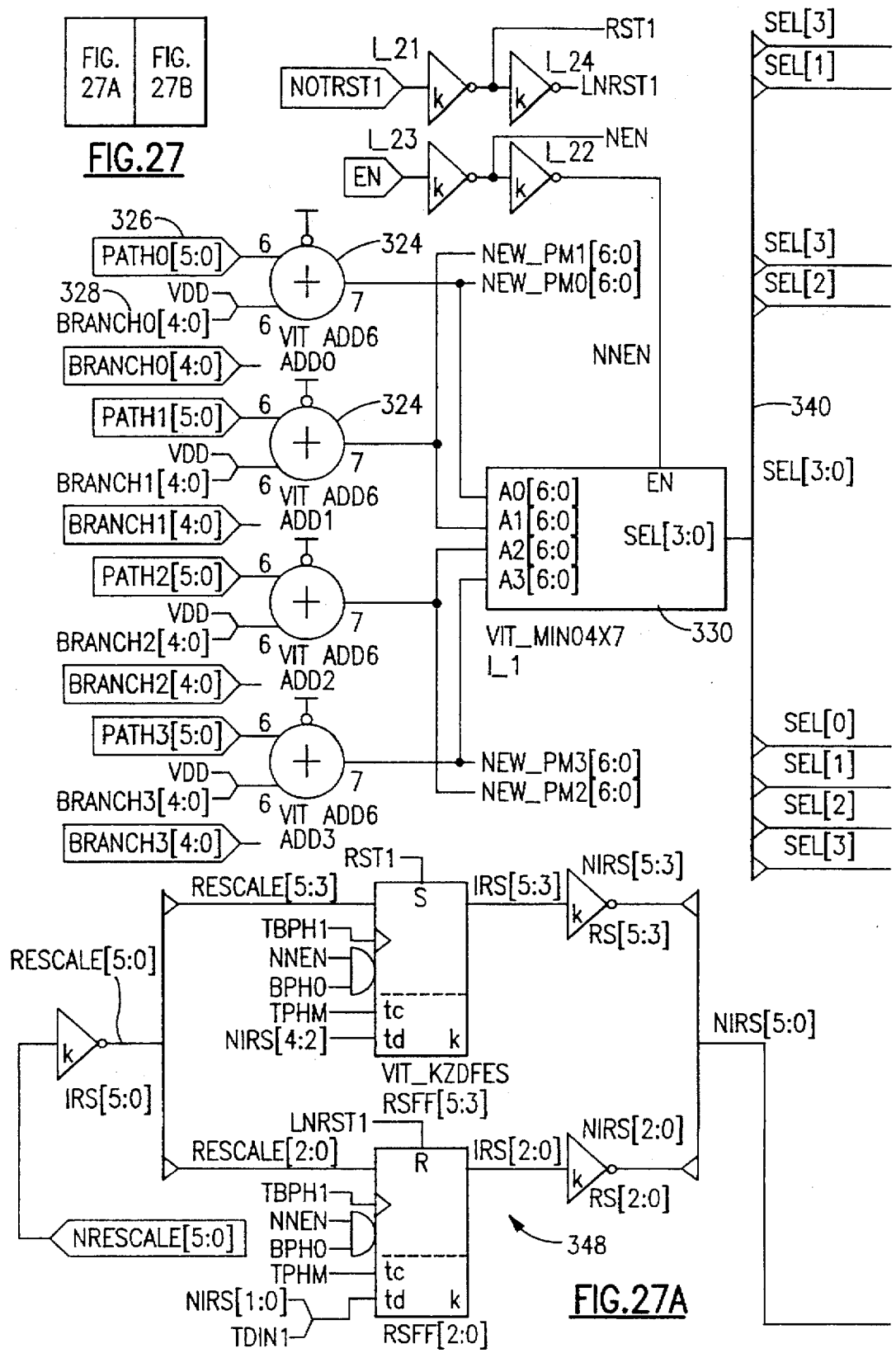

| | | | |
|---|---|---|---|
| 1105=65x17 | (1x17) BYTES | 1121 | |
| 1071=63x17 | (2x17) BYTES | 1104 | |
| 1020=60x17 | (3x17) BYTES | 1070 | |
| 952=56x17 | (4x17) BYTES | 1019 | |
| 867=51x17 | (5x17) BYTES | 951 | |
| 765=45x17 | (6x17) BYTES | 866 | |
| 646=38x17 | (7x17) BYTES | 764 | |
| 510=30x17 | (8x17) BYTES | 645 | |
| 357=21x17 | (9x17) BYTES | 509 | |
| 187=11x17 | (10x17) BYTES | 356 | |
| 0=0x17 | (11x17) BYTES | 186 | |

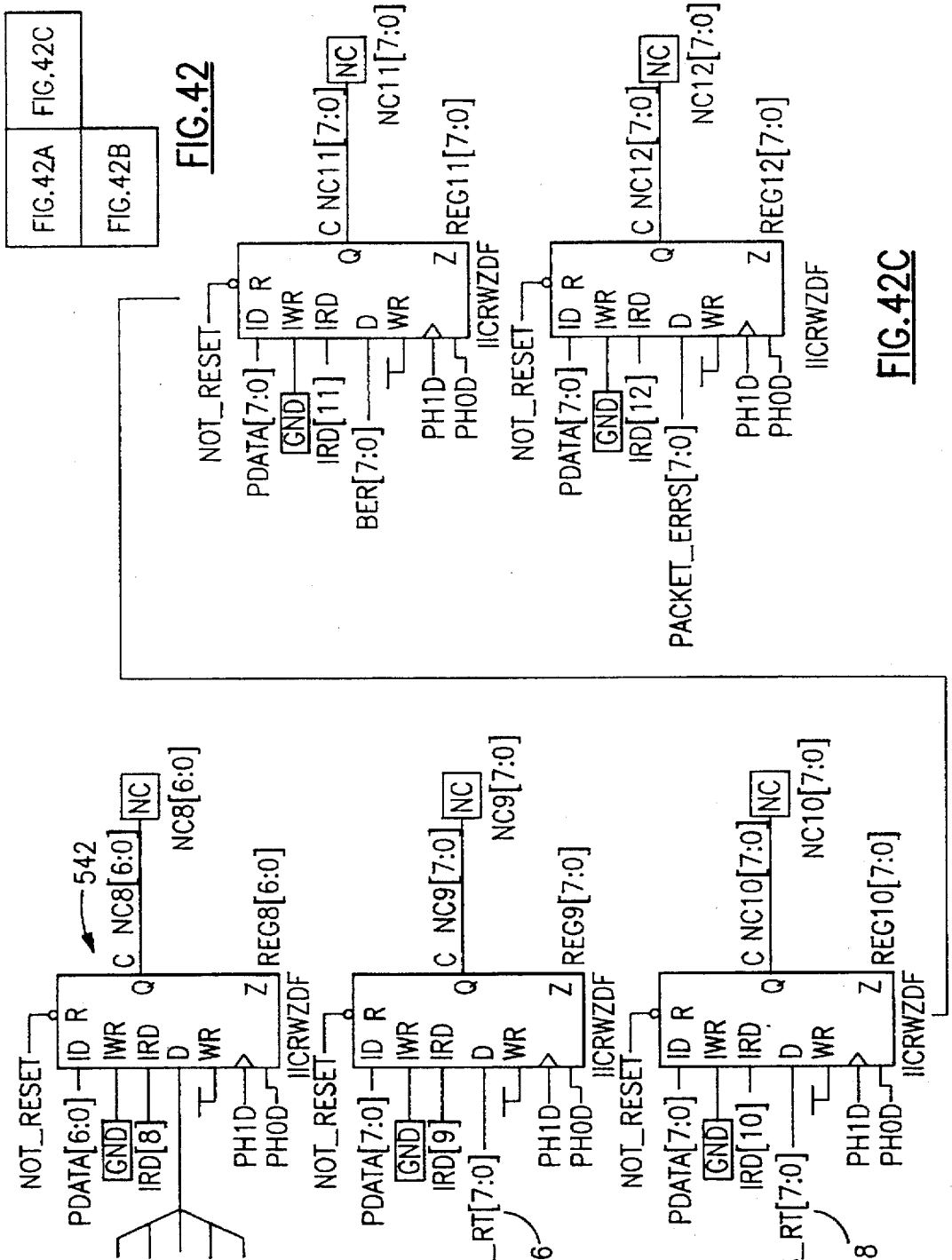

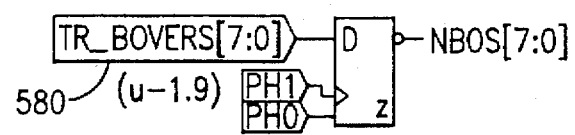
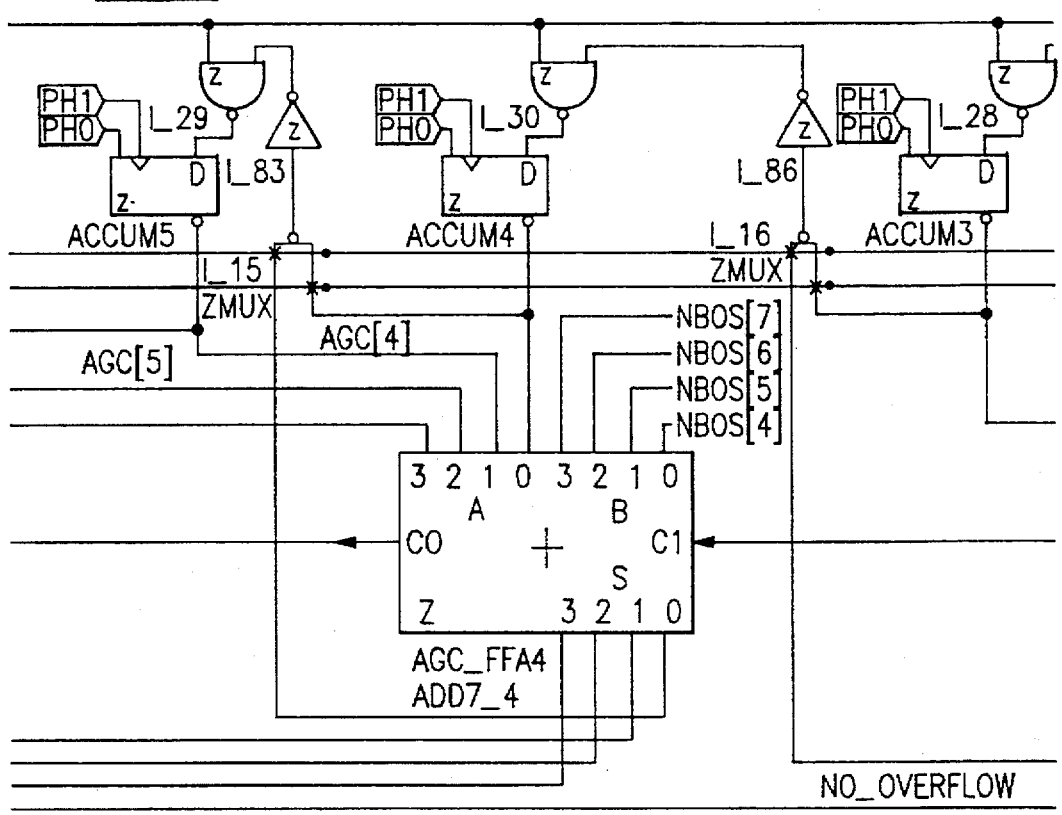
FIG. 44B
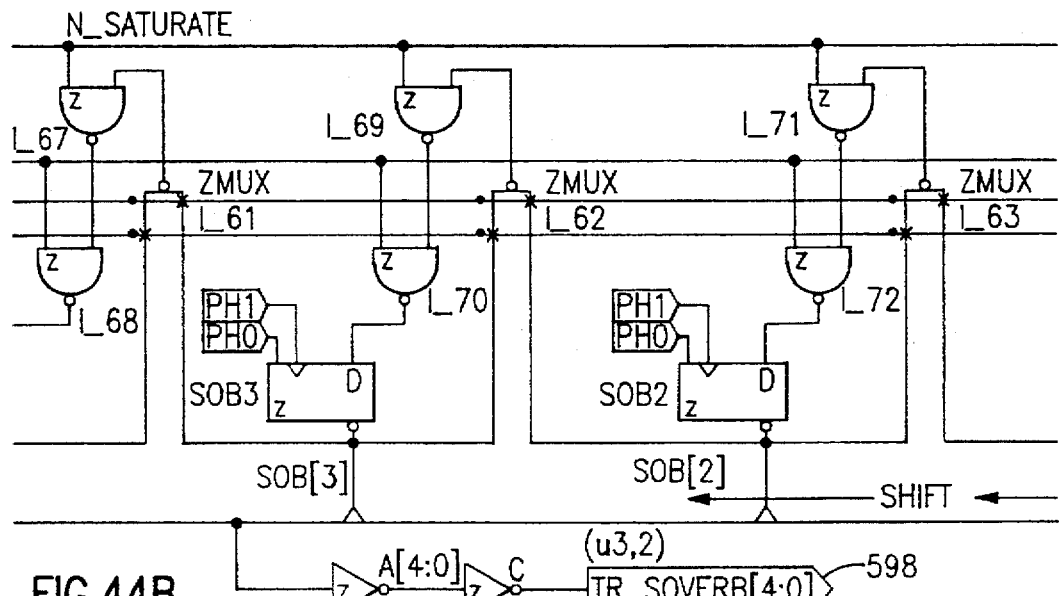

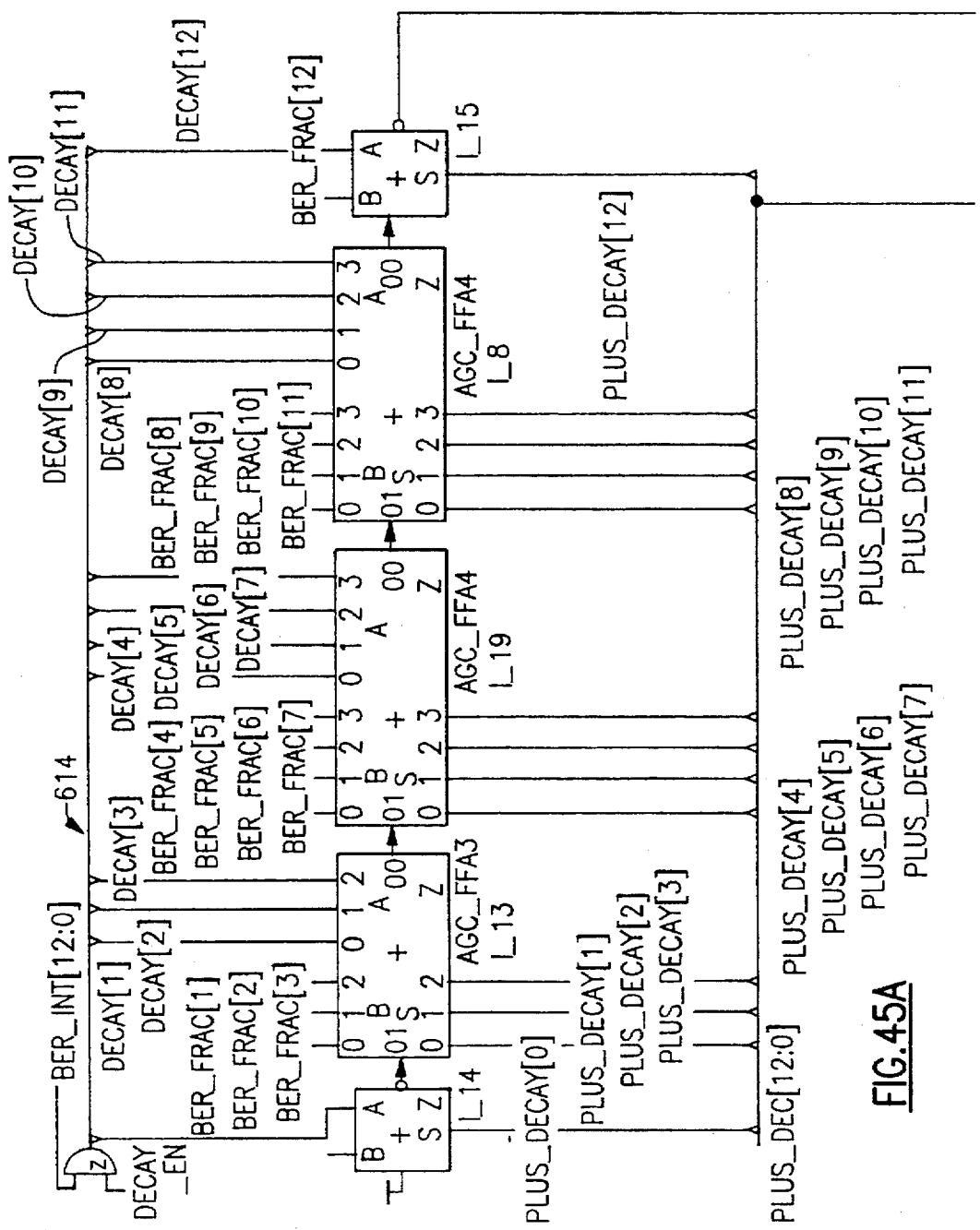

ERROR DETECTION AND CORRECTION SYSTEM FOR A STREAM OF ENCODED DATA

BACKGROUND OF THE INVENTION

1. Field of the Invention

This invention relates to processing signals received from a communications channel. More particularly this invention relates to an integrated signal processing system for receiving signals suitable for use in the transmission of video, "hi-fi" audio, images or other high bit rate signals.

2. Description of the Related Art

Encoded transmission of inherently analog signals is increasingly practiced today as a result of advances in signal processing techniques that have increased the bit rate achievable in a channel. At the same time new data compression techniques have tended to reduce the bandwidth required to acceptably represent analog information. The Art is presently striving to more efficiently transmit video and audio data in applications such as cable television using digital techniques.

Various modulation techniques have been employed in digital communications. For example, quadrature amplitude modulation (QAM) is a relatively sophisticated technique favored by practitioners of digital communications. This method involves two separate symbol streams, each stream modulating one of two carriers in quadrature. QAM is particularly useful in applications having a low signal-to-noise ratio. Multilevel QAM formats are also used to achieve spectral efficiency in applications having high signal-to-noise ratios. For example, 64- and 256-QAM can achieve spectral efficiencies of 5–7 bits/sec-Hz in cable television networks.

Quadrature Phase Shift Keying (QPSK) is a special case of the general Quadrature Amplitude Modulation (QAM) scheme, useful in applications having a low signal-to-noise ratio.

The ITU-T have adopted the DVB QPSK modulation scheme as the international standard for direct to home digital satellite broadcasting. In Europe 16-QAM and 64-QAM are used in the DVB standard for digital cable broadcasting. In QPSK a signal constellation consisting of 4 symbols is transmitted, each having a different phase and a constant amplitude. The scheme is implemented as the sum of orthogonal components, represented by the equation.

$$A_m = be^{j\theta_m}$$

where $\theta_m$ can be any of $\{0, \pi/2, \pi, 3\pi/2\}$. It is necessary to transmit both sidebands in order to preserve the quadrature information.

SUMMARY OF THE INVENTION

It is therefore a primary object of the present invention to improve apparatus for receiving convolutionally encoded data at a high rate of transmission, and to emit an error corrected output data stream.

It is a further object of the invention to economically implement a miniaturized device for the reception of satellite broadcast transmissions.

The invention provides a transmission receiving system for a quadrature phase shift keyed stream of data which is randomized, convolutionally interleaved and punctured at a puncture rate and aligned by a decoder in a puncture phase, wherein the data is in symbols and is transmitted at a symbol rate in a signal constellation. An error corrected data stream is output by the system. The system has an I, Q demodulator which accepts the data at the transmitted symbol rate, an analog-to-digital converter for converting an analog output of the I,Q demodulator, and a sinc interpolator receiving samples from the analog-to-digital converter. A timing recovery circuit has a first numerically controlled oscillator operative at periods T, a first loop filter which is coupled to the interpolator and the first numerically controlled oscillator, and has an output responsive to a difference between the periods T and the received symbol rate. The first numerically controlled oscillator is responsive to the first loop filter and generates a signal that is representative of the interpolation distance between succeeding samples. The interpolator interpolates the received samples according to the interpolation distance, and produces an output signal representative of the values of the interpolated samples. A matched Nyquist filter is coupled to the interpolator. A carrier recovery circuit for controlling the I,Q demodulator has a second numerically controlled oscillator. A digital derotation circuit is responsive to the second numerically controlled oscillator and accepts an in phase component and a quadrature component of sampled signals. A phase error estimation circuit is coupled to an output of the derotation circuit, and a second loop filter is coupled to an output of the phase error estimation circuit. The second numerically controlled oscillator is responsive to the second loop filter. There is provided a second control means for controlling interaction of the demodulator, the timing recovery circuit, the carrier recovery circuit, the filter, and the output interface. There is a constellation rotation unit for rotating the signal constellation of the symbols, and an m-step inner decoder operative in a first mode and a second mode. The m-step inner decoder includes a branch metric calculation unit for outputting branch metrics for a selected puncture rate and a selected puncture phase, a plurality of add-compare-select blocks for outputting values of path metrics that are derived from the branch metrics, comparing the values and selecting a minimum value. A rescaling unit operates on the outputs of the add-compare-select blocks for rescaling the outputs according to the minimum value. A state transition module is operative in the first mode of operation for detecting illegal state transitions of the value of the path metrics selected by the add-compare select blocks. The state transition module outputs estimates of the puncture rate, the puncture phase and a rotation correction for the symbols, and controls the branch metric calculation unit for varying the selected puncture rate and the selected puncture phase according to the estimates of the puncture rate and the puncture phase. The state transition module controls the constellation rotation unit using the estimate of rotation correction. A synchronization search unit is enabled in the second mode of operation and is responsive to the state transition module for identifying synchronization information in the data stream. A traceback module is linked to the add-compare-select blocks, and has a succession of traceback columns, wherein each column represents all historical data of selected values of paths determined at a point in time by the add-compare-select blocks. The traceback columns each have a plurality of traceback elements each accepting m bits of traceback data, wherein the traceback elements are addressed by predecoded select lines according to the contents of at least one previous traceback column. A deinterleaver is coupled to the m-step inner decoder. An outer decoder receives deinterleaved data from the deinterleaver, and a derandomizer is coupled to the outer decoder. An output interface is coupled to the derandomizer for outputting the error corrected data stream.

According to an aspect of the invention the state transition module controls the branch metric calculation unit for varying the selected puncture rate and the selected puncture phase when the detected illegal state transitions exceed a predetermined value.

According to another aspect of the invention the rescale unit operates on the add-compare-select outputs to rescale the outputs to non-negative numbers. Preferably the outputs are rescaled as a function of previous states thereof.

According to other aspects of the invention an output of each traceback column is placed on a precharged line, and the branch metric calculation unit processes m symbols at a time. The synchronization search unit provides a signal to the first control unit indicative of a search result, wherein the first control unit resumes a state of the first mode of operation when the signal indicates a failed search result. The synchronization search unit also searches for inverted sync bytes. The timing recovery circuit and the carrier recovery circuit use a feedback technique to process data prior to filtering by the matched Nyquist filter, wherein the timing recovery and carrier recovery error signals are derived from circuits following the respective recovery circuits.

The invention provides a decoder for symbols of received data encoded according to a convolutional encoding scheme. The data is punctuated according to a puncturing matrix, and has a plurality of state values which describe a sequence of state transitions from a first state to a succeeding state, wherein a path is defined by the sequence of state transitions. The decoder has a generation unit that accepts the received data for calculating metrics of the transitions thereof from the first state to the succeeding state, wherein the metrics correspond to a likelihood that a measured path follows a path produced by the transmitter of the data. A selector responsive to the generation unit selects a path corresponding to the path produced by the transmitter of the data stream. A traceback unit maintains historical information representative of sequential decision operations of the selector. A counter is provided for counting illegal state transitions of the path selected by the selector, and a control unit, responsive to the counter, determines a puncture rate, and adjusts a puncture phase and the carrier rotation phase of the received data.

The generation unit includes a branch metric generator for precalculating branch metrics, wherein the branch metrics are a measure of probability values associated with all legal transitions of received data from the first state to the succeeding state, and also includes a path metric generator that receives the precalculated branch metrics from the branch metric generator.

According to still another aspect of the invention the path metric generator and the selector evaluate m succeeding transitions in a cycle of operation, and comprise a plurality of add-compare-select blocks. Each of the add-compare-select blocks transmits m symbols of data to the traceback unit in one clock cycle.

BRIEF DESCRIPTION OF THE DRAWING

For a better understanding of these and other objects of the present invention, reference is made to the detailed description of the invention, by way of example, which is to be read in conjunction with the following drawings, wherein:

FIG. 7A–FIG. 7D, referred to collectively as FIG. 7, are an electrical schematic illustrating in further detail a portion of the DC removal circuitry shown in FIG. 6;

FIG. 15, are a block diagram of the Viterbi decoder of the receiver shown in FIG. 1;

FIG. 17A–17B, referred to collectively as FIG. 17, are an electrical schematic of a control unit in the Viterbi decoder illustrated in FIG. 15;

FIG. 27A–27B, referred to collectively as FIG. 27, are an electrical schematic illustrating an add-compare-select unit in the path metric generation block of the Viterbi decoder illustrated in FIG. 15;

FIG. 42A–42C, referred to collectively as FIG. 42, are an electrical schematic depicting the registers used in the circuitry of FIG. 40;

FIG. 44A–44C, referred to collectively as FIG. 44, are an electrical schematic of the reciprocal calculation unit in FIG. 43; and FIG. 45A–45D, referred to collectively as FIG. 45, are an electrical schematic of the bit error rate calculation unit in FIG. 43.

DESCRIPTION OF THE PREFERRED EMBODIMENT

Overview

Figure 1:
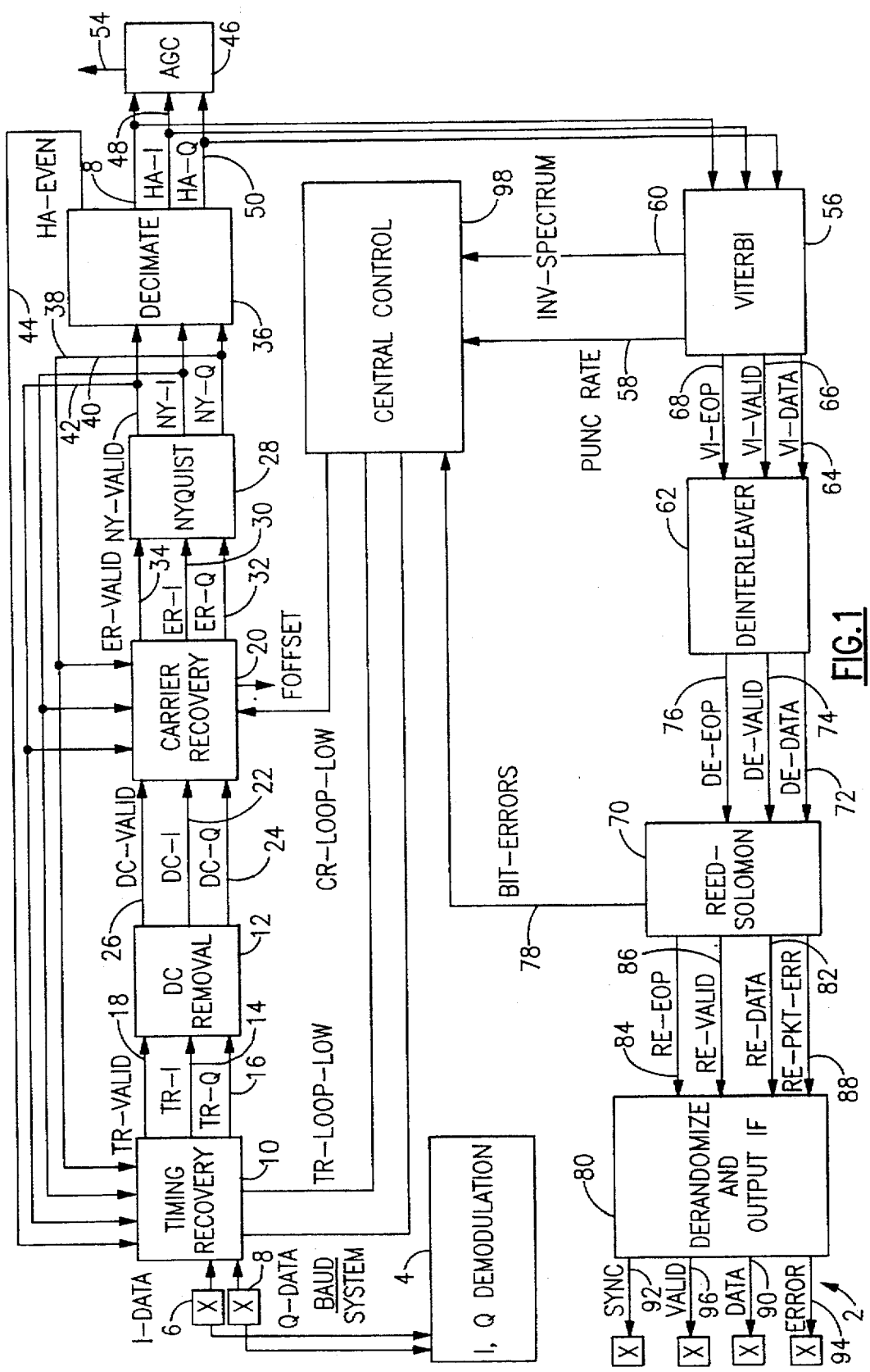
FIG. 1 is a block diagram of a portion of a receiver embodying the teachings of the present invention.

Referring initially to FIG. 1, there is shown a block diagram of a portion of a receiver 2 embodying the teachings of the present invention. While the presently preferred embodiment is explained with reference to the European Telecommunication Standard prETS300421, the invention can be readily practiced in conjunction with other standards. Except for an I,Q demodulator 4 and its associated analog-to-digital converter, the receiver 2 is constructed according to a full CMOS design, and implemented as a single VLSI chip. Consequently its operation is far more efficient than that obtained with conventional board designs.

The noted Telecommunication Standard provides inner convolutional encoding, and outer Reed-Solomon encoding of the transmitted data symbols. To recover the transmitted information the receiver 2 provides an inner decoder and an outer decoder, as will be seen from the disclosure which follows.

The receiver 2 accepts quadrature phase shift keyed data from a channel, for example, a satellite downlink. The data has been filtered and coded in several defined stages according to the noted European telecommunication standard, including: randomization and sync byte inversion for synchronization; Reed-Solomon encoding; Forney Interleaving; and in the case of satellite transmission, convolution encoding. In particular, the telecommunications standard provides for a punctured convolutional code with constraint length K=7, and allows code rates of 1/2, 2/3, 3/4, 5/6 and 7/8. Several defined puncture matrices are authorized by the standard. It should also be noted that prior to modulation, the I and Q signals are square-root raised cosine-filtered, with a roll-off factor of 0.35.

After conventional front-end processing, an encoded, quadrature demodulated, near-baseband signal is provided by an I,Q demodulator 4 as an in-phase data stream 6 and a quadrature data stream 8. Feed-back timing recovery is accomplished in timing recovery circuitry 10. The processed in-phase and quadrature data are communicated to a DC removal block 12 on lines 14 and 16 respectively. After symbol timing recovery T/2 spaced samples are indicated by the assertion of a control signal on line 18. Feedback carrier recovery is accomplished in carrier recovery circuitry 20, wherein said carrier recovery circuit receives an error signal that is derived in a feedback loop from a point beyond the carrier recovery circuitry 20. In-phase and quadrature data signals from which DC bias has been removed are transmitted to the carrier recovery circuitry 20 on lines 22 and 24 respectively, according to control signal 26. The timing recovery circuitry 10 and the carrier recovery circuitry 20 can be those disclosed in copending U.S. application Ser. No. 08/480,976, and British application Ser. No. 9511551.5 of common assignee herewith, which are hereby incorporated by reference.

Following carrier recovery, the resulting in-phase and quadrature signals are propagated to a matched Nyquist filter 28 on lines 30 and 32 respectively, according to control signal 34, followed by decimation by two in block 36. Feedback to the timing recovery circuitry 10 and the carrier recovery circuitry 20 is provided on feedback lines 38, 40, 42, and 44.

The receiver 2 includes an automatic gain control circuit 46, which accepts decimated in-phase and quadrature data on buses 48 and 50 respectively according to control signal 52, and provides an output to the receiver front end (not shown) on line 54. The processed in-phase and quadrature data on buses 48, 50 are also provided to a Viterbi decoder 56. The current puncture rate of the received convolutionally encoded data is indicated on bus 58. Inversion of the received signal constellation is indicated by a signal on line 60.

As the data processed through the I,Q demodulator 4 is Forney-interleaved, it is necessary to provide a deinterleaver 62, which accepts data on line 64. A valid control signal and an end-of-packet signal are provided to the deinterleaver 62 by the Viterbi decoder 56 on lines 66 and 68 respectively. The deinterleaved data stream is then passed to a Reed-Solomon decoder 70 on line 72. A valid control signal and an end-of-packet signal are provided to the Reed-Solomon decoder 70 on lines 74 and 76 respectively. The number of bit errors corrected in the current byte is indicated on bus 78.

Decoded data is sent to a derandomizer and output interface 80 over line 82, using control signals on lines 84, 86, and 88. The control signals indicate whether a valid decoding has been accomplished, an end-of-packet status, and if there are errors in the data. Data is output on line 90.

A signal on line 92 indicates when a sync byte is being output. Lines 94 and 96 indicate error condition and valid data respectively.

A central control block 98 regulates the sequence of operation of other stages of the receiver 2.

Figure 2:
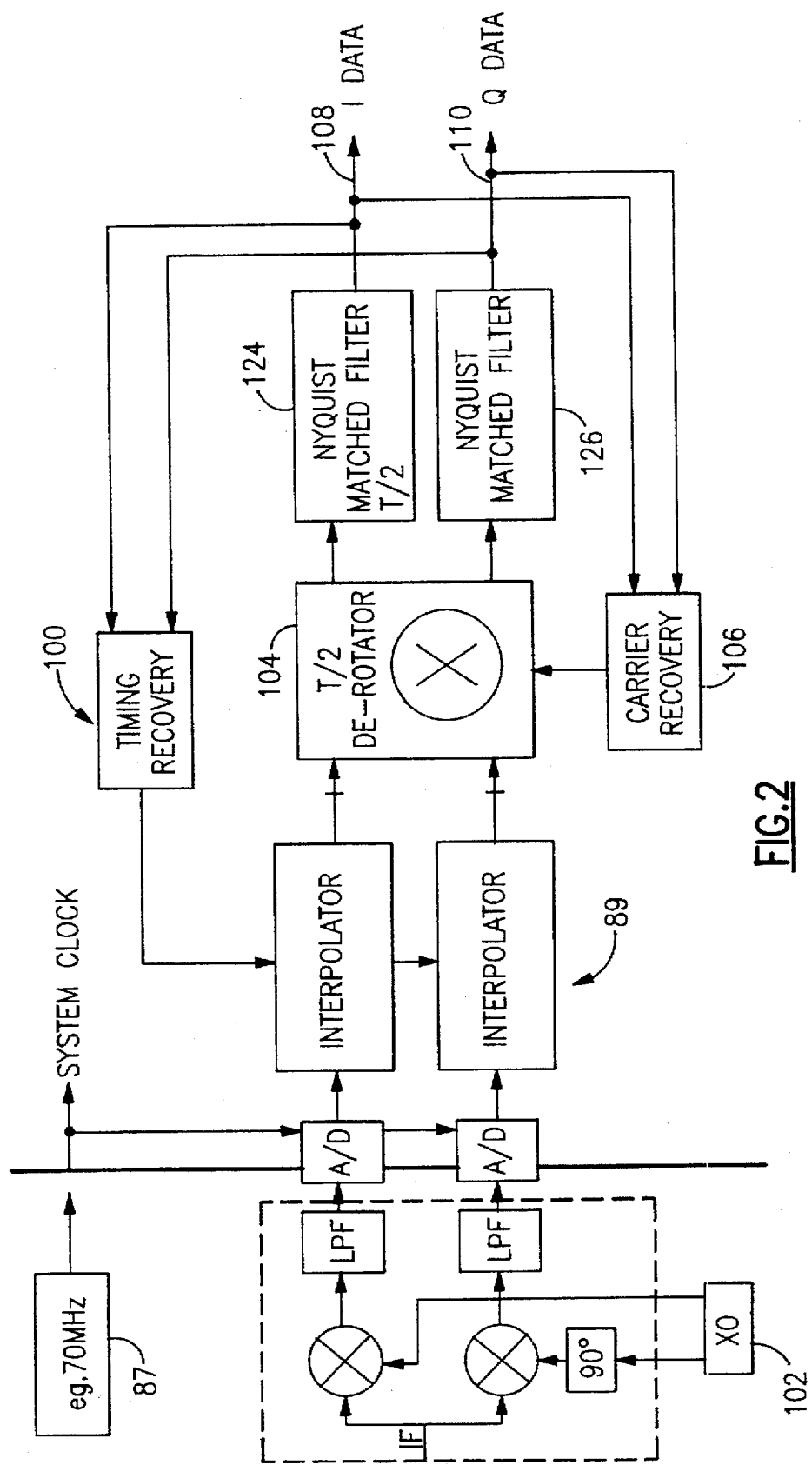
FIG. 2 is a more detailed block diagram illustrating the timing recovery circuitry and the carrier recovery circuitry of the receiver shown in FIG. 1.

The timing recovery circuitry 10 and the carrier recovery circuitry 20 are shown in greater detail in FIG. 2. These circuits are arranged such that the receiver 2 can work at many different symbol rates, or with variable symbol rate technology. A conventional off-chip I,Q baseband demodulator, such as the GEC Plessey SL1710 I,Q demodulator is employed as the I,Q demodulator 4. There is a fixed frequency system clock 87, which clocks the logic. It must at least equal the data Nyquist frequency, or otherwise ensure that the data Nyquist frequency is met. An on-chip interpolator unit 89, under control of the timing recovery loop 100, generates synchronous T/2 spaced sample values. At each system clock tick, either one or zero T/2 samples are generated by the interpolator unit 89. In the event that a sample has been generated, subsequent hardware modules are so informed by the assertion of a "valid" control strobe 128 (FIG. 3).

A fixed frequency external crystal oscillator 102 cooperates with an on-chip digital derotator 104, which operates at T/2 prior to the Nyquist filter 28, and an on-chip carrier recovery loop 106. The Nyquist filter 28 is preferably a finite-impulse-response (FIR) filter. The carrier recovery loop 106 operates with T/2-spaced samples. The I and Q outputs 108 and 110, respectively, are decimated by two in decimator block 36 (FIG. 1 ), and then applied to the error detection and correction circuits illustrated in the lower portion of FIG. 1.

Timing Recovery

Figure 3:
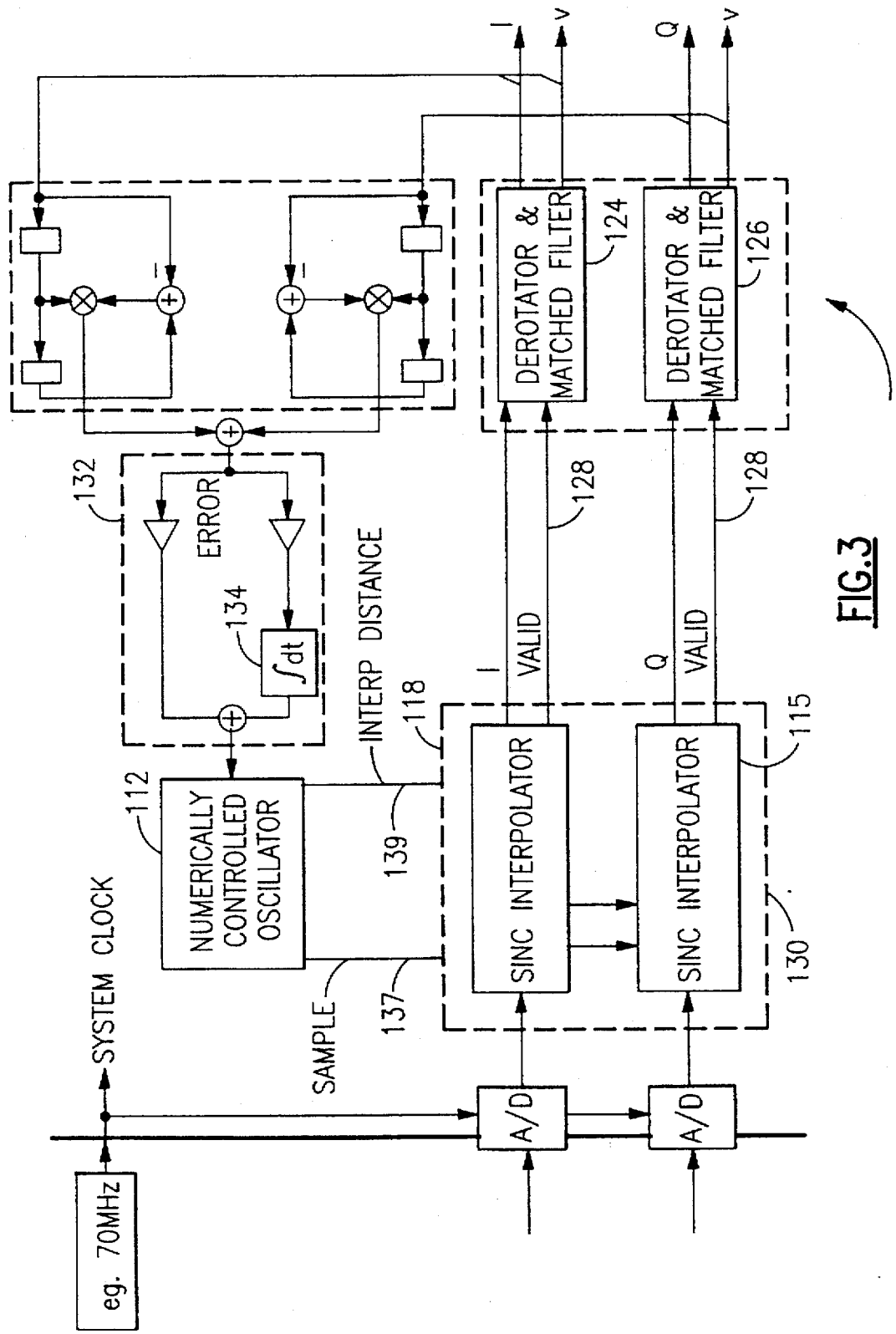
FIG. 3 is another block diagram illustrating details of the timing recovery circuitry of the receiver shown in FIG. 1.
Figure 4:
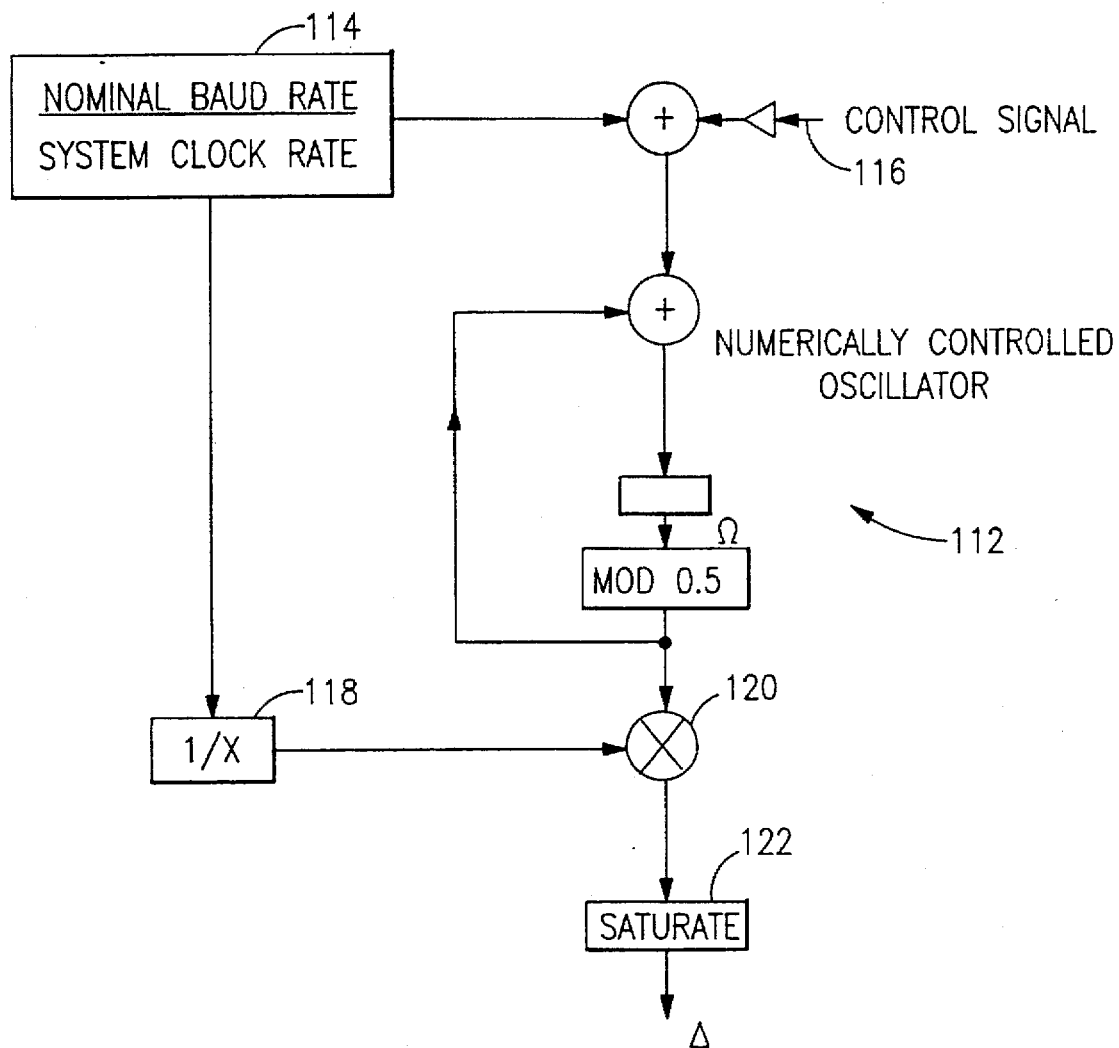
FIG. 4 illustrates the numerically controlled oscillator of the timing recovery circuitry shown in FIG. 3.

The timing recovery circuit 10 (FIG. 1) is shown in greater detail in FIGS. 3 and 4. Quadrature demodulated data is sampled at the system clock rate, which, as explained above, must be at least equal to the Nyquist frequency of the input data. As best shown in FIG. 4, an on-chip numerically controlled oscillator 112 keeps count of symbol time. The state $\Omega$ of the numerically controlled oscillator 112 represents a fixed point count of the number of symbol periods which have elapsed. At each system clock tick, the state $\Omega$ is incremented by a value in a register 114 equal to the (nominal baud rate + system clock rate), adjusted from the nominal using a control signal 116. The reciprocal of the value in the register 114 is taken in a reciprocal generator 118. The reciprocal is multiplied by the value [(2$\Omega$) mod 1 ]+2 in a multiplier 120, and limited to a value that is less than 1 in saturation block 122. A matched-filter derotator unit 129 includes the matched filters 124, 126. The matched filters 124, 126 are implemented as finite impulse response filters, and are enabled by a valid signal that is generated in the carrier recovery circuitry 20 (FIG. 1 ).

The signals 137, and A 139 are accepted by a sinc interpolator unit 130, comprising an individual sinc interpolator 118, 115 for each of the in-phase and quadrature components. The interpolator unit 130 then generates a sample value based on the interpolation distance. A has a value greater than or equal to 0 and less than 1, but is represented as a fixed point number. Values greater than or equal to 1 are saturated to just less than 1. The sinc interpolator unit 130 is instructed to generate a leading or a lagging sample according to whether $\Delta$ is 1 or 0 respectively. The spread of sample times covered by the interpolator is one system clock period.

The numerically controlled oscillator 112 operates in a timing loop based on the well known Gardner algorithm. Other timing recovery algorithms may also be used, such as the Müller and Müller algorithm. A section 132 contains a second order loop filter which is realized as a proportional-plus-integral controller 134. Its proportional and integral gain constants are selected to give the required damping factor and loop bandwidth. Preferably, a relatively wide bandwidth is used for initial channel acquisition in order to minimize lock time and insure acquisition. Thereafter the coefficients are changed to reduce the loop bandwidth and thereby make it less sensitive to noise and fluctuations. This "gear shifting" operation improves the overall system bit error rate.

The matched filters 124, 126, preferably square-root raised cosine matched filters, are included because the Gardner algorithm assumes data having no intersymbol interference. They cannot be placed before the interpolator unit 130 because they have hard-wired coefficients designed for T/2 sampled data. The Gardner algorithm locks the timing sample point using T/2 samples. The loop preferably acquires the sample point such that odd samples are at the zero crossing points of the input data, and the even samples are used as data samples.

A delay is imposed between the presentation of system clock rate samples to the sinc interpolator unit 130 and the appearance of interpolated samples, according to the following equation $$\text{delay} = D + k\bar{o}$$

where $\bar{o}$ is (system clock period / N); N is the number of sinc interpolation points; k is (integer) interpolation distance, $\Delta$N; and D is constant delay implicit in hardware.

The sinc interpolator unit 130 is based on a finite impulse response filter, which is clocked at the system clock rate, with the coefficients being selected from a bank of N sets, wherein each set of coefficients interpolates a different delay. The interpolation distance output from the numerically controlled oscillator 112 determines which bank of coefficients are used to generate a given sample, as $\Delta$ varies from 0 to 1. Sinc interpolation is based on the sampling theory which shows that a signal which has been Nyquist sampled can be reconstructed using sinc pulses, equivalent to performing a low pass filtering operation in the frequency domain. The output is given by the equation $$y(t) = \sum_{k=-\infty}^{\infty} \times (kT)\text{sinc}\left[\frac{\pi(t-kT)}{T}\right]$$

As explained above, the timing recovery circuit 10 (FIG. 1) said timing recovery circuit receives an error signal that is derived in a feedback loop from a point beyond the timing recovery circuit.

D.C. Removal

Figure 5:
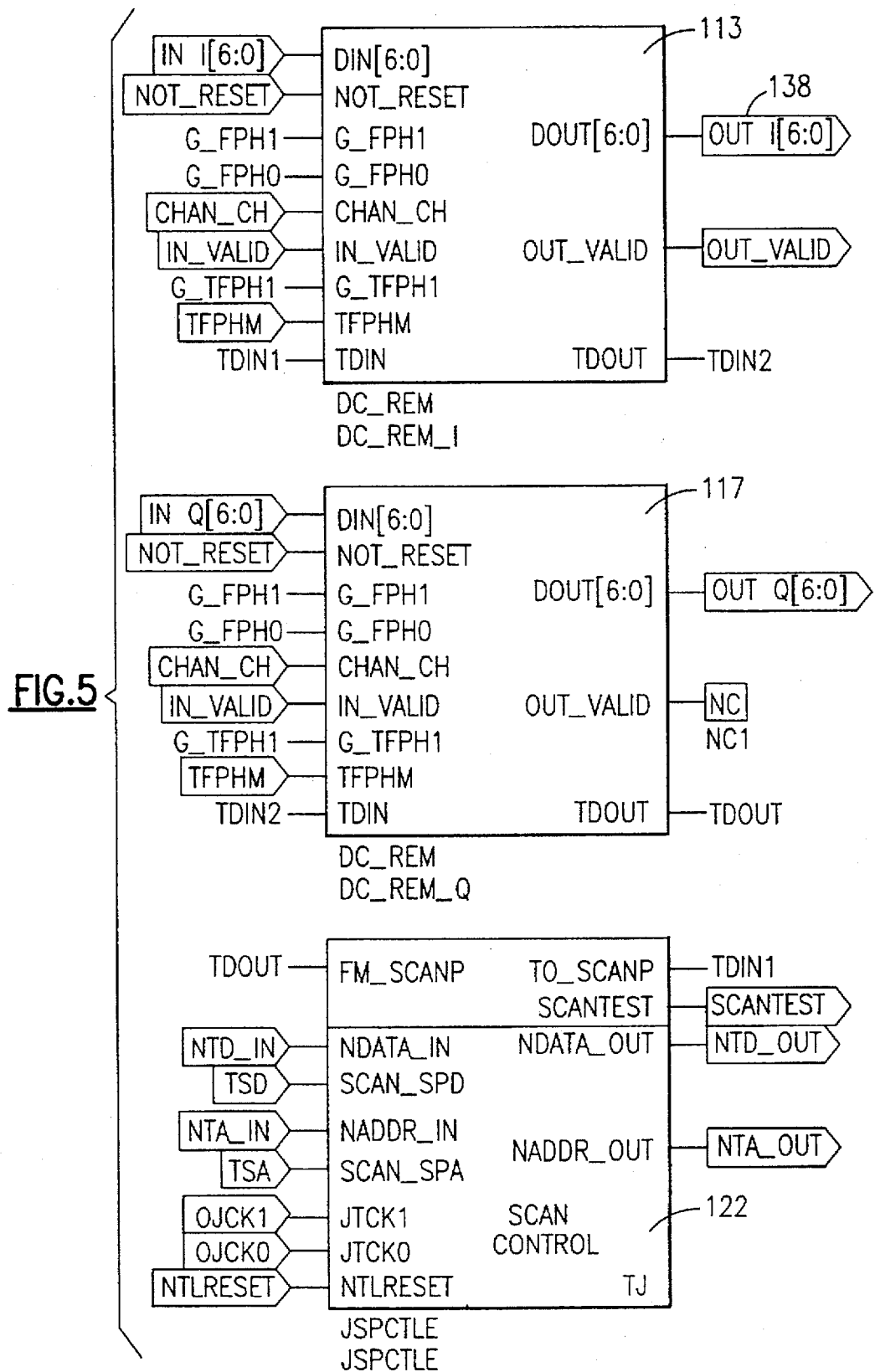
FIG. 5 is a block diagram illustrating in more detail the DC removal circuitry of the receiver shown in FIG. 1.

The DC removal block 12 (FIG. 1) is illustrated in further detail in FIG. 5, and comprises three modules 113, 117, and 122. Module 122 is used principally for testing the circuitry, and will not be further discussed. Only module 113 will be discussed, as the modules 113 and 117 are identical, and are applied to the I and Q data streams respectively.

Figure 6A:
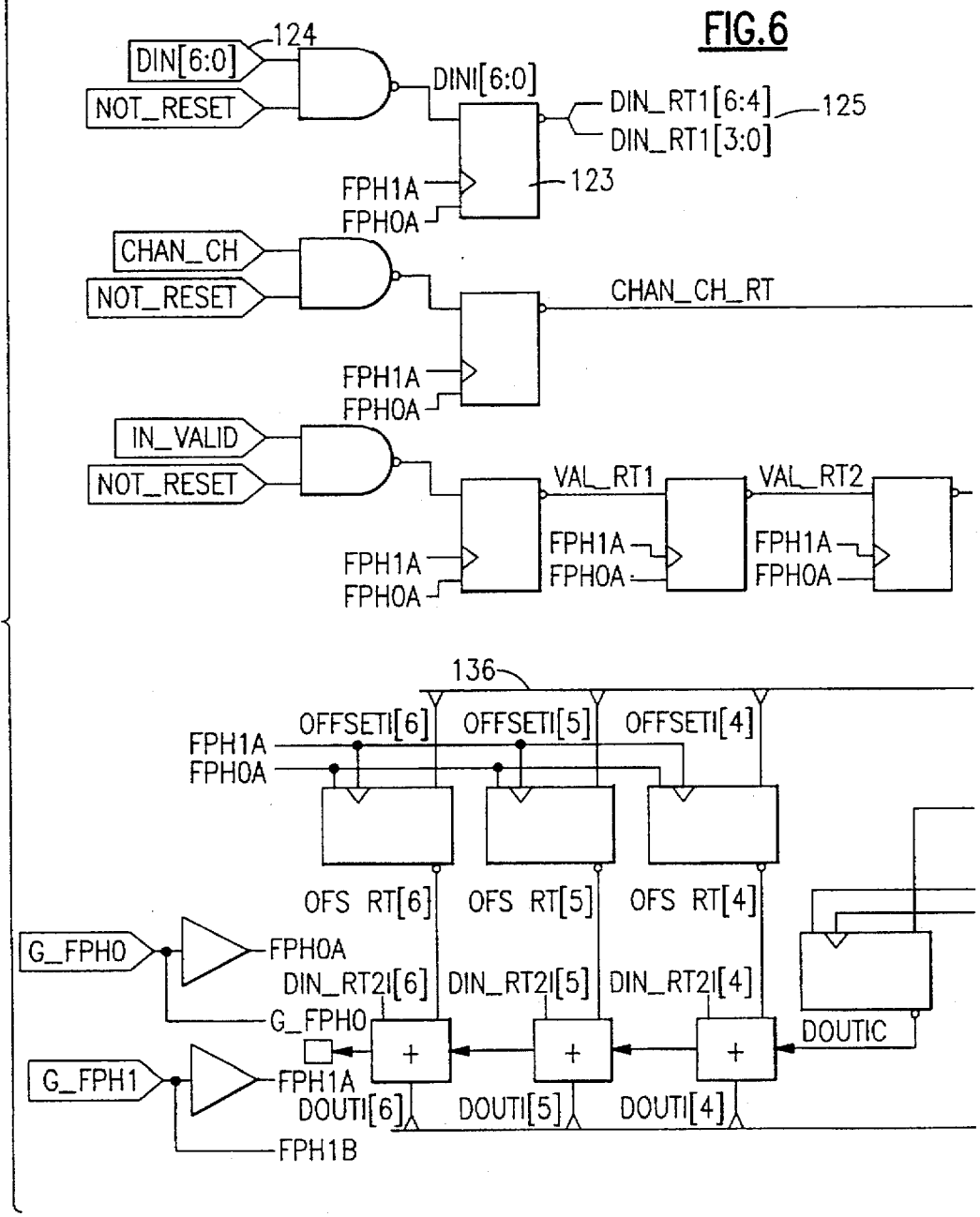
FIG. 6A–FIG. 6B, referred to collectively as FIG. 6, are a partially schematic illustration of a portion of the DC removal circuitry shown in FIG. 5.
Figure 6B:
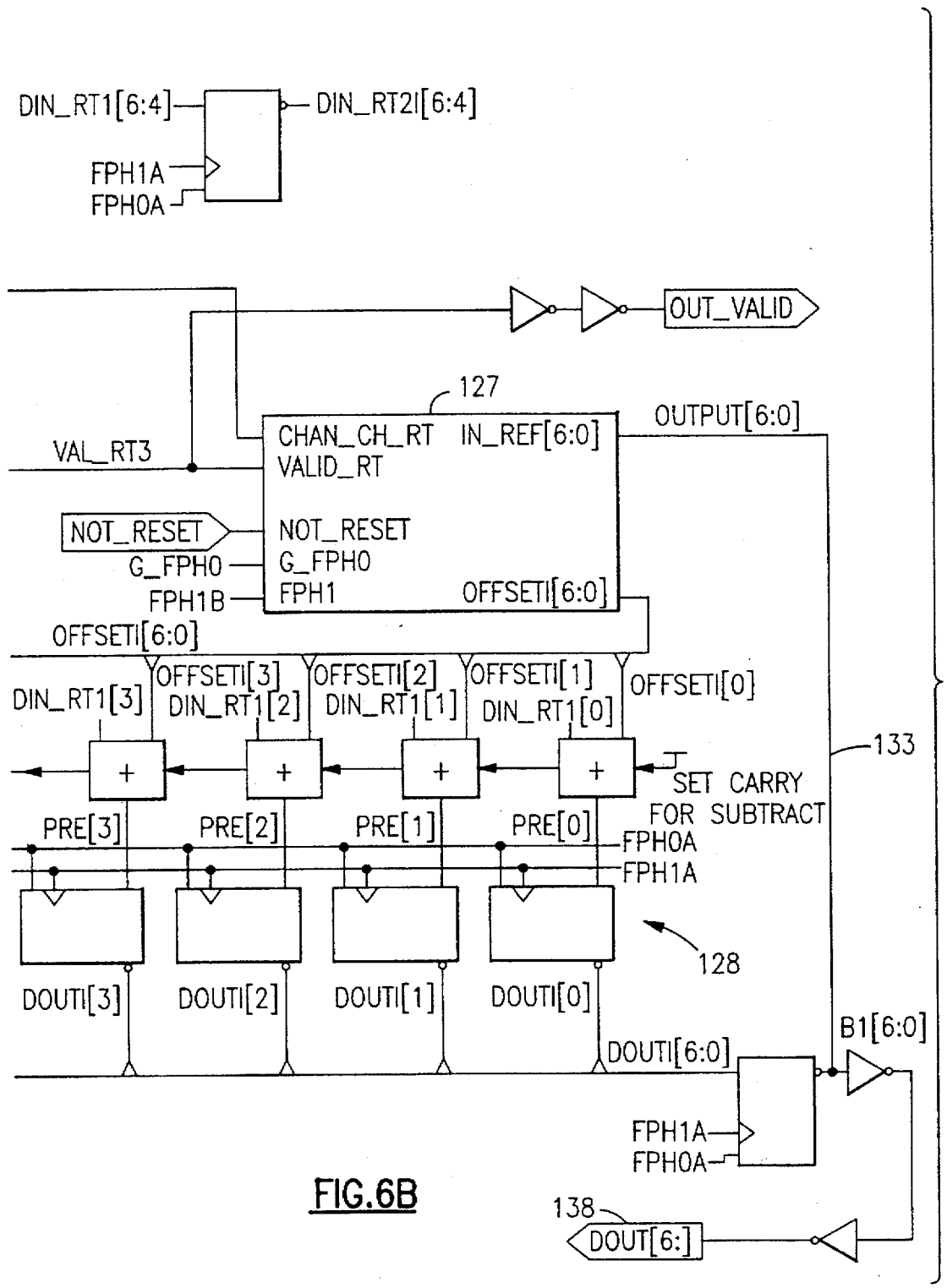

The module 113 is illustrated in detail in FIG. 6. Input data arrives in a 7-bit bus 124, is retimed in a flip-flop 123, and presented to an addition unit, referenced generally at 128, on bus 125. A submodule 127 monitors a feedback data stream that arrives on a bus 133, and calculates the DC offset for the data stream, which is placed on a bus 136. The DC offset is then subtracted from the input data in the addition unit 128. The addition unit 128 is conventionally arranged, and timed to operate at 60 MHZ. The output of the addition unit 128 is outputted onto a 7-bit bus 138.

Figure 7A:
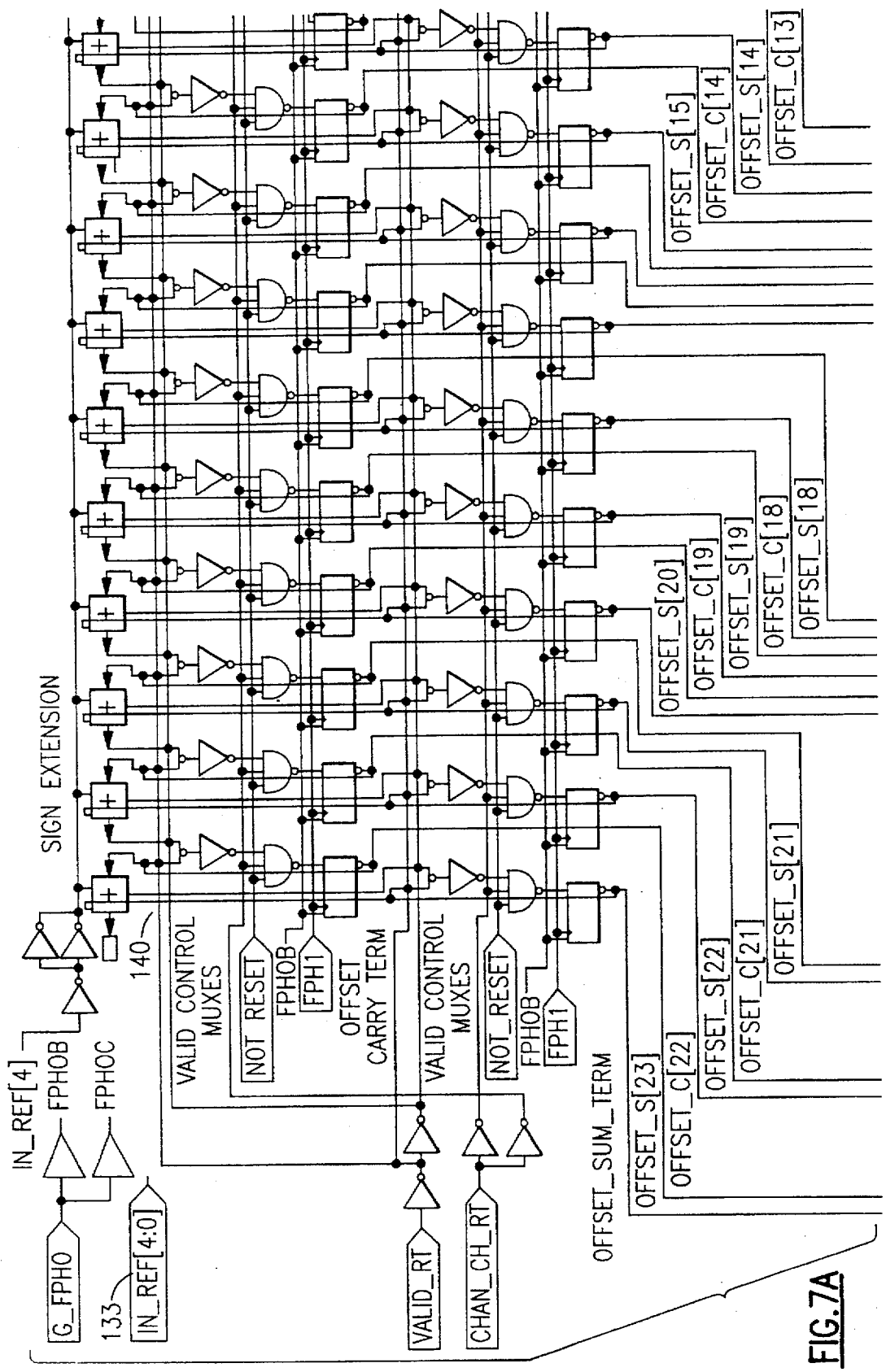
Figure 7C:
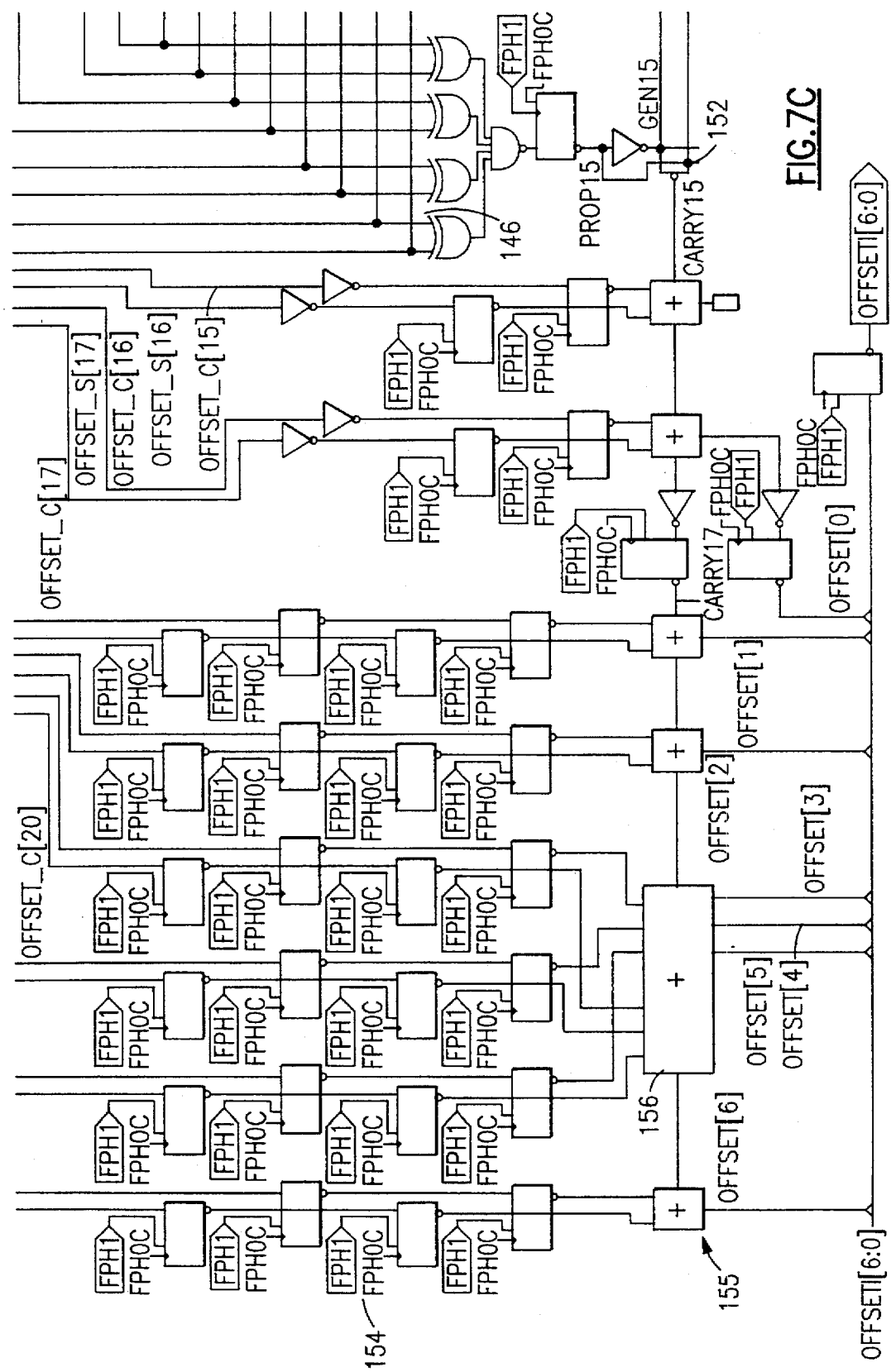
Figure 8:
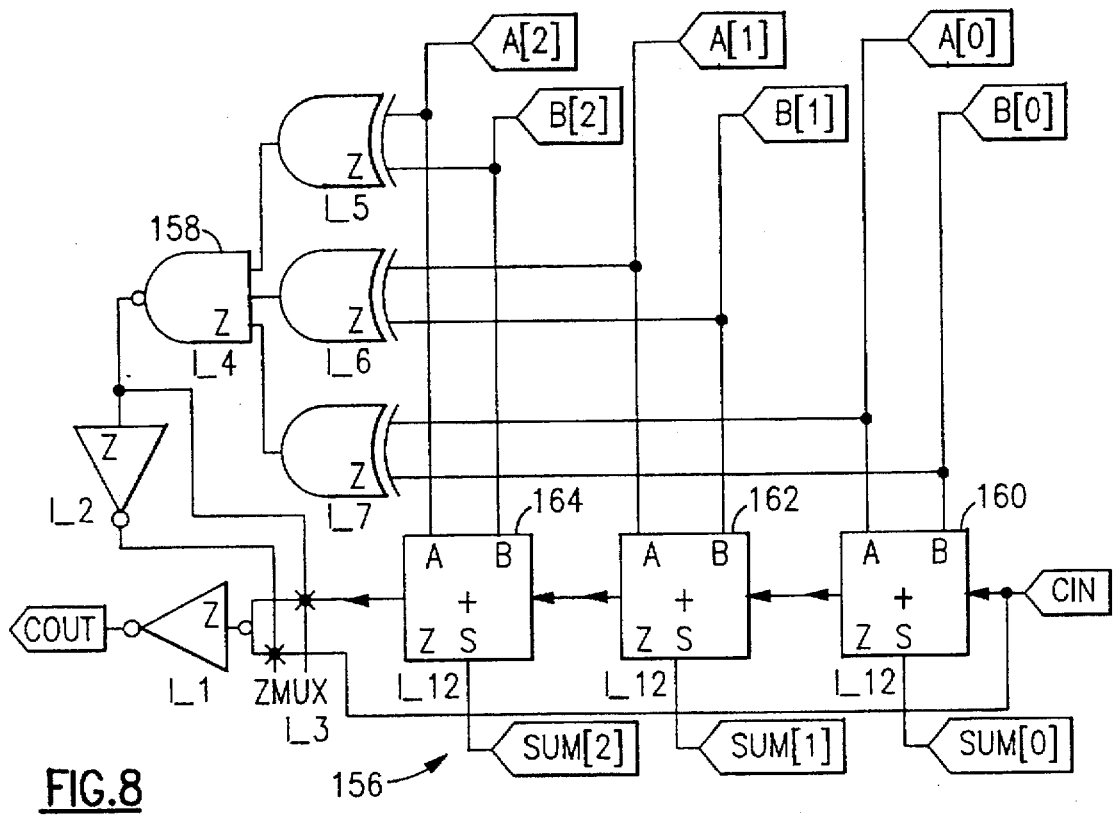
FIG. 8 is an electrical schematic of a 3-stage adder used in the DC removal circuitry shown in FIG. 7.

The structure of the submodule 127 is shown in FIG. 7. It principally comprises a 24-bit addition unit 140, which has a carry save architecture. Its input signal is on the bus 133, and is derived from the final output of the module 113 (FIG. 5). Timing considerations require the carry save architecture as the full addition cannot be evaluated in a single data cycle. Each carry output is retimed in a flip-flop 142 before being passed on to the next adder. To fully complete the addition, it is necessary to resolve all 24 carries, i.e. allow them to propagate. This is accomplished in the circuitry generally referenced 144, in three identical circuits 146, and in a row of adders 155. In the preferred embodiment it is only necessary to utilize the most significant seven bits of the offset value. For the lower 16 bits it is necessary to only evaluate the carry. This is done for each bank of four adders in the circuits 144, 146. Multiplexers 148, 150, and 152 are selected according to whether its associated circuit 146 is propagating a carry from a previous stage, whether it will generate a carry, or whether it produces a zero carry output. The final addition unit 154 is retimed due to time constraints, as it operates at 60 MHz. Within the addition unit 154 is a three stage adder block 156, the structure of which is shown in FIG. 8. This is a fast adder wherein the carry status is rapidly selected in a combinatorial logical network 158, instead of allowing it to ripple through the three addition stages 160, 162, 164.

Carrier Recovery

Figure 9:
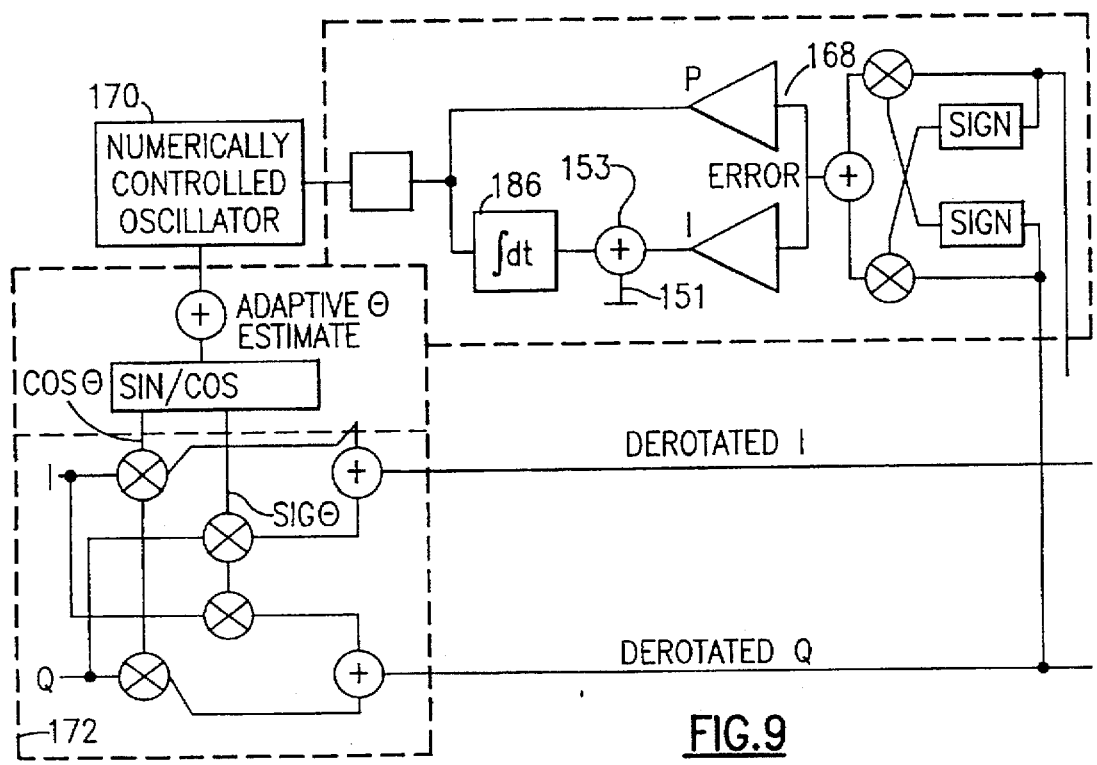
FIG. 9 is a diagram illustrating the carrier recovery loop in the carrier recovery circuitry of the receiver shown in FIG. 1.
Figure 10:
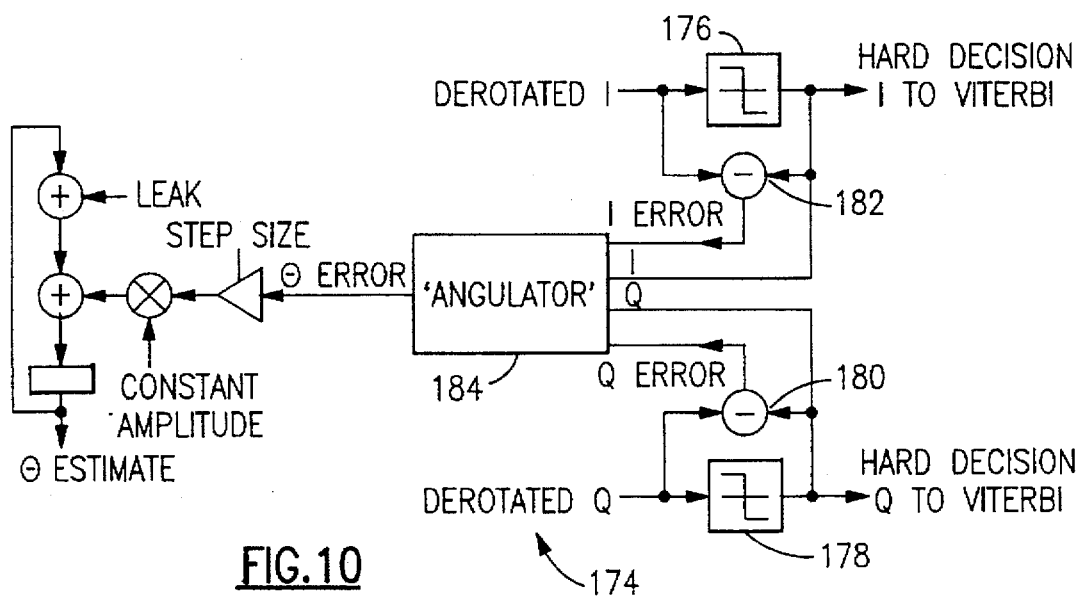
FIG. 10 illustrates an adaptive loop circuit which is used in an alternate embodiment of the carrier recovery circuitry.

The carrier recovery loop is explained initially with reference to FIGS. 9 and 10, which illustrate a Costas algorithm phase error estimation section 166, a second order loop filter 168, a numerically controlled oscillator 170, and a digital derotation circuit 172. This circuit tracks any frequency errors and phase drift in the external modulation and demodulation chains. An additional adaptive loop circuit 174 (FIG. 10) can be used, operating according to the least-mean-square (LMS) algorithm to adaptively estimate demodulation phase noise errors caused by hum and jitter. The adaptive loop circuit 174 is not included in the preferred embodiment.

Sin $\theta$ and cos $\theta$, which are generated by use of a look-up table stored in a ROM (not shown), control the de-rotation circuit 172. The design of trigonometric look-up tables is well known.

The derotator rotates the input data by $\theta$. It is given that (I,Q) represents a vector of amplitude $\sqrt{(I^2+Q^2)}$, and argument $\tan^{-1}(I/Q)=\phi$. Thus I=sin $\phi$ and Q=cos $\phi$. We require derotated I=I', and derotated Q=Q' as follows:

$I'=\sin(\phi+\theta)$ and $Qm'=\cos(\phi+\theta)$.

$I'=\sin \phi \cos \theta - \cos \phi - \cos \phi \sin \theta = I \cos \theta - Q \sin \theta$;

and $Q'=Q \cos \theta + I \sin \theta$.

The calculation of I' and Q' is implemented in the network of multipliers and adders shown in the derotation circuit 172. The Costas phase error estimation section 166 completes the loop.

The derotator 172, in cooperation with the phase estimation section 166, is also used to correct phase noise and jitter. This jitter is tracked by an LMS adaptive estimate of the phase error. Referring to FIG. 10, the derotated I and Q values, represented as fixed point numbers with a fractional part are sliced in slicers 176, 178 respectively to the nearest legal constellation value. For QPSK this will be +1 or −1. The difference between the derotated value and the sliced value is obtained in subtracters 180, 182, and forms the error. The I and Q error values are converted into an angular error estimate $\theta$ error. In the case of QPSK modulation, the $\theta$ error is obtained from a switching network contained in angulator 184, according to table 1 below. The output of the angulator 184 is an adapted LMS estimate of the phase jitter or hum error $\theta$ estimate. The phase error estimation circuit disclosed in copending applications, U.S. Ser. No. 08/481, 107, and British Application No. 9511568.9 of common assignee herewith, and incorporated herein by reference, can also be used, as may many other phase error estimation circuits, for example a circuit embodying the Costas algorithm.

The LMS algorithm and its sign variant is well known, and will not be further explained herein. It is discussed, for example, in *Digital Communication*, Second Edition, by Edward A. Lee and David G. Messerschmitt, Kluwer Academic Publishers, Chap. 11.

The adaptive algorithm has been modified slightly from the standard LMS algorithm in that the $\theta$ estimate has been given a leak. Normally leak is zero, but every Nth cycle it is $-(\text{sign}(\theta \text{ estimate}))$. This prevents the $\theta$ error from growing beyond operational limits.

The Costas loop locks with the constellation points on the axis—i.e., (1, 0), (0, 1), (−1, 0), (0, −1). Thus the error, in the example given may be estimated as $\theta$ error=$\sin^{-1}$ (Ierror), which approximates to $\theta$error≈Ierror. Similarly, for the other constellation points, $\theta$error is either + or −Ierror or Qerror as shown in table 1 below.

TABLE 1

| Approximation of $\theta$ error | | |
|---|---|---|
| Constellation | | $\theta$ error |
| Q=1 | I=0 | Ierror |
| Q=0 | I=1 | −Qerror |
| Q=−1 | I=0 | −Ierror |
| Q=0 | I=−1 | Qerror |

As in the case of the timing recovery control loop discussed hereinabove, the proportional and integral gain constants of proportional integral controller 186 in the second order loop 168 start off with wide bandwidth values to minimize acquisition time, and are shifted to a lower bandwidth loop set of values to optimize the system bit error rate once lock has been achieved. The values can be readily selected in accordance with the requirements of a particular application. Preferably, during channel acquisition, the bandwidth values are swept by repeatedly adding a constant value on line 151 to the integral gain constant in an adder 153. Lock occurs as the sweep progresses.

Automatic Gain Control

Figure 14:
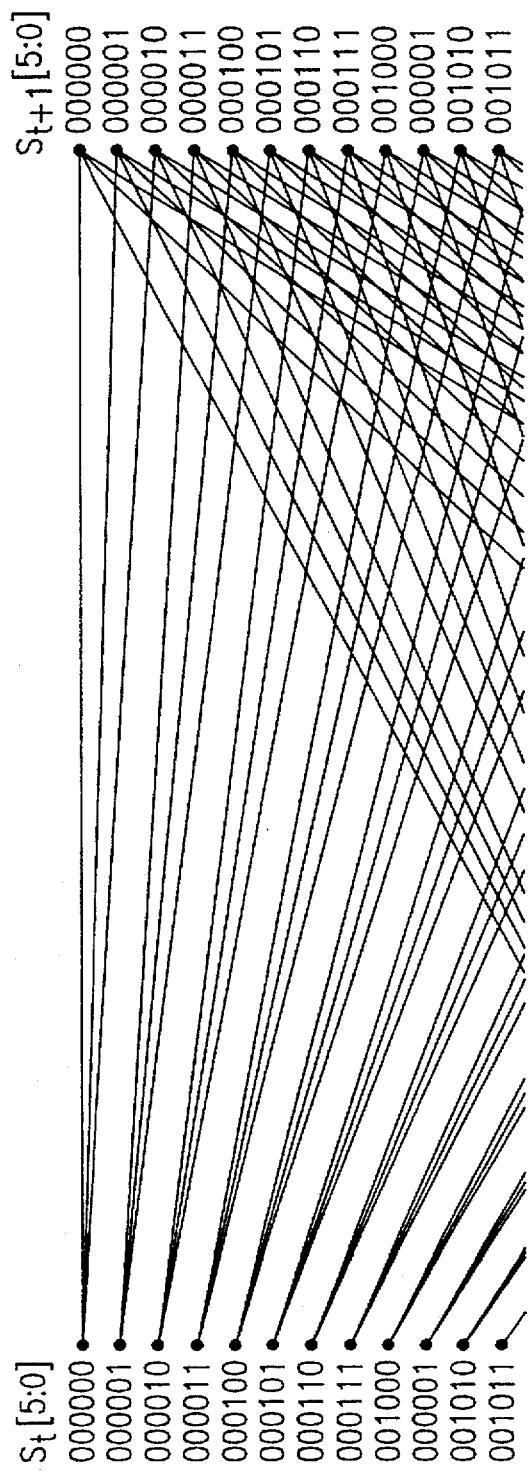
FIG. 14 is a fragmentary view of a transition trellis diagram according to the Viterbi decoding process performed in the preferred embodiment of the invention.

Referring now to FIGS. 1 and 14, the automatic gain control (AGC) circuit 46 comprises an AGC error block 183, which determines the error between the I, Q input signals on buses 48, 50 and the expected mean value thereof. An error signal is produced on bus 190 and is received by an AGC control block 192. The AGC control block 192 calculates a control voltage which is output on bus 194. The control voltage is dependent on the error signal on bus 190, and is averaged over time. After processing by a sigma-delta modulator 196, the control voltage is fed to the receiver's front end (not shown) on output line 198

Figure 16:
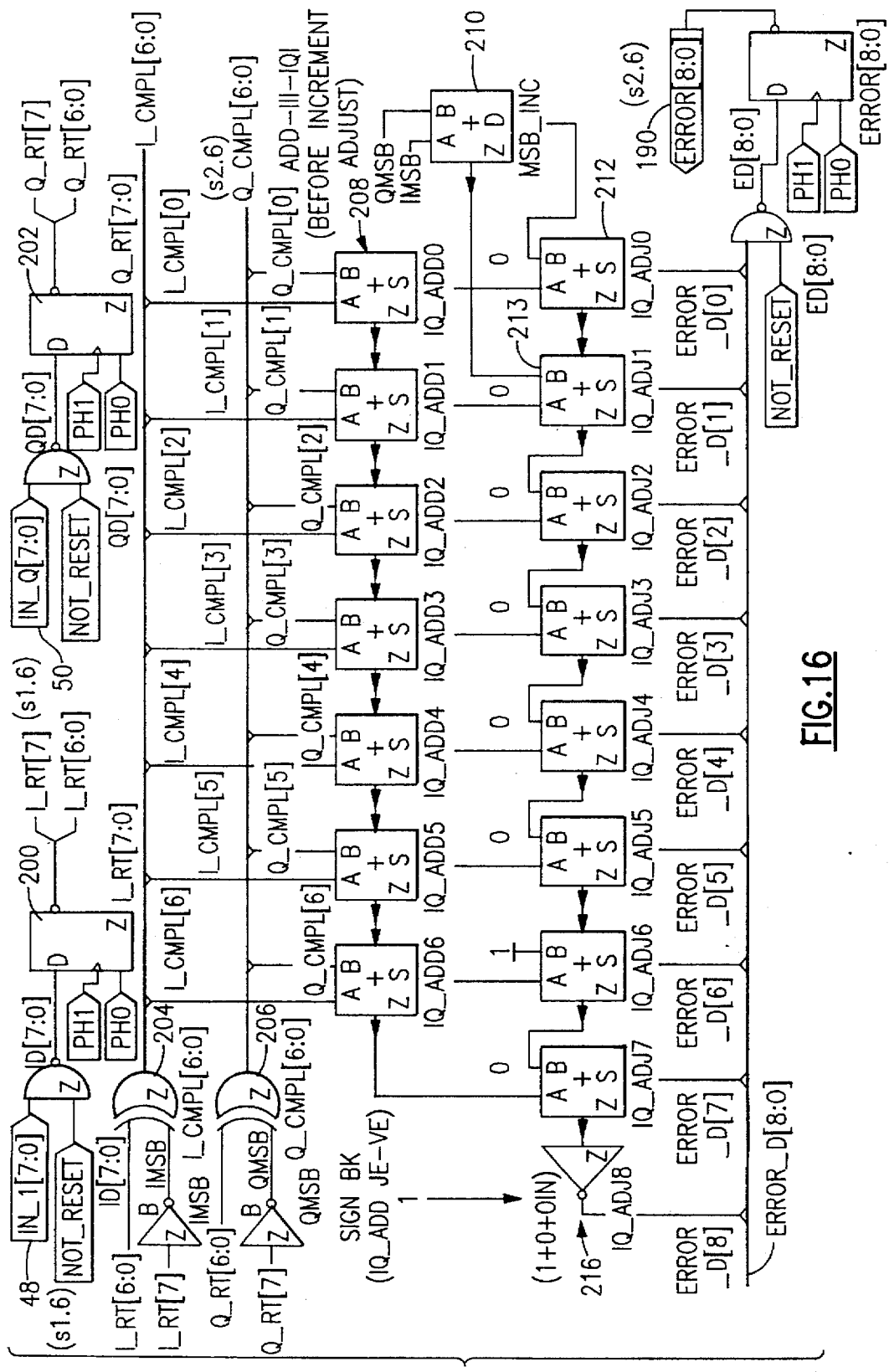
FIG. 16 is an electrical schematic of a portion of the automatic gain control circuitry shown in FIG. 11.

The error block 183 calculates an error value, error=−|I|−|Q|+2 * Mean, (where * indicates multiplication) and is illustrated in greater detail in FIG. 16. The inputs on buses 48, 50 are retimed in flip-flops 200 and 202 respectively, and are complemented, if necessary, using exclusive OR gates 204, 206 as part of the absolute value function. A row of adders 208 adds the absolute value of the I input and the absolute value of the Q input. In the event complementing occurred, 1 is added to the two least significant bits of the sum, using adder 210, and two adders 212, 214 which are found in a second row of adders 216. The addition of the 1 completes the absolute value function. The expected mean value of the signal, binary 01000000, is then added to the thus modified output of the row of adders 208, and the result is outputted on the bus 190.

Figures 18, 18A:
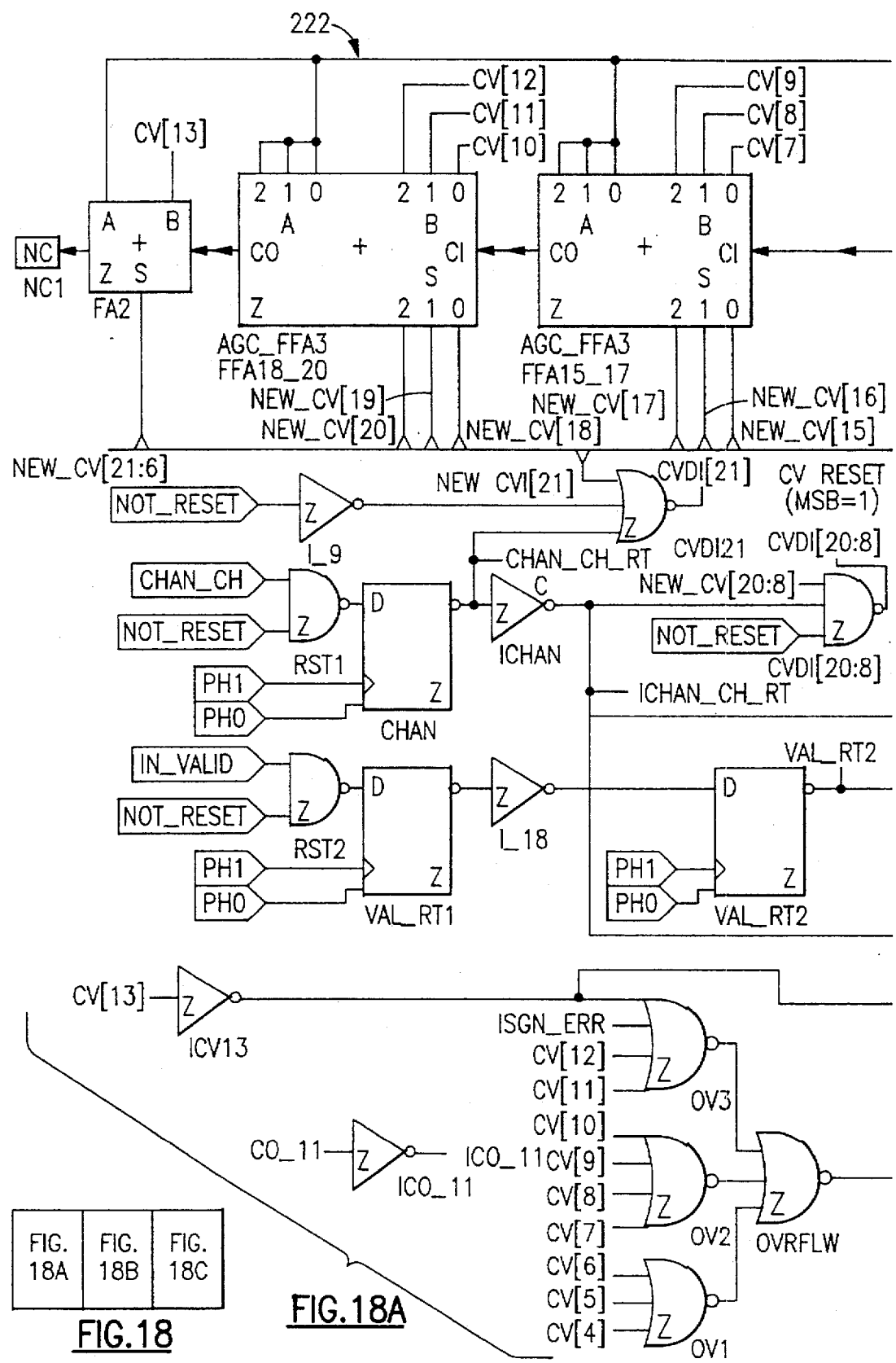
FIG. 18A–18C, referred to collectively as FIG. 18, are an electrical schematic of the control block of the automatic gain control circuitry shown in FIG. 11.
Figure 18B:
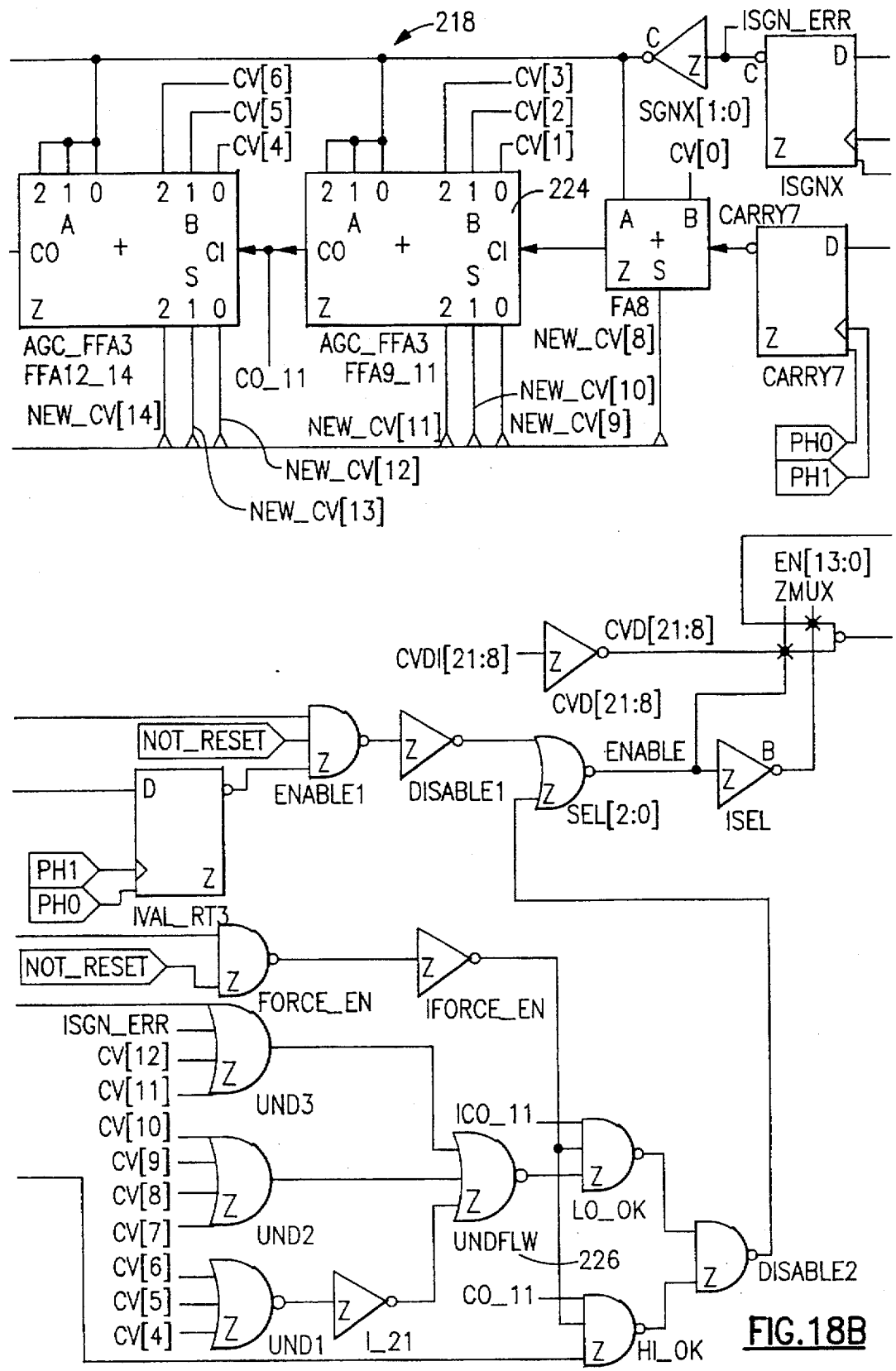
Figure 18C:
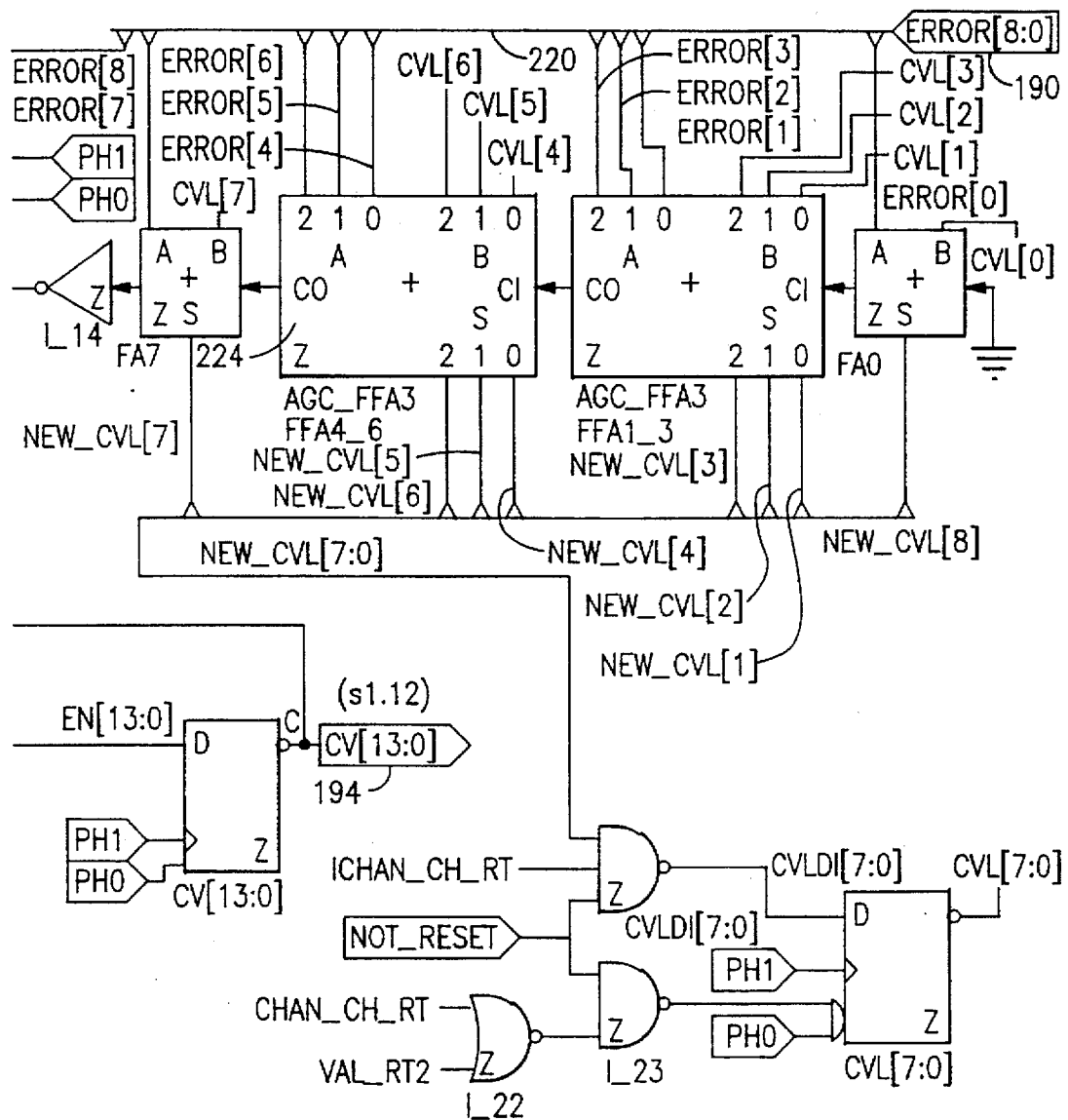

FIG. 18 illustrates the structure of the AGC control block 192. The error signal on bus 190 is added to a control voltage on a bus, using a 22-bit adder, which is referenced generally at 218. The addition proceeds in a first stage 220 for the 8 least significant bits, and in a second stage 222 for the 14 most significant bits. To improve performance, the individual adders 224 are fast adders, using carry-by-pass propagation. Overflow and underflow conditions are detected by a logical network 226. The final control voltage is then placed on the bus 194 and fed back to the 22-bit adder 218 as a new control voltage. The feedback function for the control voltage (CV) in the preferred embodiment is expressed by the equation:

$$CV_{i-1} = CV_i + \frac{\text{error}}{2^{14}}$$

Figure 11:
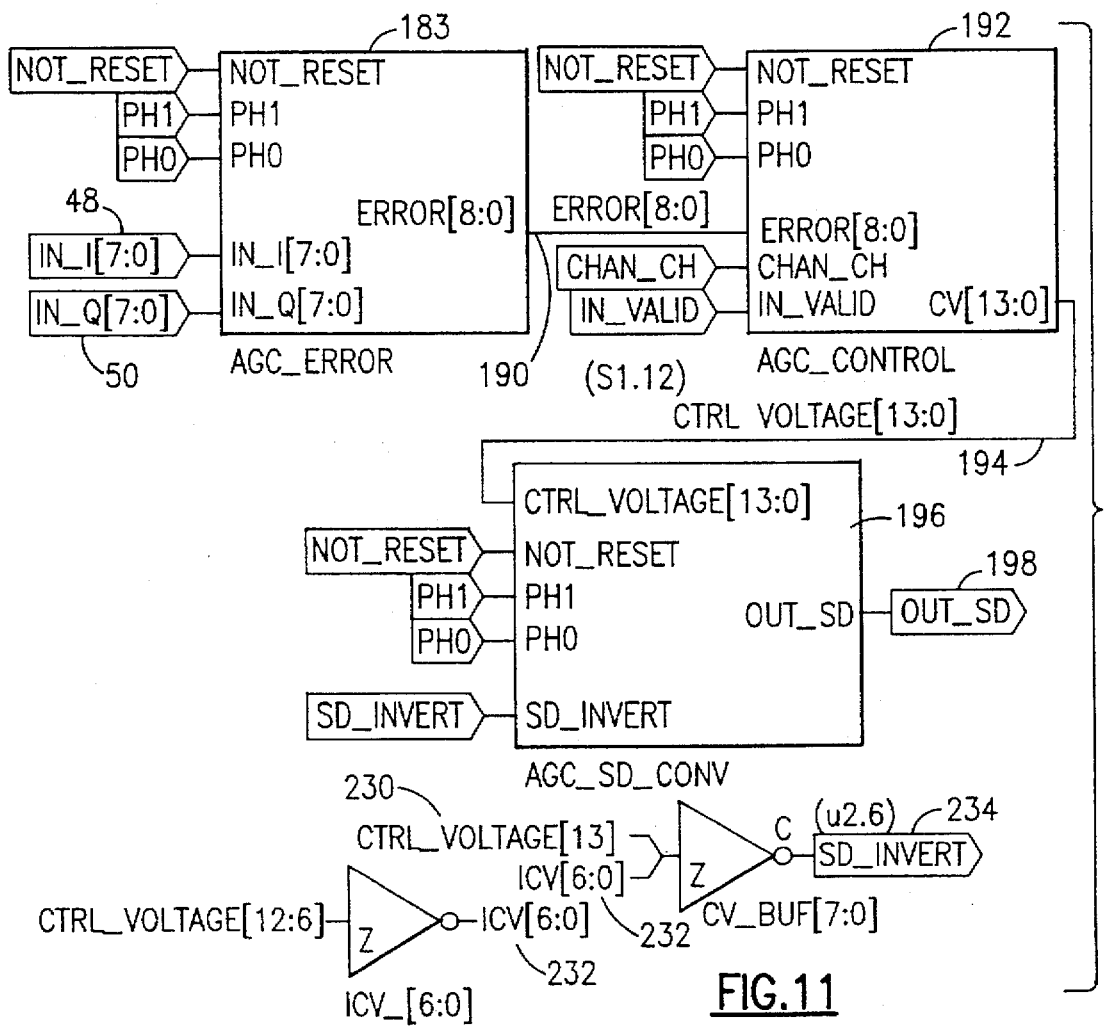
FIG. 11 is a block diagram of the automatic gain control circuitry of the receiver shown in FIG. 1.
Figure 12:
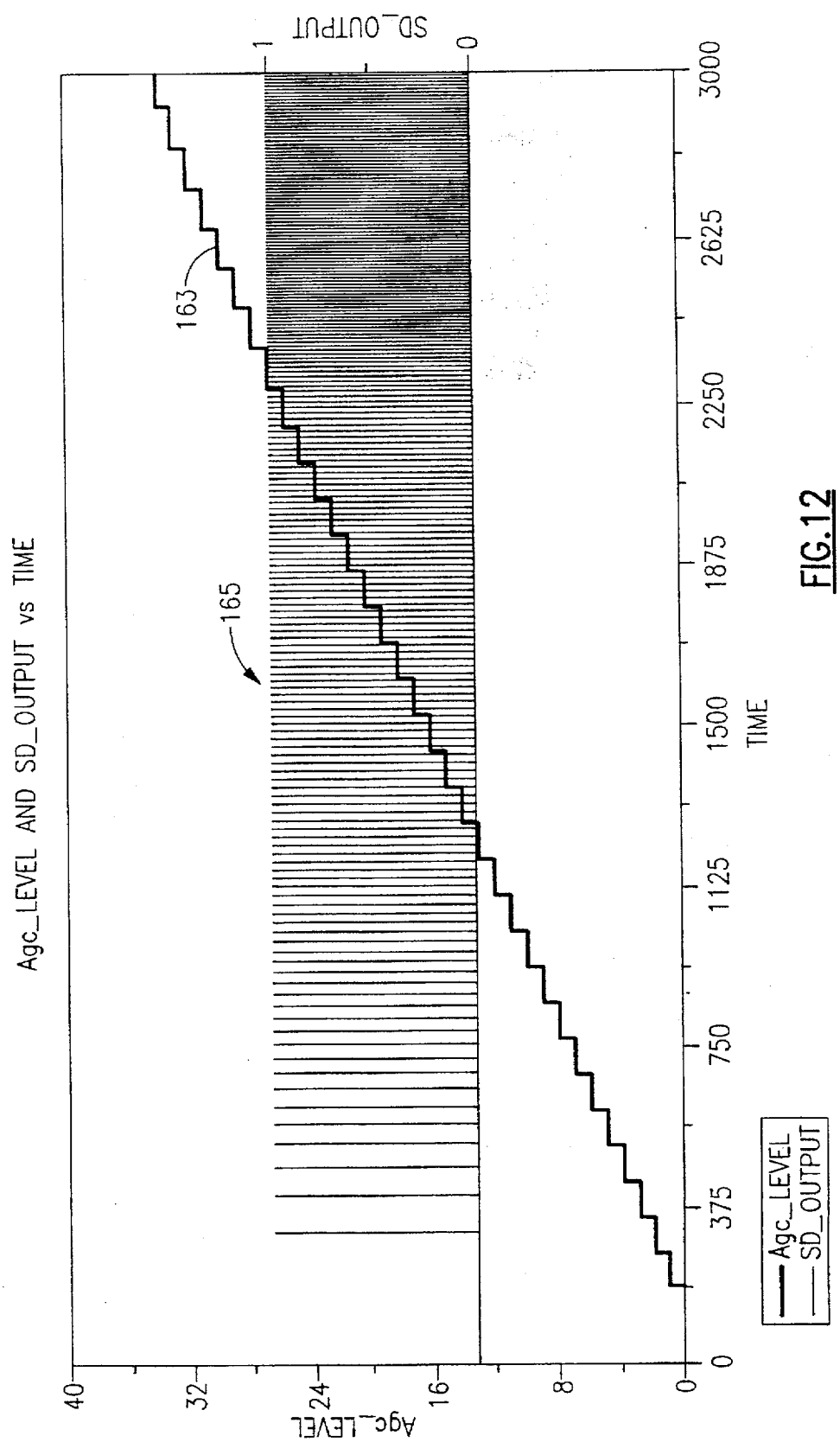
FIG. 12 is a time plot of the AGC level and the sigma-delta modulator output produced by the circuitry shown in FIG. 11.

Referring again to FIG. 11, the sigma-delta modulator 196 is conventional, and is retimed to run at 7.5 MHZ in the preferred embodiment. An AGC level signal 234 is developed using the inverted most significant bit of the control voltage on bus 194, represented by line 230, and the next 7 bits of the control voltage, indicated by a bus 232. FIG. 12 is a time plot of the AGC level signal 234, referenced by the solid line 163, and of the output of the sigma-delta modulator 196 (FIG. 11) on output line 198, which is a series of pulses 165.

Viterbi Decoder

Figure 13:
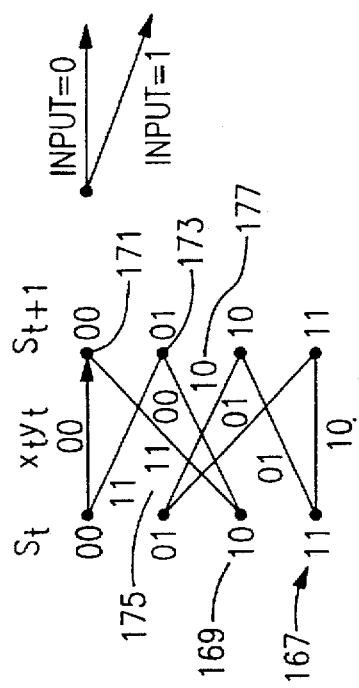
FIG. 13 illustrates a simplified transition trellis diagram according to a one-step Viterbi decoding process.

The following discussion is made with reference to FIG. 13, which illustrates a simplified transition trellis diagram 167 according to a one-step Viterbi decoding process at a coding rate of 1/2, and utilizing a convolutional encoder (not shown) having a constraint length K=3, with generator polynomial $G(x)=(x^2+x+1, x^2+1)$. The rate 1/2 indicates that for every one bit input, the encoder generates two bits. The constraint length K is the maximum number of signals that can be used to generate an output. Using a transition trellis diagram such as diagram 167, and an incoming data sequence, it is possible to generate an output stream following a sequence of states S. In the diagram 167 a particular state $S_t$ can be represented by two bits. For example, state $S_t$ can assume the value 2 (binary 10), indicated by reference numeral 169. In the representation of diagram 167, in state $S_{t+1}$ the bits of state $S_t$ are shifted by one position, and an incoming data bit occupies the rightmost (least significant bit) position. Thus, the state value 169 can legally transition to values 171 and 173 in state $S_{t+1}$. For these two transitions, the convolutional encoder will produce values 175 and 177 respectively, indicated more generally as $x_t y_t$. All possible state transitions can be calculated for the encoder, i.e. given $S_t$ and data bit $d_t$, the next state $S_{t+1}$, $x_t$ and $Y_t$ can be evaluated.

The path metric is a measurement of the likelihood that the state is on the original encoder state sequence at that time. The smaller the path metric, the more probable the state is, and vice versa. The branch metric is a measurement of the probability value attached to each branch depending on the input. The branch metric is taken as the Hamming weight, which is the number of differing bits between a received symbol $xy_{rx}$ and an expected symbol xy along every branch in each transition as shown in FIG. 13. Traceback is the method of going back through the trellis to find the initial state which produced the state with the smallest path metric.

In the preferred embodiment a 2-step decoding process is employed, corresponding to moving through the trellis two steps at a time. This doubles the time to calculate each step, and each traceback yields two bits, rather than one. However, the number of calculations required at each state has also doubled, as each state now has four possible paths to be calculated. Only one path is required to be maintained in memory for each state. That path, known as the surviving path, is the one having the smallest path metric and is thus the most likely path.

Puncturing is authorized in the noted European telecommunications standard, which has the effect of producing a higher rate of data transmission, as the code is more efficient. In exemplary Table 2, the convolutional encoder (not shown) encodes data to produce symbols $x_t$ and $y_t$, which are then punctuated according to the puncturing matrix $$x: 1 \quad 0$$
$$y: 1 \quad 1$$

to produce $x'_t$ and $Y'_t$, which are then retimed to be transmitted as I,Q in quadrature phase shift keyed modulation. When decoding with punctured data, the omitted bits do not contribute to the branch metric calculation.

TABLE 2

| data | $d_0$ | $d_1$ | $d_2$ | $d_3$ | $d_4$ |
|------|-------|-------|-------|-------|-------|
| xy   | $x_0y_0$ | $x_1y_1$ | $x_2y_2$ | $x_3y_3$ | $x_4y_4$ |
| x'y' | $x_0y_0$ | $y_1$ | $x_2y_2$ | $y_3$ | $x_4y_4$ |
| IQ   | $x_0y_0$ | $y_1x_2$ | $y_2y_3$ | $x_4y_4$ | |

In the simple example given above, branch metrics were calculated using the Hamming Weight. Significant improvements result if, instead of receiving either a 1 or 0, we receive a multiple bit representation of each $r_x$ and $y_{rx}$ showing the relative likelihood of the signal being a 1 or 0. Thus, in a 16 level (4-bit) soft decoding, a 1 is represented by 15 (binary 1111).

In 16 level decoding, if, for example, $xy_{rx}=(3, 14)$ are received, the branch metrics may be calculated as shown in table 3. When calculating new path metrics, the respective path metrics are calculated using these soft-calculated branch metrics, giving significant improvements in decoder performance. In the preferred embodiment, an 8 level (3-bit) soft decoding is used. Traceback is implemented using a systolic array, as explained below in detail.

TABLE 3

| expected $xy_{rx}$ | branch | calculation | result |
|---|---|---|---|
| 00 | 0 | |0−3| + |0−14| | 17 |
| 01 | 1 | |0−3| + |15−14| | 4 |
| 10 | 2 | |15−3| + |0−14| | 26 |
| 11 | 3 | |15−3| + |15−14| | 13 |

In the preferred embodiment, data is convolutionally encoded using a constraint length K=7, which corresponds to a trellis having 64 states. A partial representation of a 2-step transition trellis diagram for this situation is illustrated in FIG. 14.

Figure 15A:
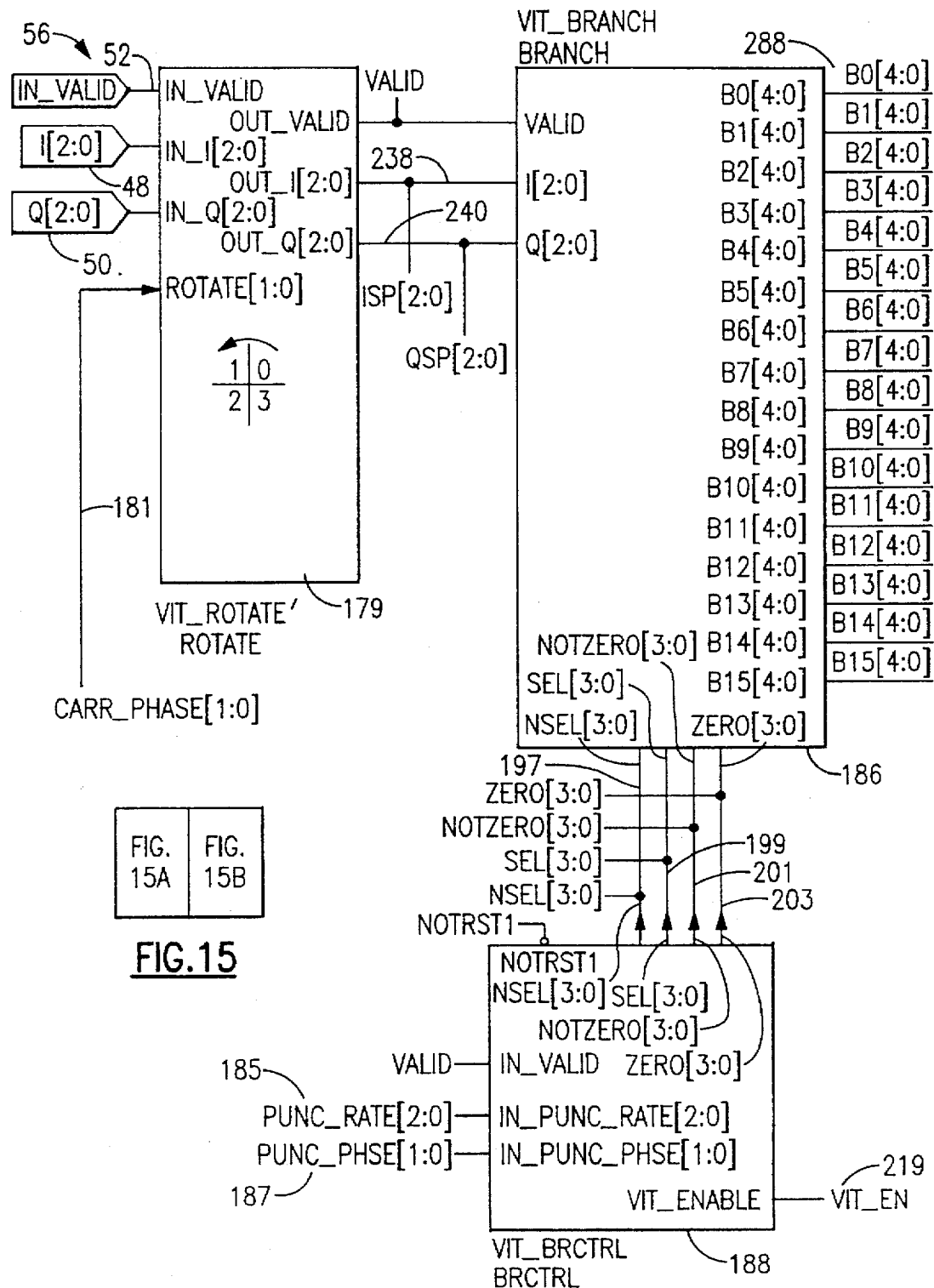
FIG. 15–15B, referred to as collectively

Referring now to FIGS. 1 and 15, the Viterbi decoder 56 has a rotation adjustment block 179, which receives in-phase and quadrature data on lines 48, 50. Validity of the incoming data is indicated by the state of a signal on line 52. In preceding stages the demodulator can lock the signal constellation in any of 8 carrier rotation phases, taking into consideration that it is possible for the received signal spectrum to be inverted in the sense that an I,Q symbol is received as a Q,I symbol. However, this condition is dealt with as discussed below, rather than in the rotation adjustment block 179. The present rotation phase is placed on a bus 181.

For all possible branches (256 in the preferred embodiment, using a constraint length K=7, and 2-step decoding), branch metrics are calculated at each operation cycle in branch metric generation block 186, which is controlled by phase and punctuation control block 188. The current puncture rate on bus 185 and current puncture phase on bus 187 are input to the phase and punctuation control block 188 from a higher control block, which is Viterbi control block 195. States in the branch metric generation block 186 are mapped and selected for puncturing and phase adjustment according to the state of lines 197, 199, 201, and 203.

Figure 17B:
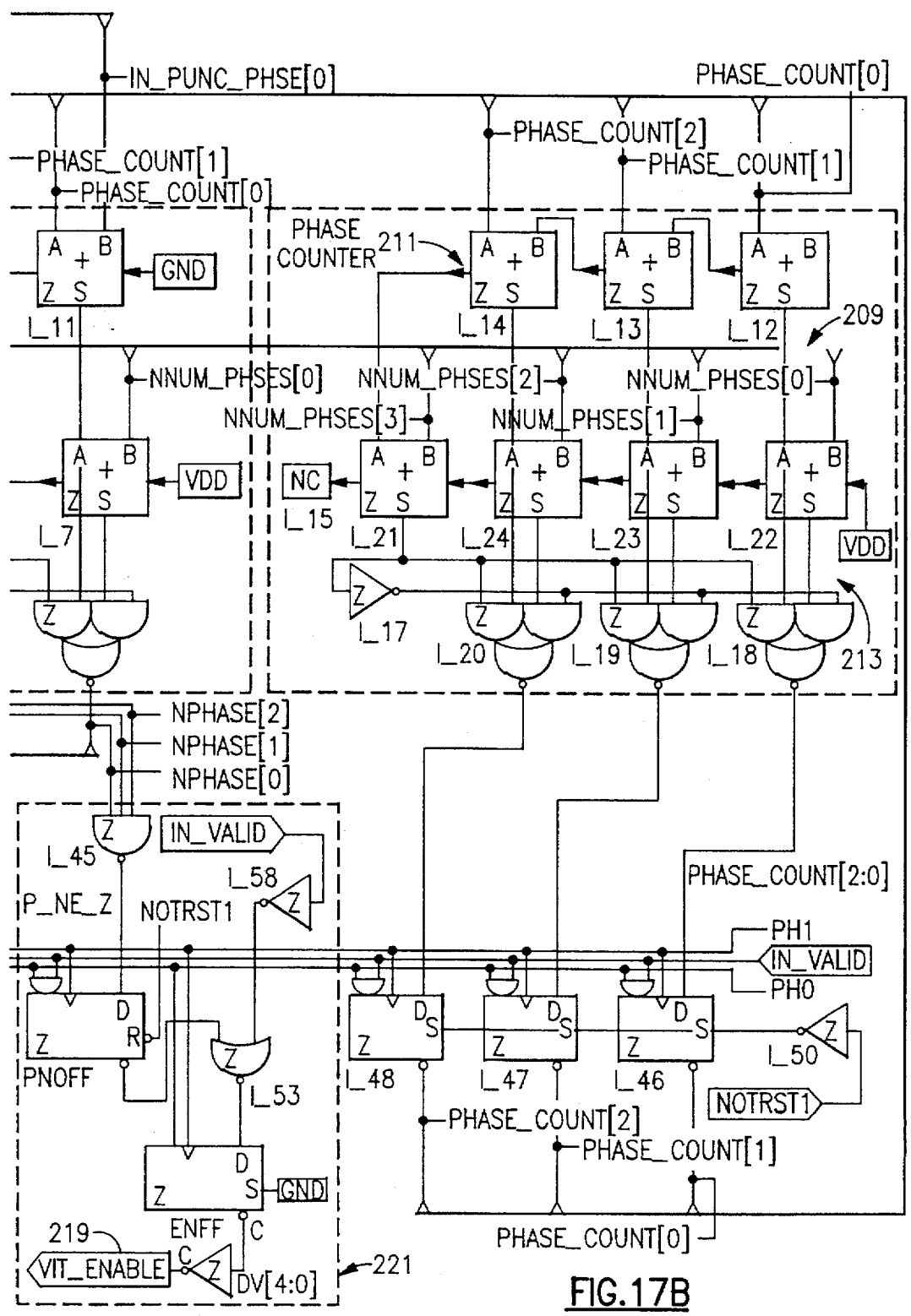

The phase and punctuation control block 188 is shown in greater detail in FIG. 17. The maximum number of phases is derived from the puncture rate on bus 185 by combinatorial logic network 205, and placed on bus 207. Phase counting is accomplished in section 209 by a three bit adder, referenced generally at 211, followed by a 4-bit subtracter, indicated at 213. The phase count, modulo the maximum number of phases, is determined and submitted to phase calculation section 215, where the current puncture phase is added to the phase count in the same manner as in section 209. The current phase, modulo the maximum number of phases, appears on bus 217. As there is a difference between the data transmission rate of the punctuated data stream and the system processing rate, it is necessary to enable and disable the Viterbi decoder 56 according to the punctuation phase. A global enable signal 219 is generated by a small logical network 221.

Figure 19:
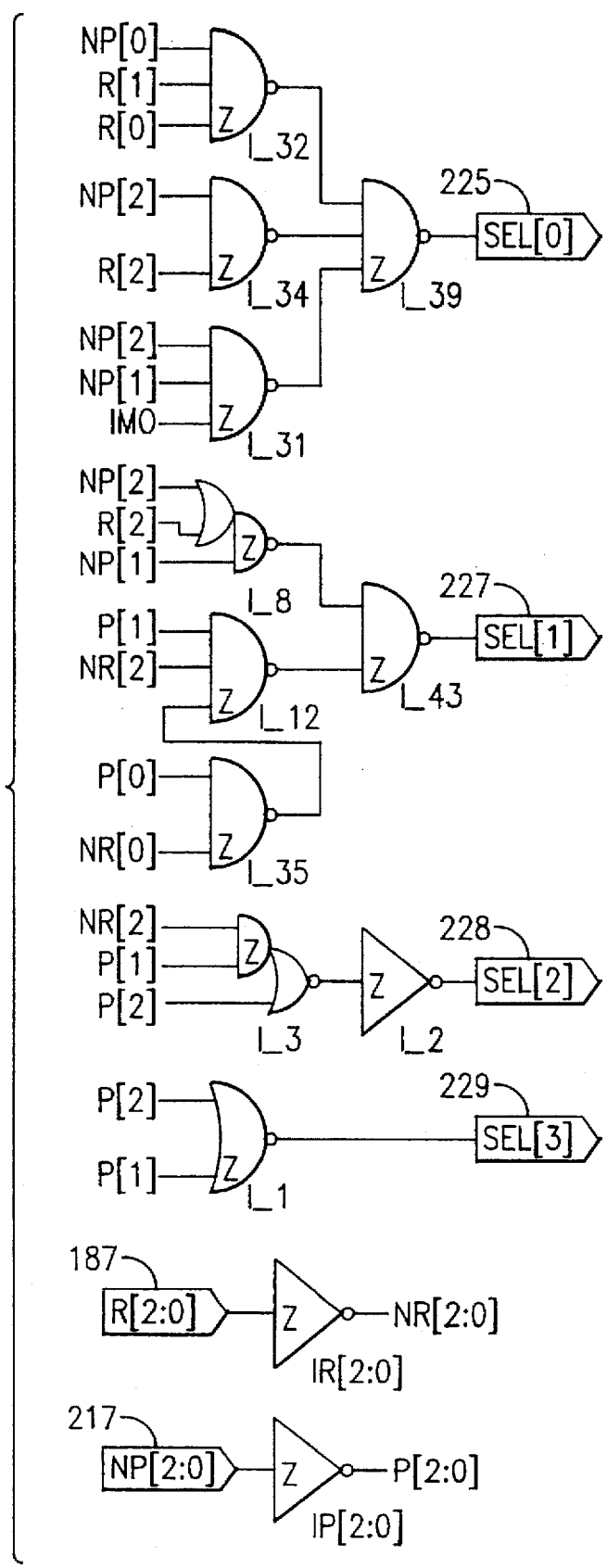
FIGS. 19, 20, and 21 illustrate decode logic in the control unit shown in FIG. 17.
Figure 21:
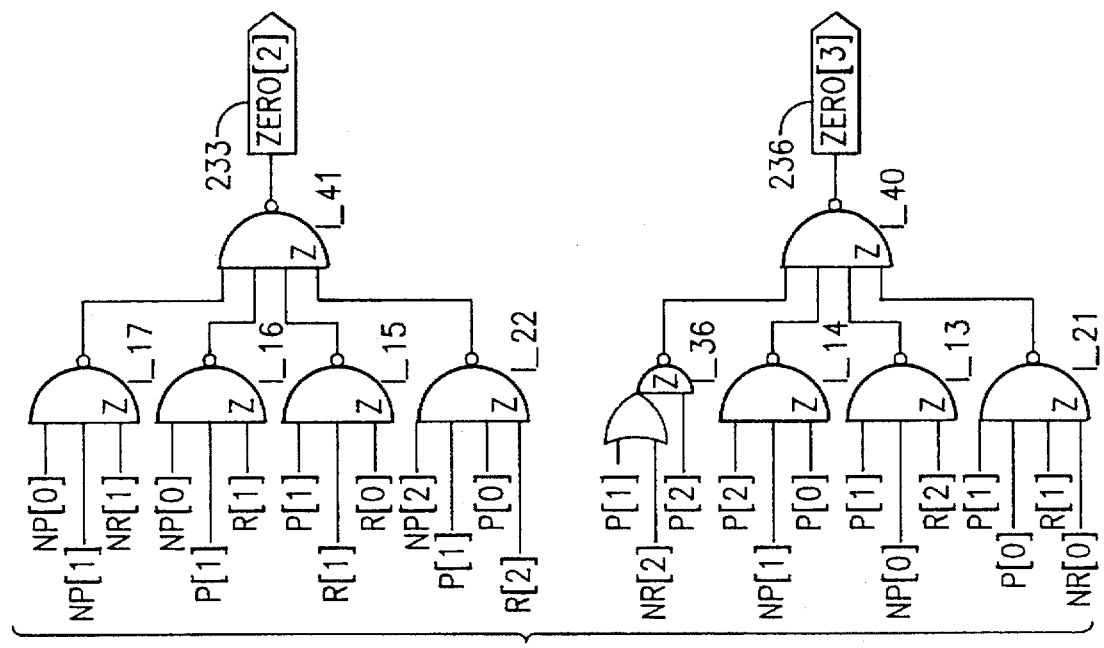
Figure 20:
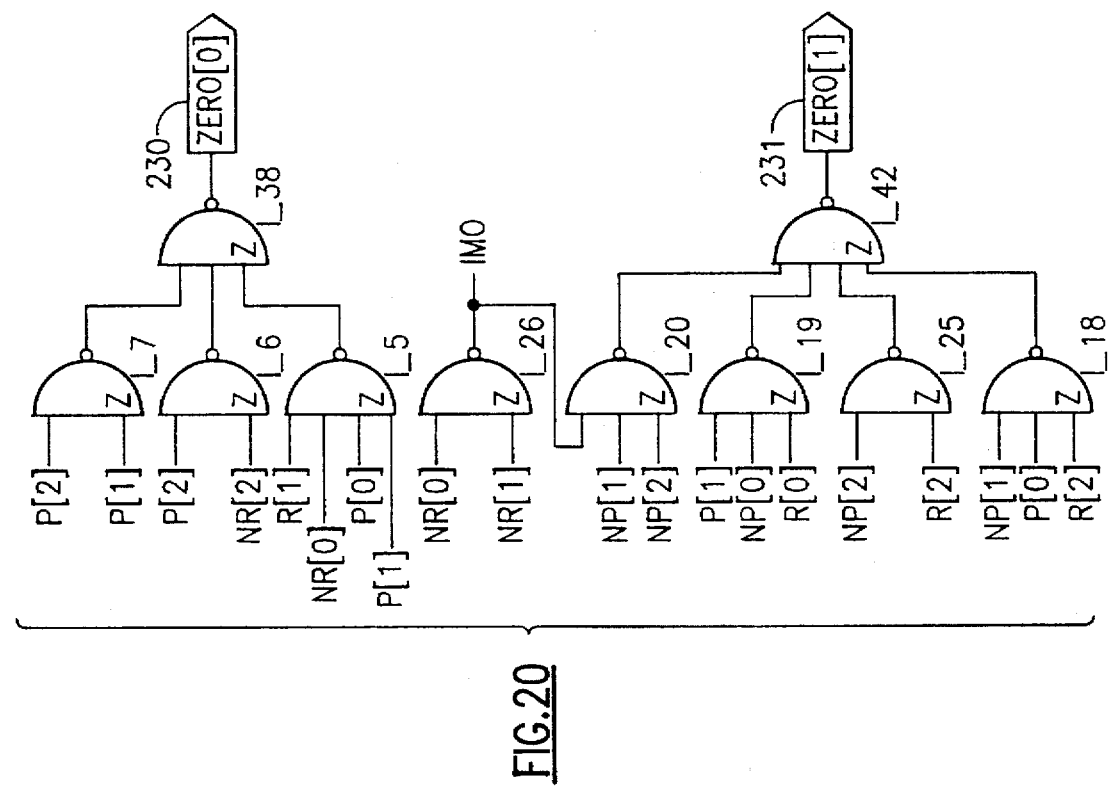

The output of the phase calculation section 215 is also used in a block 223 to decode the phase and rate information on buses 187 and 217 to produce the signals on buses 197, 199, 201, and 203, which are communicated to the branch metric generation block 186 (FIG. 15). The decode logic for buses 197 and 199 is shown in FIGS. 19, 20, and 21, wherein individual bit positions are referenced on lines 225, 227, 228, 229, 231,233 and 236. The signals on buses 201 and 203 (FIG. 15) are complementary to those on buses 197 and 199 respectively. As will be seen below, bus 199 selects a choice of I,Q inputs during branch generation, and bus 203 indicates where a puncture has occurred so that the data at the puncture location does not contribute to the path metric calculation.

Figure 22:
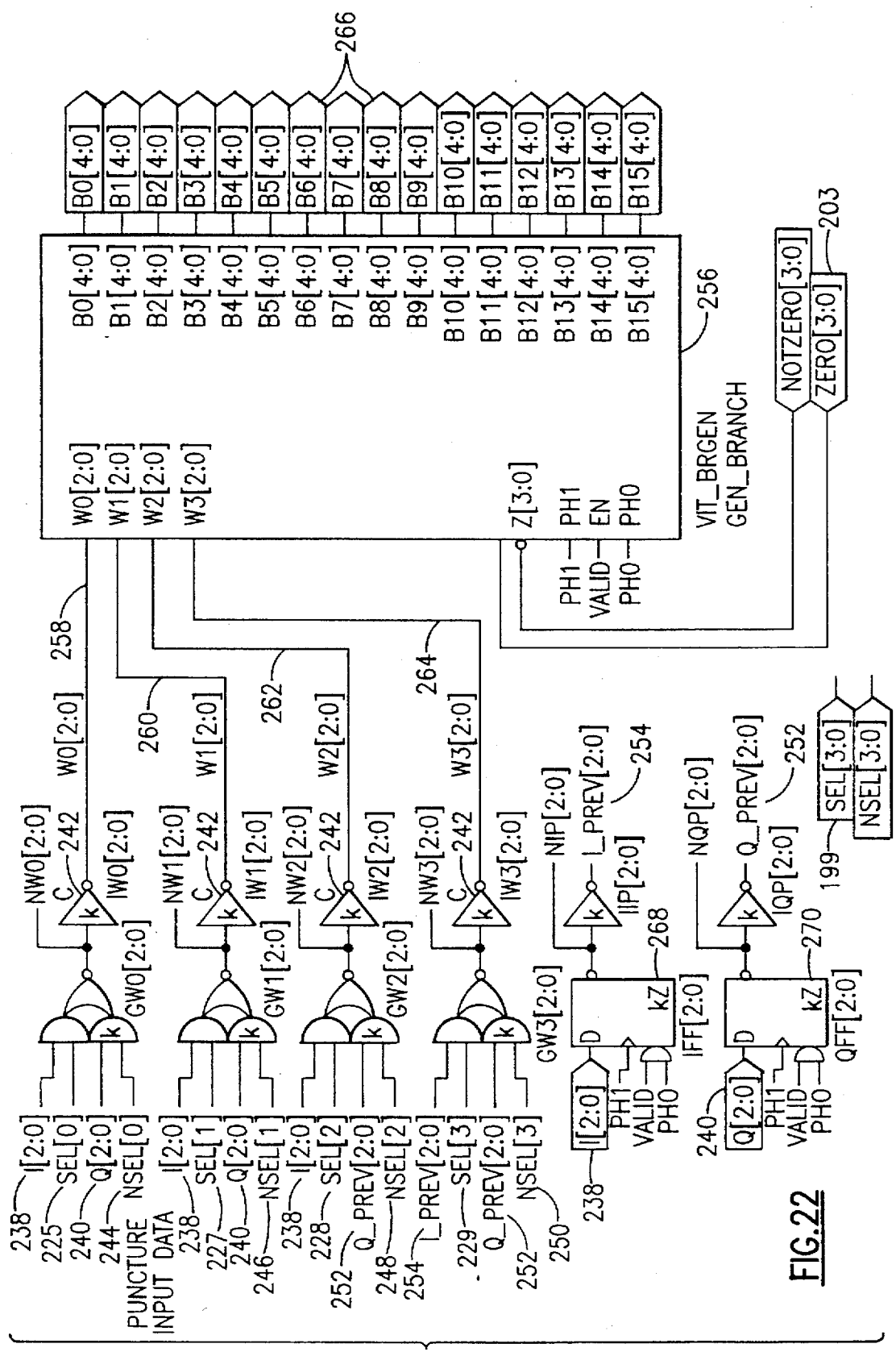
FIG. 22 is an electrical schematic of the branch metric generation block of the Viterbi decoder illustrated in FIG. 15.
Figure 23A:
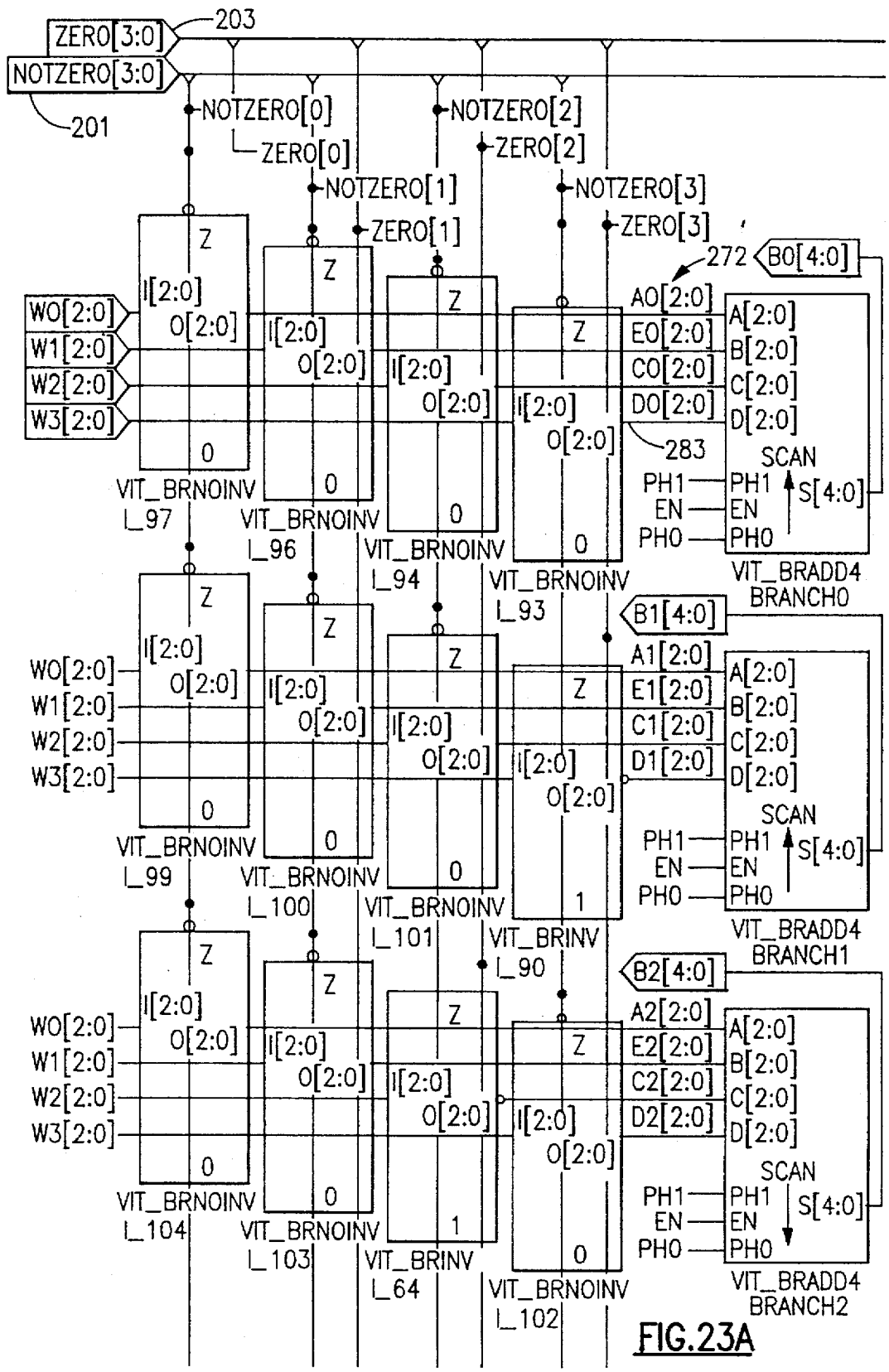
FIG. 23A–23F, referred to collectively as FIG. 23 are an electrical schematic illustrating in further detail a portion of the circuit of FIG. 22.
Figure 23B:
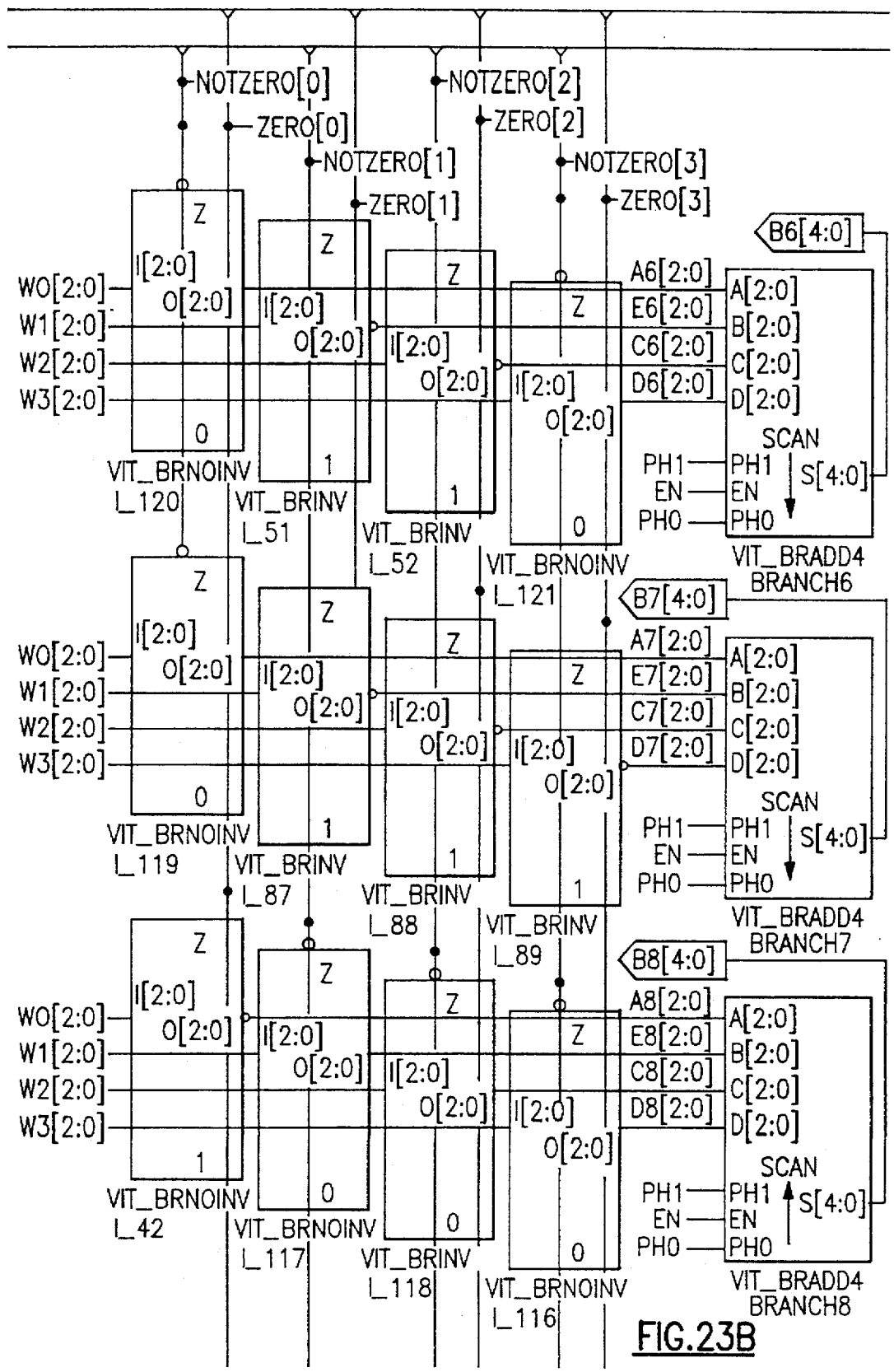
Figure 23C:
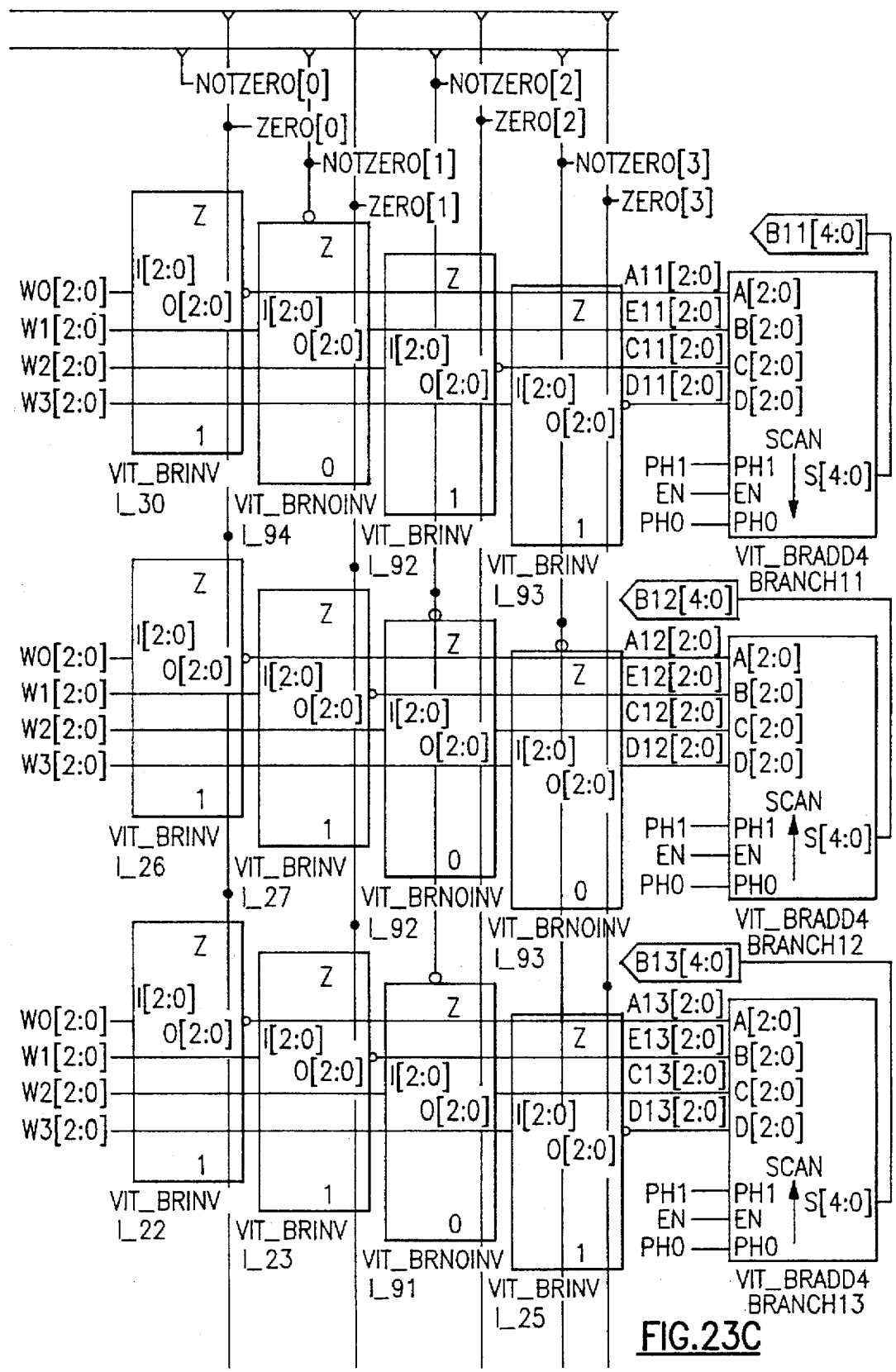
Figure 23D:
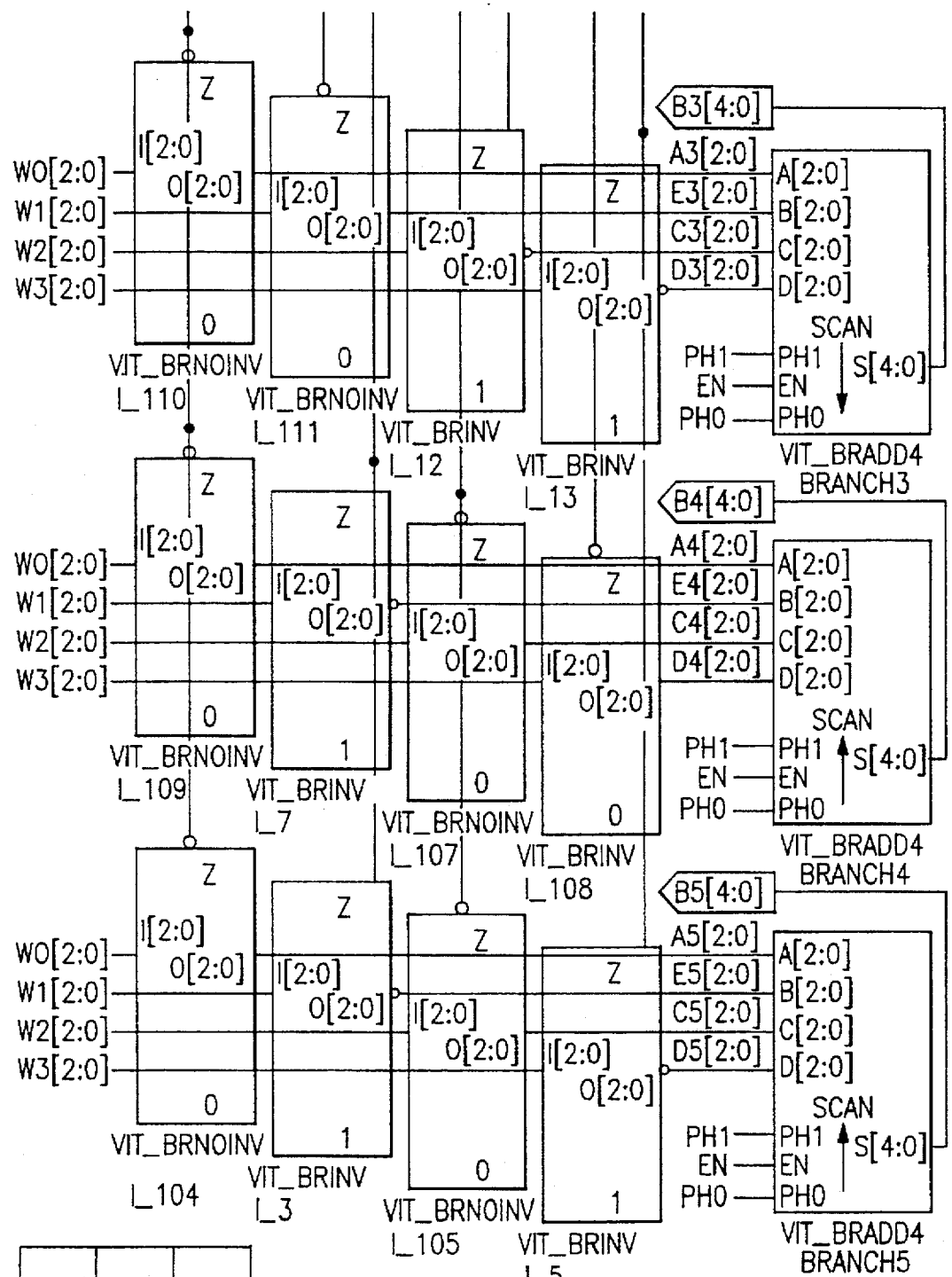
Figure 23E:
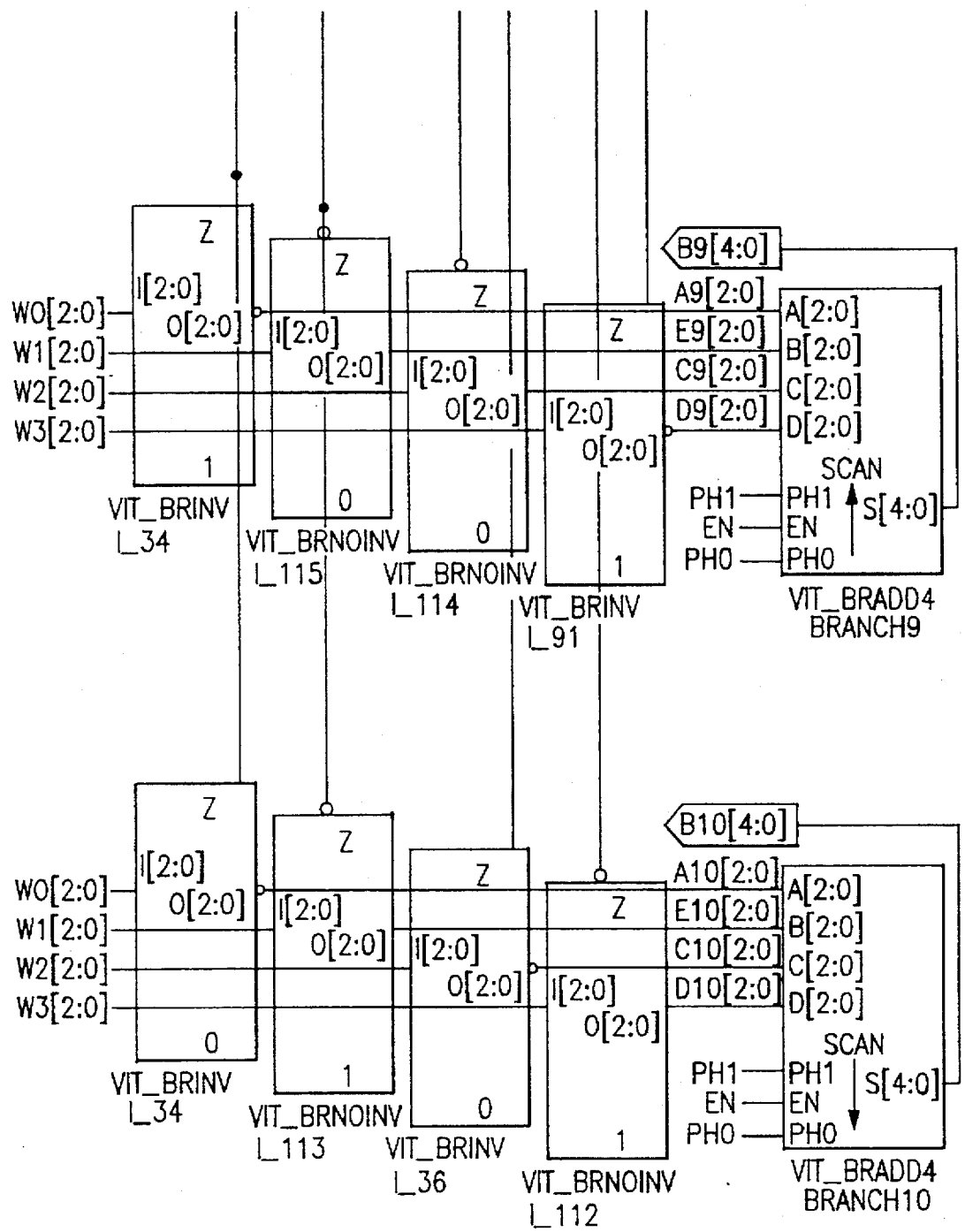
Figure 23F:
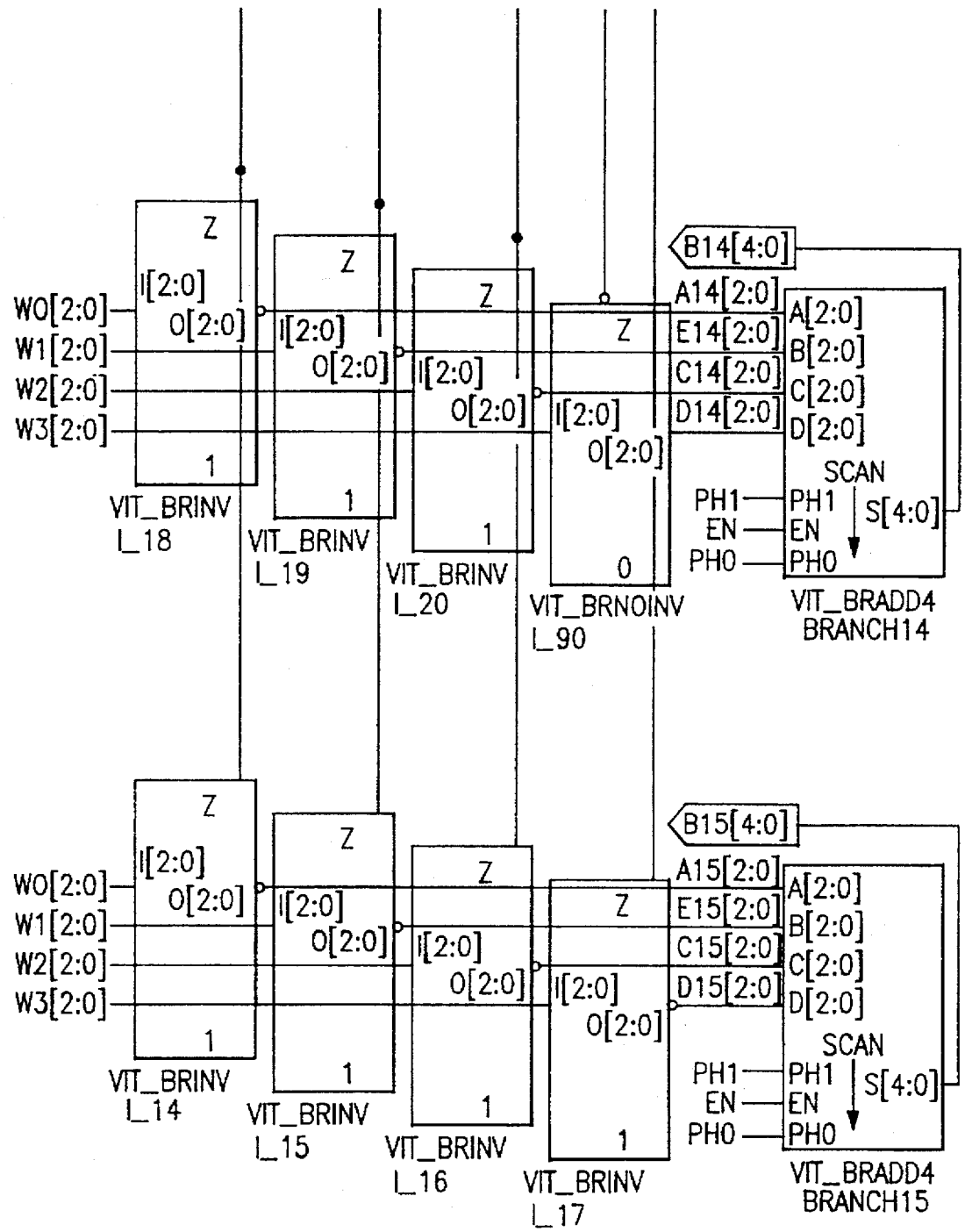

The branch metric generation block 186 (FIG. 15) is shown in greater detail in FIG. 22. Pairs of I,Q data are received on lines 238, 240 respectively, and are processed in four combinatorial logic units 242, according to selector lines 225, 227, 228, 229, which are the complement of lines 197 (indicated as lines 244, 246, 248, 250), and the previous I,Q data on lines 252 and 254. From this data, two symbol XY pairs are reconstituted and presented to block 256 on lines 258, 260, 262, 264 for the generation of all 16 possible branch metrics on lines 266. The previous I,Q data is obtained from two delay flip-flops 268, 270.

Figure 24:
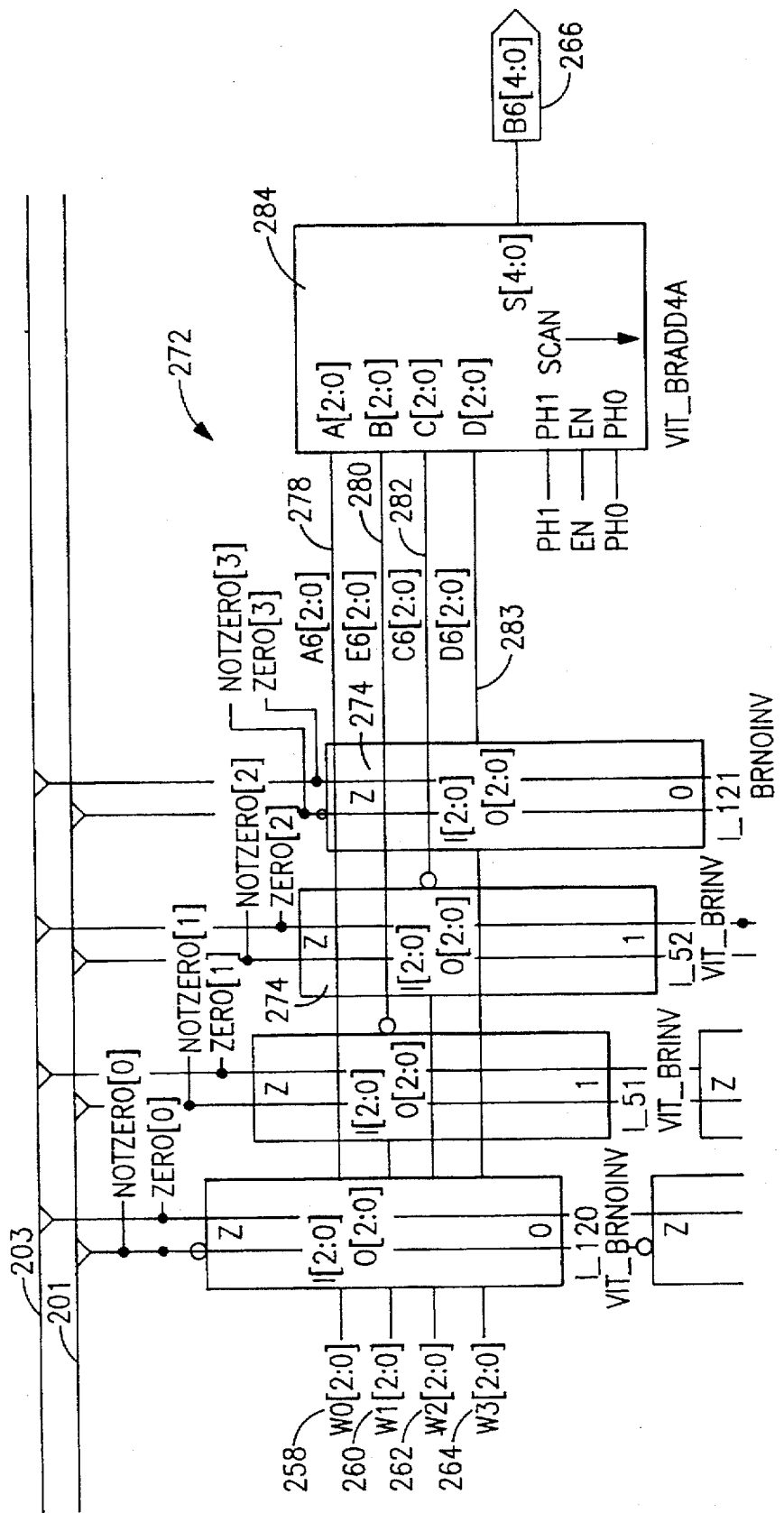
FIG. 24 is a detailed electrical schematic of a calculation unit in the circuit of FIG. 23.
Figure 25:
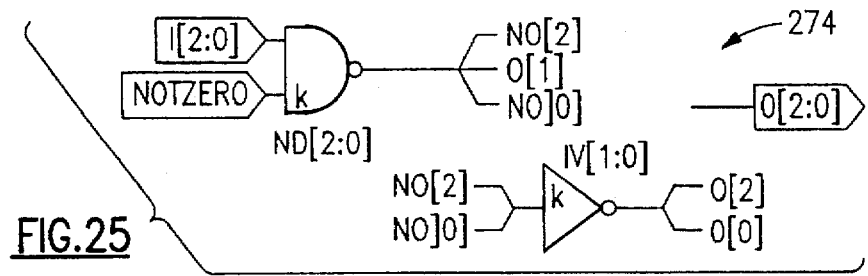
FIG. 25 is an electrical schematic of a logical network which is employed in the circuit illustrated in FIG. 24.
Figure 26:
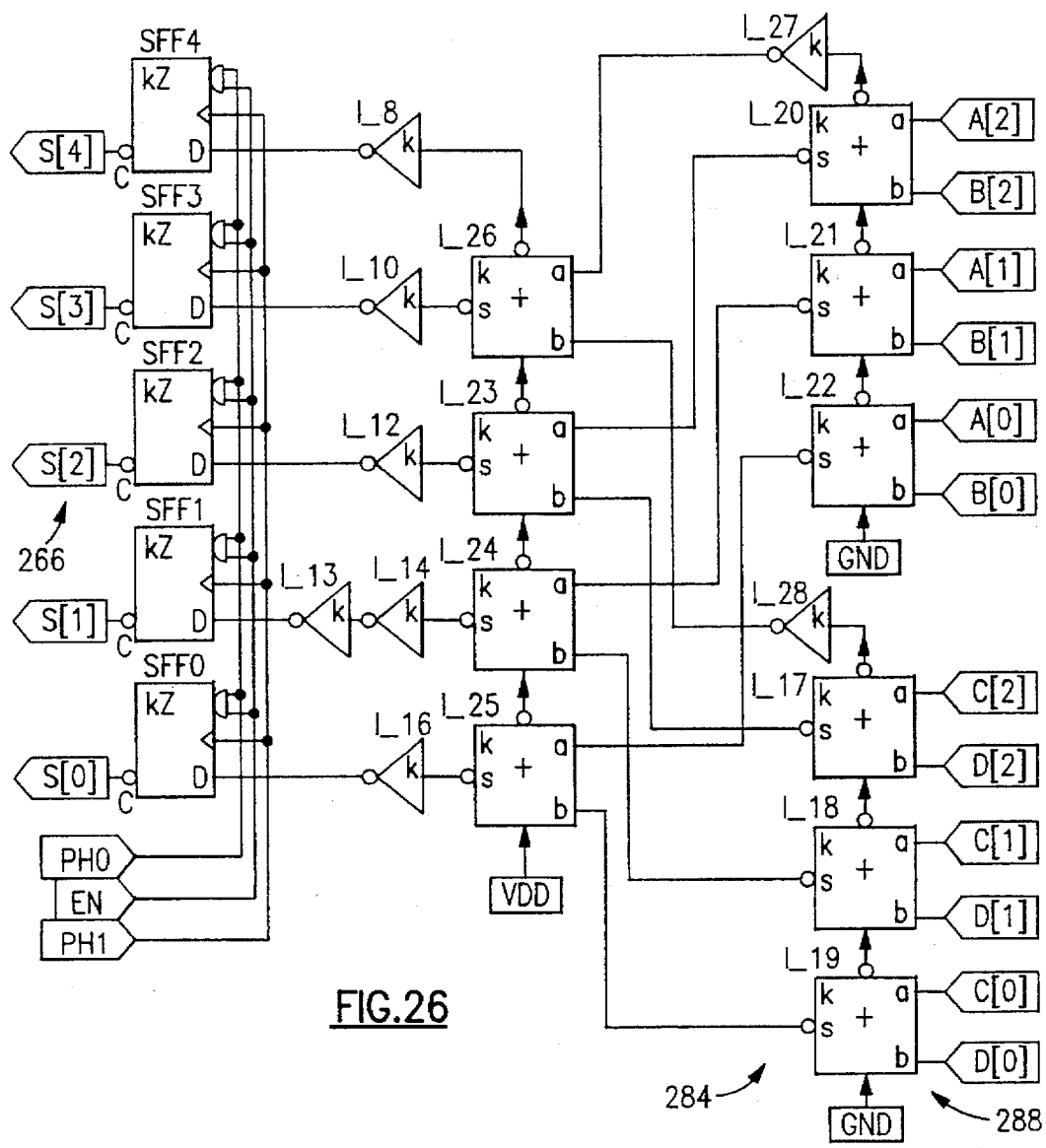
FIG. 26 is an electrical schematic of a summing unit of the circuit of FIG. 23.

Block 256 is illustrated in greater detail in FIG. 23, and comprises 16 identical calculation units 272, one for each of the 16 possible branches. A representative calculation unit 272 is described in yet further detail in FIG. 24. Each calculation unit 272 includes four modules 274 in which the expected data is hard-wired. The modules 274 sum the absolute differences between the input data and the expected data for that particular branch, in the manner shown in Table 3, and force the data corresponding to punctuated positions to zero in accordance with the states of lines 201 and 203. As shown in FIG. 25, the modules 274 comprise a simple logical network, which determines absolute differences, by inverting alternate bits. The four differences thus obtained on lines 278, 280, 282,283 are summed in summing unit 284, which is illustrated in detail in FIG. 26, for output on lines 266 as the branch metric.

Figure 27B:
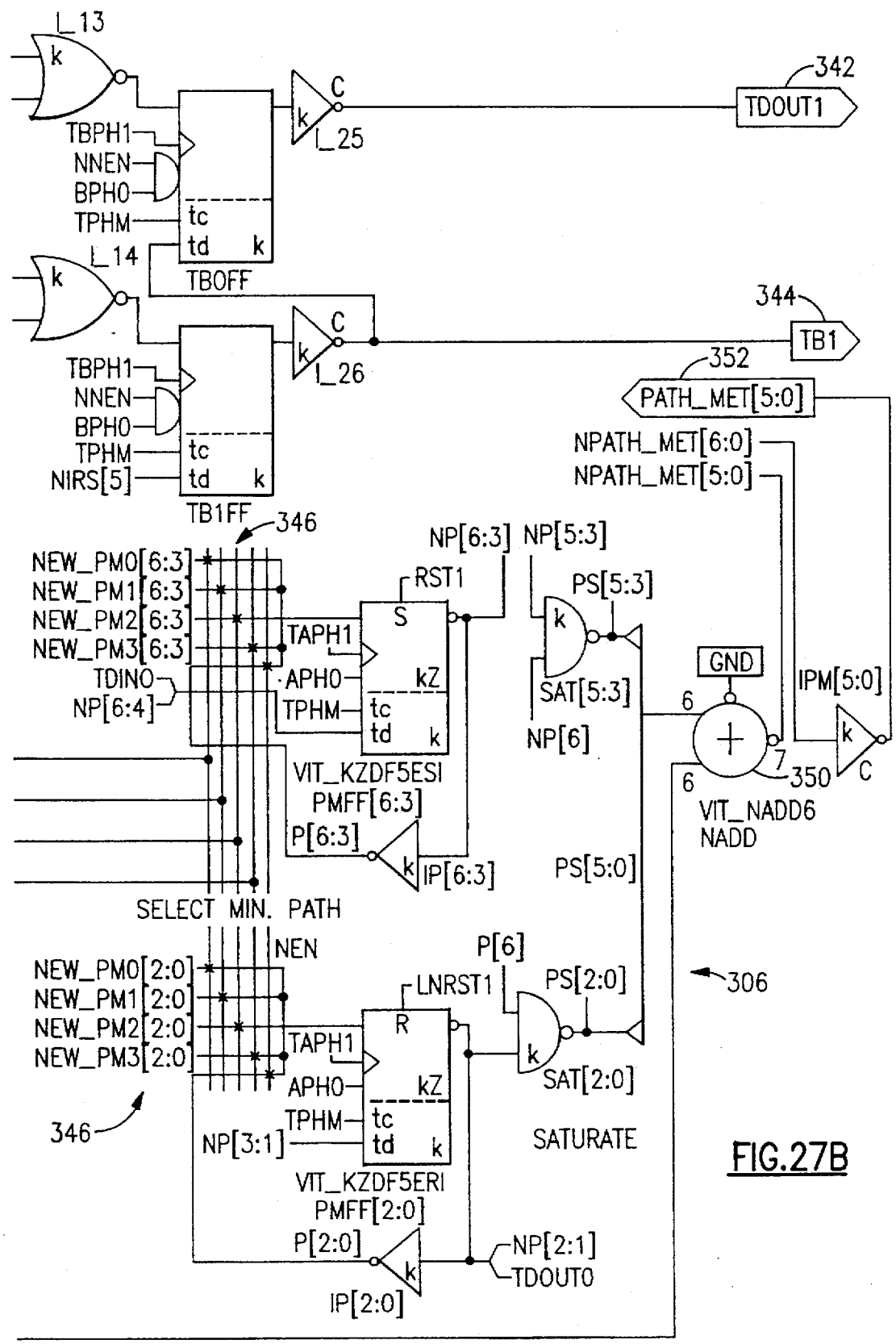

Turning now to FIGS. 15 and 27, path metrics are calculated in path metric generation block 189, utilizing the precalculated branch metrics obtained from the branch metric generation block 186 on lines 288. Precalculation of the branch metrics greatly simplifies the calculation of the path metrics. The path metric generation block 189 is able to process 2 symbols in one clock cycle. By appropriate hardware design choices, the branch metric generation block 186 and the path metric generation block 189 can optionally be generalized to process m symbols in a single clock cycle using an m-stage Viterbi decoder.

Figure 28:
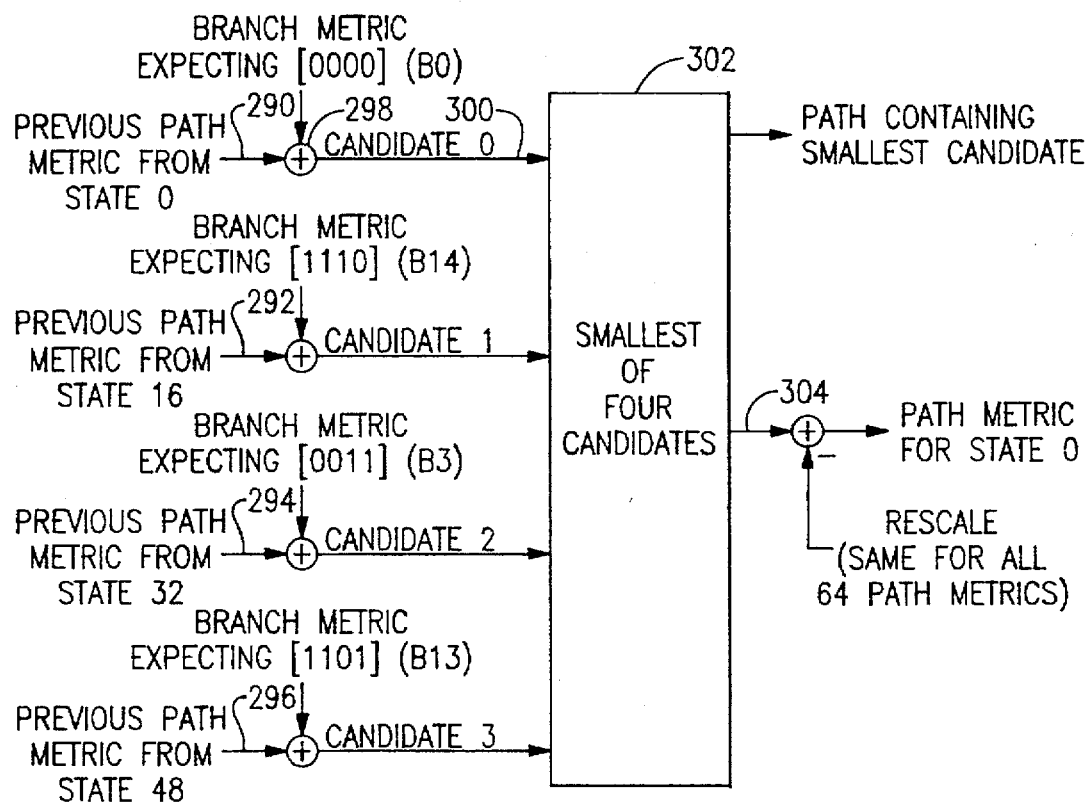
FIG. 28 is diagram illustrating the calculation of a path metric.

The organization of the path metric generation block 189 is initially shown, by way of example, in FIG. 28, where the calculation of a path metric for state 0 is shown. A full expansion of the trellis diagram illustrated in FIG. 14 would show that at $S_{t+1}$, state 0 can legally receive transitions from states 0, 16, 32, and 48, referenced as 290, 292, 294 and 296 respectively. These transitions are referred to in Table 4 as paths 0–3 respectively, corresponding to the two most significant bits of their state number. Table 4 discloses the branch metrics for each legal transition in the transitional trellis diagram of FIG. 14. From Table 4 it can be seen that for state 0, path 0 has expected branch data of 0; path 1 expects 14; path 2 expects 3; and path 3 expects 13. Using the received data, the branch metrics for each expected branch data are calculated. To calculate the four possible candidates for state 0's next path metric, the previous path metric for state 0 is added to the branch metric with expected data 0, using adder 298 to give candidate 0 on line 300, and so on for the other three paths. Then, after comparison of the four candidates in block 302, the next path metric for state 0 is the smallest candidate value, and is output on line 304. The other candidates are discarded, as they are non-optimum paths.

Two data bits passed onto the traceback indicate which path was chosen as having the smallest path metric, i.e. path 0, 1, 2 or 3, as required to trace back in time.

TABLE 4

| | |
|---|---|
| State 0: path 0=0 1=14 2=3 3=13 | State 32: path 0=8 1=6 2=11 3=5 |
| State 1: path 0=12 1=2 2=15 3=1 | State 33: path 0=4 1=10 2=7 3=9 |
| State 2: path 0=7 1=9 2=4 3=10 | State 34: path 0=15 1=1 2=12 3=2 |
| State 3: path 0=11 1=5 2=8 3=6 | State 35: path 0=3 1=13 2=0 3=14 |
| State 4: path 0=13 1=3 2=14 3=0 | State 36: path 0=5 1=11 2=6 3=8 |
| State 5: path 0=1 1=15 2=2 3=12 | State 37: path 0=9 1=7 2=10 3=4 |
| State 6: path 0=10 1=4 2=9 3=7 | State 38: path 0=2 1=12 2=1 3=15 |
| State 7: path 0=6 1=8 2=5 3=11 | State 39: path 0=14 1=0 2=13 3=3 |
| State 8: path 0=15 1=1 2=12 3=2 | State 40: path 0=7 1=9 2=4 3=10 |
| State 9: path 0=3 1=13 2=0 3=14 | State 41: path 0=11 1=5 2=8 3=6 |
| State 10: path 0=8 1=6 2=11 3=5 | State 42: path 0=0 1=14 2=3 3=13 |
| State 11: path 0=4 1=10 2=7 3=9 | State 43: path 0=12 1=2 2=15 3=1 |
| State 12: path 0=2 1=12 2=1 3=15 | State 44: path 0=10 1=4 2=9 3=7 |
| State 13: path 0=14 1=0 2=13 3=3 | State 45: path 0=6 1=8 2=5 3=11 |
| State 14: path 0=5 1=11 2=6 3=8 | State 46: path 0=13 1=3 2=14 3=0 |

TABLE 4-continued

| | |
|---|---|
| State 15: path 0=9 1=7 2=10 3=4 | State 47: path 0=1 1=15 2=2 3=12 |
| State 16: path 0=3 1=13 2=0 3=14 | State 48: path 0=11 1=5 2=8 3=6 |
| State 17: path 0=15 1=1 2=12 3=2 | State 49: path 0=7 1=9 2=4 3=10 |
| State 18: path 0=4 1=10 2=7 3=9 | State 50: path 0=12 1=2 2=15 3=1 |
| State 19: path 0=8 1=6 2=11 3=5 | State 51: path 0=0 1=14 2=3 3=13 |
| State 20: path 0=14 1=0 2=13 3=3 | State 52: path 0=6 1=8 2=5 3=11 |
| State 21: path 0=2 1=12 2=1 3=15 | State 53: path 0=10 1=4 2=9 3=7 |
| State 22: path 0=9 1=7 2=10 3=4 | State 54: path 0=1 1=15 2=2 3=12 |
| State 23: path 0=5 1=11 2=6 3=8 | State 55: path 0=13 1=3 2=14 3=0 |
| State 24: path 0=12 1=2 2=15 3=1 | State 56: path 0=4 1=10 2=7 3=9 |
| State 25: path 0=0 1=14 2=3 3=13 | State 57: path 0=8 1=6 2=11 3=5 |
| State 26: path 0=11 1=5 2=8 3=6 | State 58: path 0=3 1=13 2=0 3=14 |
| State 27: path 0=7 1=9 2=4 3=10 | State 59: path 0=15 1=1 2=12 3=2 |
| State 28: path 0=1 1=15 2=2 3=12 | State 60: path 0=9 1=7 2=10 3=4 |
| State 29: path 0=13 1=3 2=14 3=0 | State 61: path 0=5 1=11 2=6 3=8 |
| State 30: path 0=6 1=8 2=5 3=11 | State 62: path 0=14 1=0 2=13 3=3 |
| State 31: path 0=10 1=4 2=9 3=7 | State 63: path 0=2 1=12 2=1 3=15 |

Figure 29:
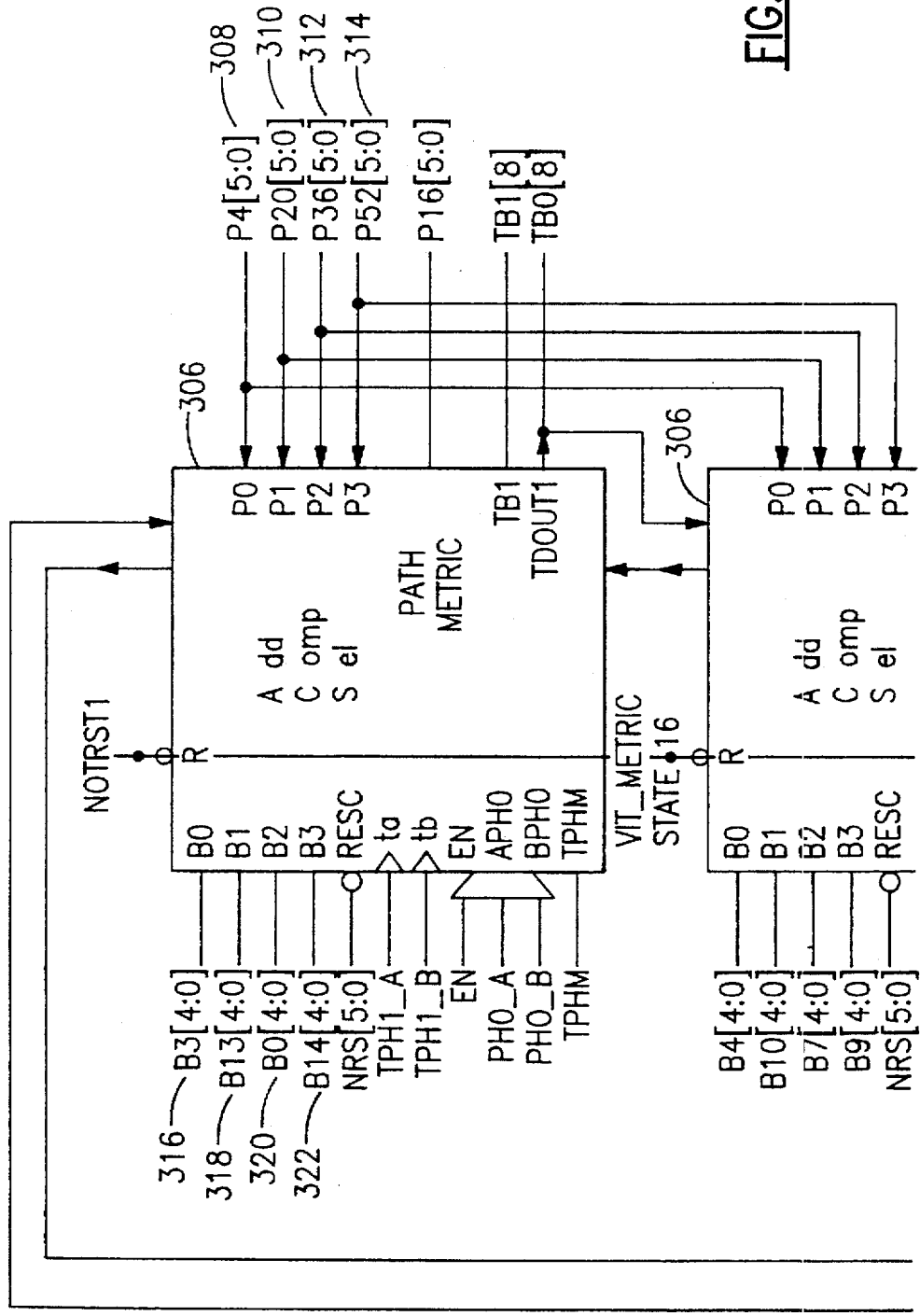
FIG. 29 is a fragmentary block diagram illustrating an add-compare-select unit in the path metric generation block of the Viterbi decoder illustrated in FIG. 15.

The path metric generation block 189 comprises 64 add-compare-select blocks 306, one of which is fully shown in a fragmentary view in FIG. 29. Each of the add-compare-select blocks 306 generates a path metric. In actual layout, it is convenient to arrange the 64 add-compare-select blocks 306 in two groups of 32. This is a more compact design which minimizes the length and thus the driving requirements of the path metric routing crossbar. The smallest of the 64 path metrics is determined in the path metric generation block 189. Each of the add-compare-select blocks 306 receives four path metrics of a previous state each on 6-bit buses 308, 310, 312, 314, corresponding to transitions such as shown in FIG. 14. The corresponding branch metrics are received on 5-bit buses 316, 318, 320, and 322.

Figure 30:
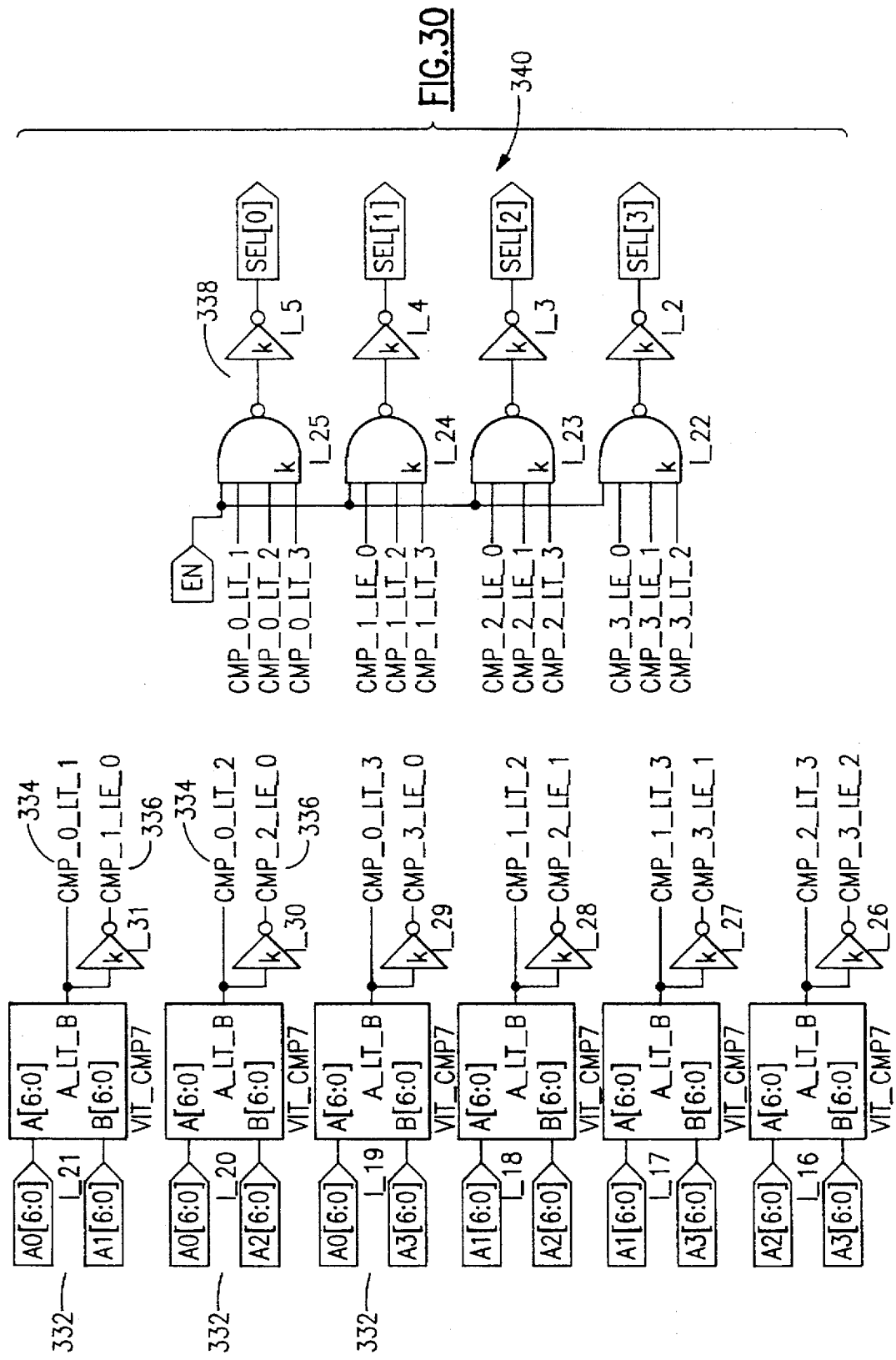
FIG. 30 is an electrical schematic of a portion of an add-compare-select unit in the path metric generation block of the Viterbi decoder illustrated in FIG. 27.

FIG. 27 illustrates the arrangement of an add-compare-select block 306 in greater detail, wherein a minimum path metric of the 4 candidate path metrics input thereto is determined. The candidate path metrics are obtained in adders 324 by the addition of a path metric and a branch metric which are input on buses 326 and 328 respectively. The minimum path metric is then determined in compare module 330. Compare module 330 is shown in further detail in FIG. 30, in which four values are compared to find the minimum. In the six units 332 at the left side of FIG. 30, all possible comparisons are made and outputted on lines 334, 336. The outputs on lines 336 are simply the inversions of the outputs on lines 334 for each respective unit 332. The results are then decoded in a logical network 338 and placed on a four-bit select bus 340. An advantage of the arrangement is that the add, compare, and rescale operations, discussed below, can be pipelined to save time.

Referring again to FIGS. 15 and 27, two bits of information are provided to a traceback unit 191 on lines 342 and 344 at each data cycle of operation of each add-compare-select block 306. Selection of the smallest path metric is accomplished using multiplexers referenced generally 346. To allow the path metric to be represented by six bits in order to reduce hardware, a rescaling unit 348 rescales the smallest path metric in an adder 350. The smallest path value is rescaled according to the equation $$RV = \frac{xz^{-2}}{1 + z^{-1} + z^{-2}}$$

wherein x is the smallest path metric, RV is the rescale value, and $z^{-1}$ and $z^{-2}$ are x delayed by 1 and 2 cycles of operation of the add-compare-select block 306 respectively. The delay is employed because 2 cycles are required to calculate the smallest path metric. The rescaling function utilized guarantees that the rescaled value RV will never be negative. The rescaled path metric is output on bus 352.

Referring now to FIGS. 1 and 15, the Viterbi decoder 56 has a control block 195, which has several functions. In a first mode of operation, illegal state transitions of the path having the smallest path metric are counted as a measure of whether the currently estimated puncture rate, puncture phase and carrier phase have been correctly determined. Based on the illegal state transition count, a new combination of puncture rate, puncture phase, and carrier phase are chosen. If the illegal state transition count is within a specified tolerance, a second mode of operation is initiated, wherein an output data stream is enabled in which a correct synchronization pattern is sought. However, the end-state of the first mode of operation is retained. Hence if synchronization is not achieved, the first mode of operation is resumed at the end-state. This can be appreciated with reference to FIG. 31. Initially, in step 354, the illegal state counter and a wait counter are reset. At decision step 356 a check is immediately made to determine of a permissible number of illegal states transitions has been exceeded.

A test is next made at step 370 for the occurrence of an illegal state transition. If an illegal state transition has not occurred, control immediately passes to decision step 360. If an illegal state transition has occurred, an illegal transition state counter is incremented at step 372. Otherwise control passes to step 358. Another test of the cumulative number of illegal state transitions is performed in decision step 374. If the number of illegal states is still within tolerance, control passes to step 358. Otherwise step 366 is executed, as will be explained below.

The wait counter is incremented in step 358. Next, at decision step 360 a test is made to determine if the 256 cycles have been evaluated, according to the state of the wait counter. If not, control returns to step 356. If 256 cycles have been evaluated and the illegal state transitions remain within tolerance, synchronization search is activated in step 362. Control then proceeds to decision step 364, wherein activity of the synchronization unit is tested. Until synchronization fails, control remains in step 364.

mIn the event synchronization fails, control returns to the first mode of operation at decision step 366. Control also shifts to step 366 if, at any execution of step 356, the number of illegal state transitions is not within tolerance. Step 366 is a decision step wherein a test is made for exhaustion of all possible combinations of puncture phases and carrier phases. If these have not been exhausted, the carrier phase is changed in step 368, and control returns to step 354. If the test at decision step 366 fails, then a further test is made at decision step 376 to determine if all puncture rates have been evaluated. If exhaustion has not occurred, then the puncture rate and phase are changed at step 378. If all puncture rates and phases have been evaluated, then tolerance is increased at step 380, and control again returns to step 354.

Figure 31:
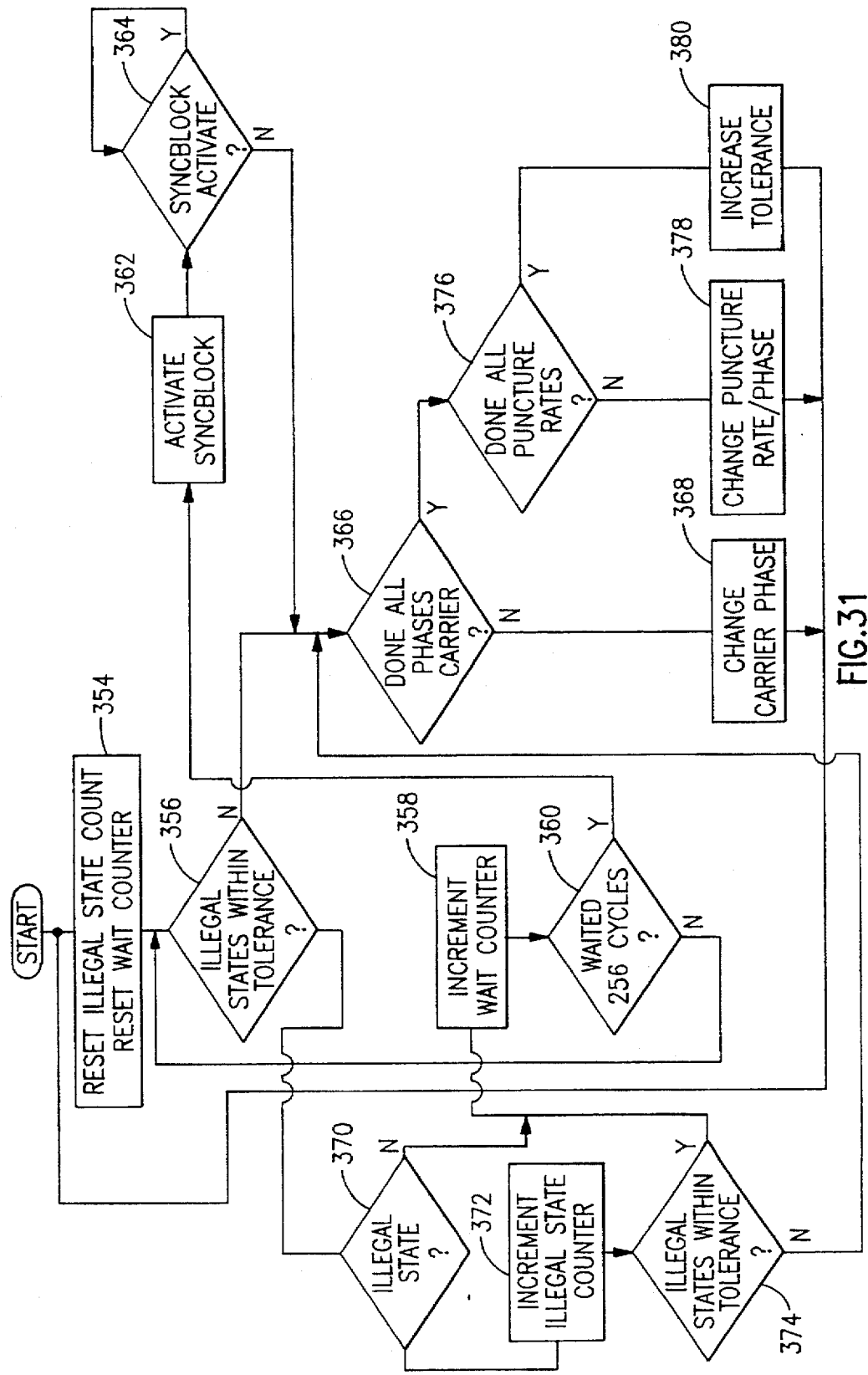
FIG. 31 is a flow diagram illustrating a sequence of operations of the control block of the Viterbi decoder illustrated in FIG. 15.
Figure 32A:
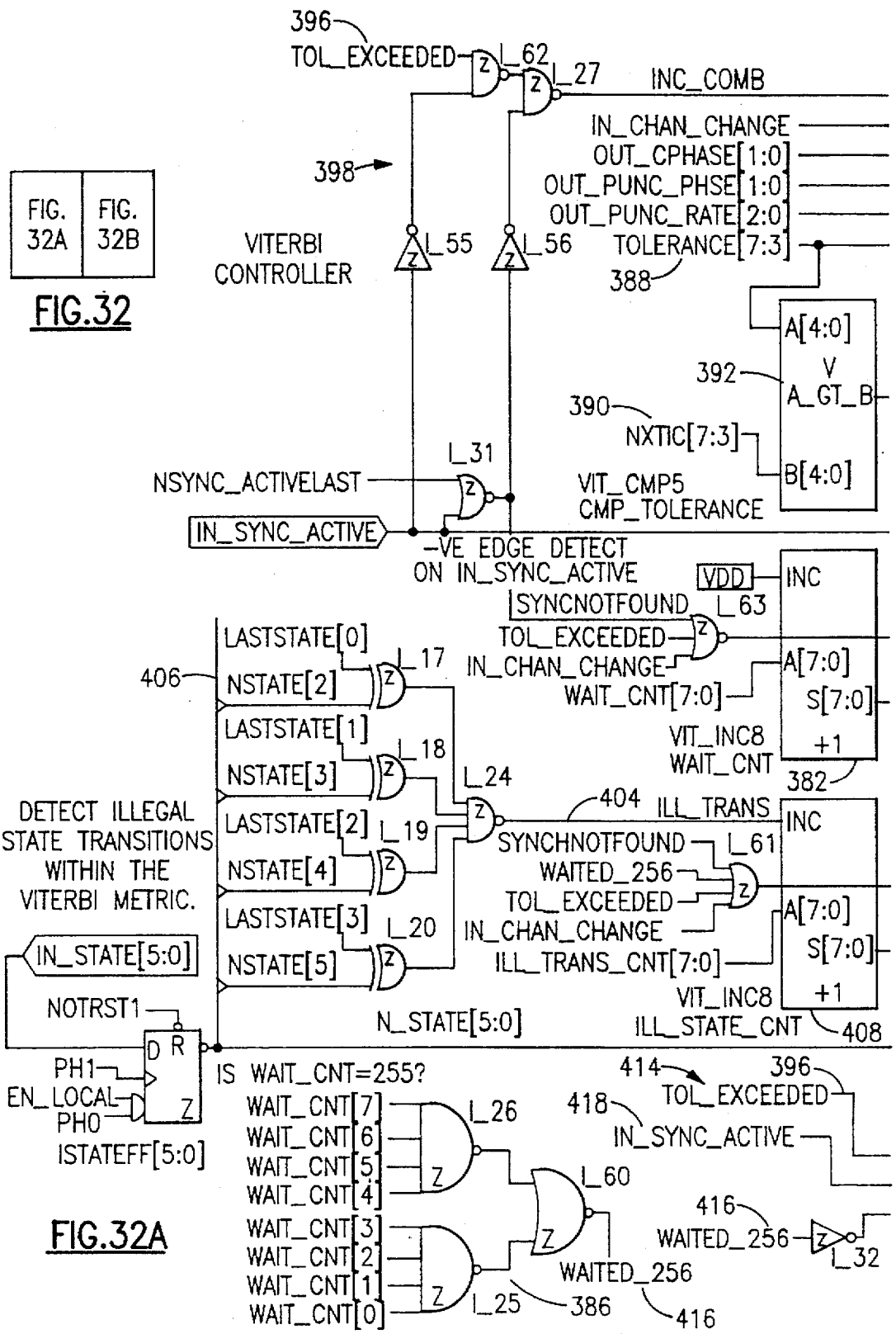
FIG. 32A–32B, referred to collectively as FIG. 32 are an electrical schematic of the control block explained in FIG. 31.
Figure 32B:
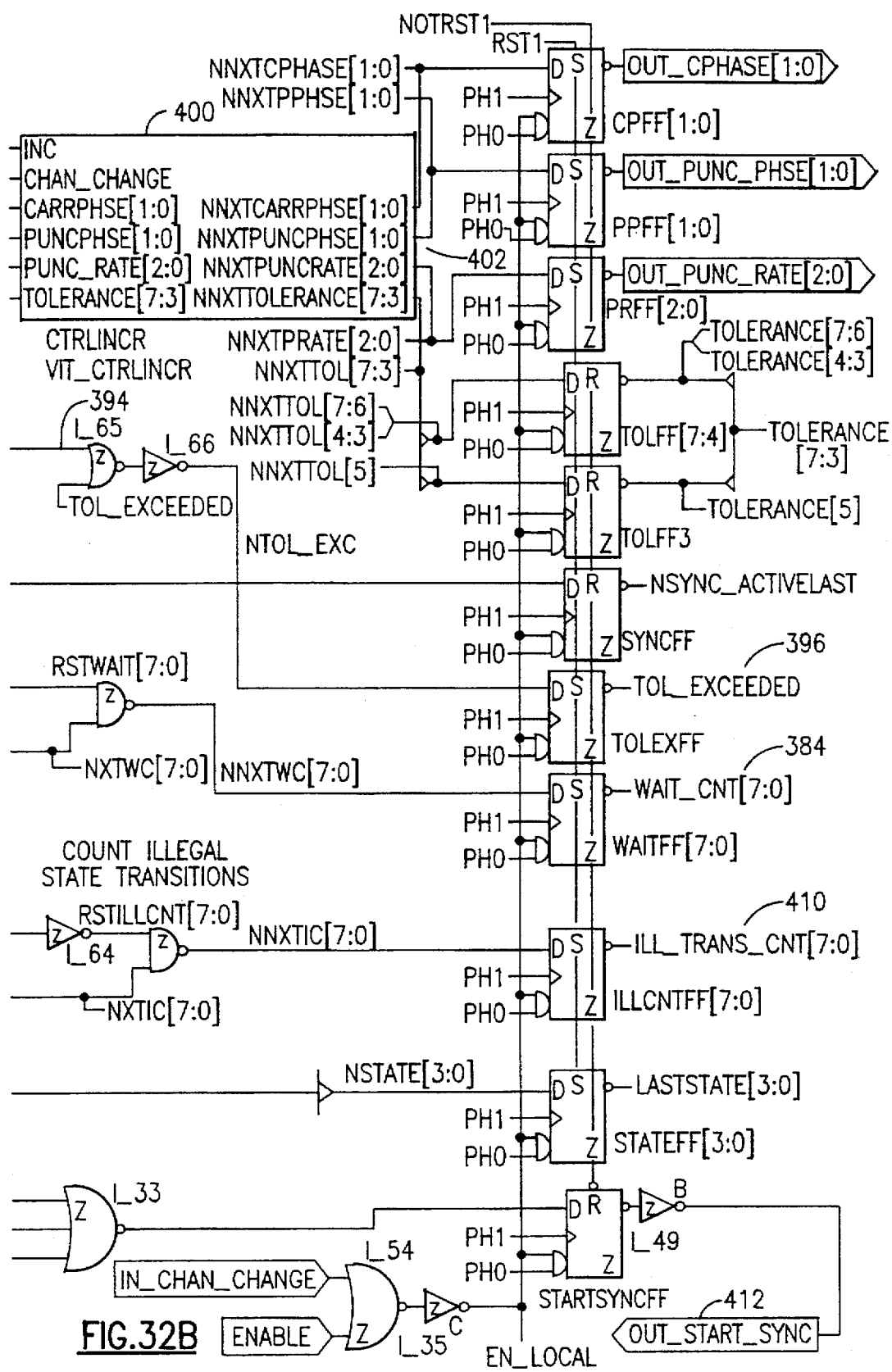

The realization of the flow diagram shown in FIG. 31 is illustrated in FIG. 32. The wait counter is incremented in incrementer 382, and its value placed on a bus 384. The wait counter is tested in combinatorial logic 386. The number of illegal transitions tolerated is signaled on bus 388, and tested against the illegal state count on bus 390 in a comparator unit 392. A pulse is then generated on line 394, outputted on line 396, and fed back via a logical network 398 to a controller unit 400. The controller unit 400 outputs a new carrier phase, puncture rate, puncture phase, and new tolerance limit on lines generally referenced 402, according to the procedure discussed with reference to FIG. 31. Illegal state transitions are signaled on line 404 as decoded by a logical network 406 taking the previous state as input. Transitions on line 404 are counted in incrementer 408, and the new count value placed on a bus 410.

The second mode of operation, looking for sync bytes in the data stream, is initiated on line 412. This line is the output of a combinatorial logic network 414, which is governed by several control signals, namely the state of the tolerance test line 396, the status of the wait counter on line 416, and the current state of the decoder's second mode of operation, which is indicated on line 418.

Figure 33:
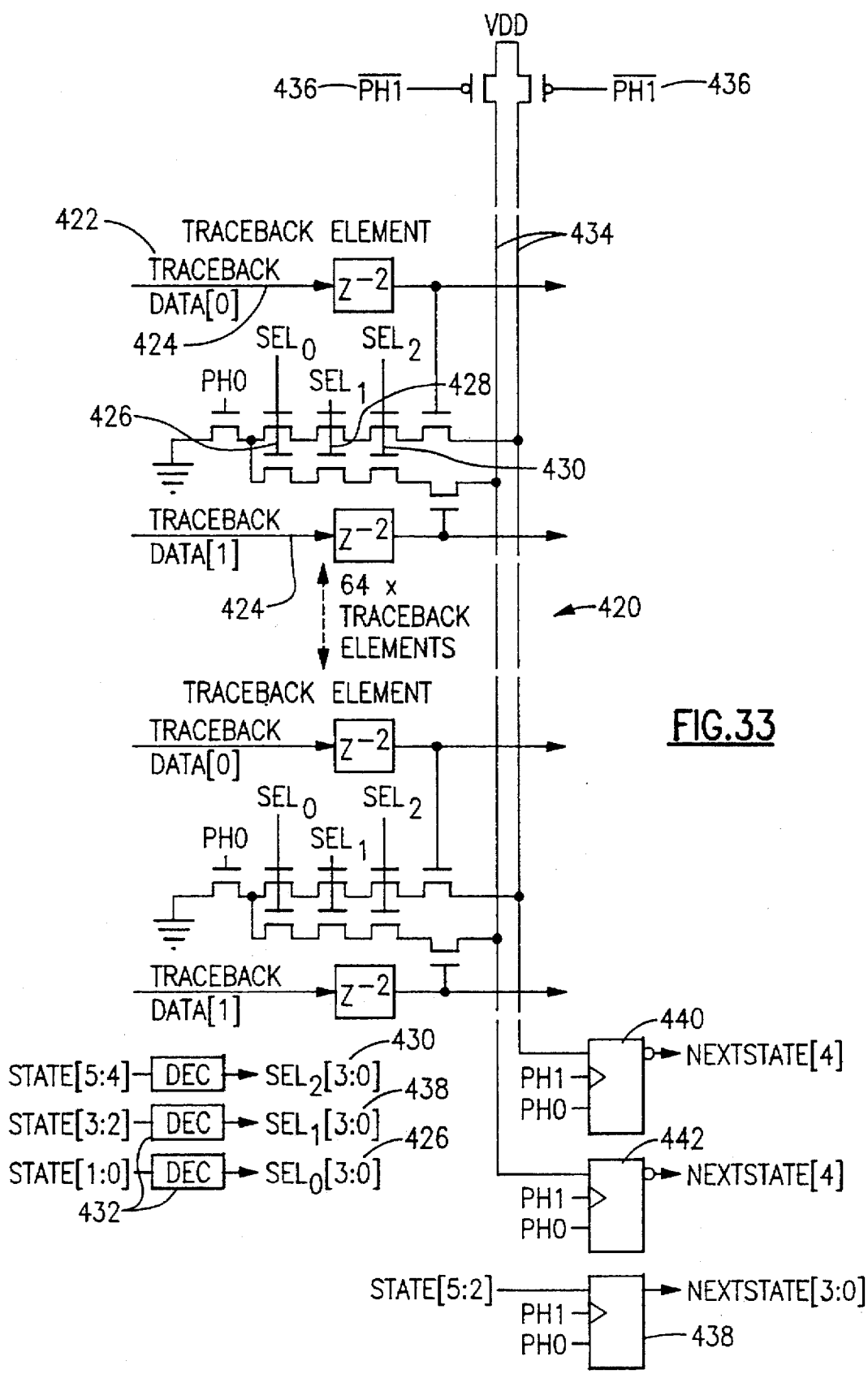
FIG. 33 is an electrical schematic of a traceback column of the traceback unit in the Viterbi decoder illustrated in FIG. 15.

The systolic traceback array unit 191 (FIG. 15) operates using a history of 21 periods in the preferred embodiment, and can be further understood with reference to FIG. 33. The traceback array unit 191 is linked to the add-compare-select blocks 306 (FIG. 29) of the path metric generation block 189, and includes a succession of traceback columns 420, each traceback column 420 representing all historical surviving paths determined at a point in time by the add-compare-select blocks 306 and the path metric generation block 189. Each traceback column 420 has a plurality of traceback elements 422, and each traceback element 422 accepts m bits of traceback data 424. As explained herein, m equals 2 in the currently preferred embodiment. The traceback column's traceback elements 424 are addressed by three predecoded select lines 426, 428, and 430 according to contents of at least one previous traceback column (not shown), as decoded by three decoders 432. The outputs of each traceback column 420 are placed on precharged lines 434.

In accordance with the known theory of 2-step Viterbi decoding, two bits are acquired in each traceback column 420 to become the two most significant bits of the next traceback column. At each stage in traceback a 6-bit state addresses one of the 64 locations to get the contents of the traceback element and build the next state in the traceback. This 64 to 1 multiplexing is done by precharging the two data lines 434.

As explained above, select lines 426, 428, and 430 are connected according to the state number of the previous traceback element, line 426 tapping the decoded state[1:0] corresponding to its state number, line 428 tapping State [3:2], and line 430 tapping State[5:4]. On clock Ph1 436, the two precharge lines 434 are pulled to VDD. On clock Ph0 438, only one of the traceback elements 424 is selected by select lines 426, 428, and 430, and the precharge lines 434 are pulled down according to the traceback data. The state of the precharge lines 434 is latched in latches 440, 442 to be used for the 2 most significant bits for the next traceback column (not shown). It has been found that the use of precharged lines 434 greatly reduces the area required by the traceback unit 191.

When the last traceback column is reached, two bits of fully decoded I,Q data is outputted on the precharged lines 434 for use by the synchronization block 193 (FIG. 15).The amount of history (size of the window) in the traceback and the number of levels in the quantized I,Q data stream have significant effects on the performance of the Viterbi decoder 56 (FIG. 1).

EXAMPLE

Figure 34:
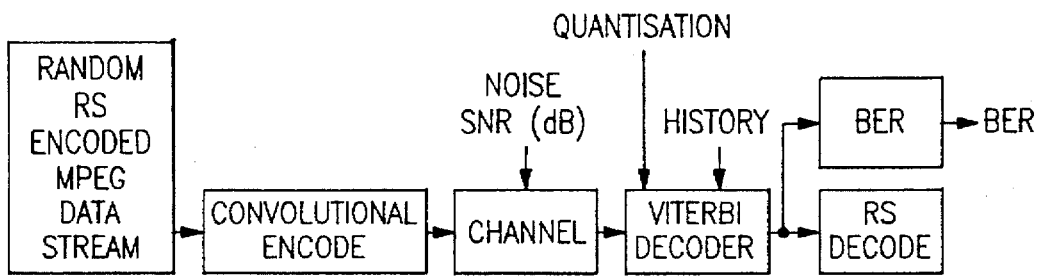
FIG. 34 is a block diagram of a simulation used to explain the operation of the traceback unit illustrated in FIG. 23.

The method of quantifying these parameters is by simulation. The design of the simulation is shown in FIG. 34. Only simulations for rates 1/2 and 7/8 were performed as they represent the two extremes in encoding overhead. The curves are named as RrHhQq where r is code rate, h is history as a multiple of (K−1), where K is the constraint length, and q is the number of quantization levels used in soft decoding.

The quantization figures are stated as the number of soft coding levels used. For example, the quantization Q=8 represents 3-bit quantization. The history is stated as a multiple of (K−1)=6, where K is the constraint length. Thus a history H=4 represents a window of 4 * 6=24 1-step transitions, where * indicates multiplication. To determine the quantization levels required, the history, H, was set to a large window of H=8. The results were obtained and plotted in tables 5 and 6.

The results for rate 1/2 show there is almost zero improvement between 8 and 16 quantization levels (3 and 4 bits). With the rate 7/8 results, there is some improvement between 8 and 16 levels. Moving from 3-bit to 4-bit quantization results in the branch metrics' maximum values moving from 28 (5 bits) to 60 (6 bits). This in turn would result in a larger bit width within the path metric generation block 189 (FIG. 15), the time critical block of the whole decoder. The gain in moving from 3-bit to 4-bit quantization was considered not worthwhile, and it was decided to adopt 8-level quantization in the preferred embodiment.

Holding quantization at 8 levels, the history in the traceback was varied during further simulations. The results from this are plotted in Tables 7, 8, 9, and 10. The results for rate 1/2 show that there is little gain for history greater than 3, i.e. 3 * (K−1)=18. With rate 7/8 code, however, there is a steady improvement by increasing history, leveling-off at 7, i.e. 7 * (K−1)=42. It is relatively simple to increase history by adding on extra columns, but the gain in going from history of 7 to 8 does not seem worthwhile for the columns required.

TABLE 5

| SNR(dB) | R12H8Q4 | R12H2Q4 | R12H2Q16 | R12H8Q16 |
|---|---|---|---|---|
| −5.0 | 1.56e-2 | 3.72e-2 | 2.01e-2 | 7.30e-3 |
| −5.5 | 6.58e-3 | 1.71e-2 | 8.01e-3 | 2.18e-3 |
| −6.0 | 1.66e-3 | 7.06e-3 | 2.79e-3 | 6.34e-4 |
| −6.5 | 4.07e-4 | 2.56e-3 | 8.99e-4 | 1.75e-4 |
| −7.0 | 1.17e-4 | 6.33e-4 | 2.54e-4 | 5.11e-5 |
| −7.5 | 1.70e-5 | 2.14e-4 | 6.05e-5 | |
| −8.0 | | 5.64e-5 | | |

TABLE 6

| SNR(dB) | R78H8Q4 | R78H2Q4 | R78H2Q16 | R78H8Q16 |
|---|---|---|---|---|
| −9.0 | | | | 4.99e-2 |
| −9.5 | | | 5.21e-2 | 1.94e-2 |
| −10.0 | 2.30e-2 | 6.26e-2 | 2.56e-2 | 6.28e-3 |
| −10.5 | 9.00e-3 | 3.31e-2 | 1.17e-2 | 2.29e-3 |
| −11.0 | 3.62e-3 | 1.98e-2 | 5.64e-3 | 6.53e-4 |
| −11.5 | 9.58e-4 | 1.13e-2 | 2.82e-3 | 2.50e-4 |
| −12.0 | 2.50e-4 | 5.88e-3 | 9.39e-4 | 1.61e-5 |
| −12.5 | 8.87e-5 | 3.27e-3 | 6.93e-4 | |
| −13.0 | 8.47e-5 | 1.33e-3 | 2.90e-4 | |
| −13.5 | | 5.78e-4 | 1.69e-4 | |
| −14.0 | | 2.64e-4 | | |
| −14.5 | | 1.53e-4 | | |
| −15.0 | | 7.66e-5 | | |

TABLE 7

| SNR(DB) | R12H8Q8 | R12H8Q2 | R12H2Q8 | R12H2Q2 |
|---|---|---|---|---|
| −4.0 | | | | |
| −4.5 | 2.37e-2 | | 6.72e-2 | |
| −5.0 | 8.89e-3 | | 3.62e-2 | |
| −5.5 | 3.01e-3 | | 1.80e-2 | |
| −6.0 | 6.90e-4 | | 7.41e-3 | |
| −6.5 | 2.49e-4 | 1.46e-2 | 2.73e-3 | 4.43e-2 |
| −7.0 | 2.68e-5 | 4.84e-3 | 9.37e-4 | 2.18e-2 |
| −7.5 | | 2.05e-3 | 3.90e-4 | 1.13e-2 |

TABLE 7-continued

| SNR(DB) | R12H8Q8 | R12H8Q2 | R12H2Q8 | R12H2Q2 |
|---|---|---|---|---|
| −8.0 | | 4.25e-4 | 8.39e-5 | 4.52e-3 |
| −8.5 | | 5.36e-5 | 3.65e-6 | 1.41e-3 |
| −9.0 | | | | 3.94e-4 |
| −9.5 | | | | 1.75e-4 |
| −10.0 | | | | 1.02e-4 |
| −10.5 | | | | 1.82e-5 |

TABLE 8

| SNR(DB) | R78H8Q8 | R78H8Q2 | R78H2Q8 | R78H2Q2 |
|---|---|---|---|---|
| −8.5 | 1.28e-1 | | 1.96e-1 | |
| −9.0 | 4.83e-2 | | 1.31e-1 | |
| −9.5 | 2.92e-2 | | 7.40e-2 | |
| −10.0 | 1.05e-2 | | 3.94e-2 | |
| −10.5 | 3.90e-3 | 4.73e-2 | 1.98e-2 | |
| −11.0 | 1.38e-3 | 2.35e-2 | 1.04e-2 | 7.75e-2 |
| −11.5 | 3.87e-4 | 1.16e-2 | 5.08e-3 | 5.34e-2 |
| −12.0 | 4.84e-5 | 4.65e-3 | 2.48e-3 | 3.42e-2 |
| −12.5 | | 1.54e-3 | 1.29e-3 | 1.89e-2 |
| −13.0 | | 5.52e-4 | 6.73e-4 | 1.03e-2 |
| −13.5 | | 1.05e-4 | 3.02e-4 | 5.69e-3 |
| −14.0 | | 4.03e-5 | 3.63e-5 | 2.50e-3 |
| −14.5 | | 3.63e-5 | 2.82e-5 | 1.87e-3 |
| −15.0 | | 3.25e-5 | 2.82e-5 | 1.41e-3 |
| −15.5 | | | | 2.98e-4 |

TABLE 9

| SNR(dB) | R12H7Q4 | R12H6Q8 | R12H5Q8 | R12H4Q8 | R12H3Q8 |
|---|---|---|---|---|---|
| 4.5 | 2.37e-2 | 2.55e-2 | | 3.06e-2 | 386e-2 |
| 5.0 | 8.76e-3 | 9.21e-3 | 1.00e-2 | 1.18e-2 | 1.56e-2 |
| 5.5 | 3.13e-3 | 3.25e-3 | 3.63e-3 | 4.43e-3 | 6.27e-3 |
| 6.0 | 6.97e-4 | 7.51e-4 | 8.50e-4 | 1.18e-3 | 1.90e-3 |
| 6.5 | 2.68e-4 | 2.76e-4 | 2.80e-4 | 3.49e-4 | 5.25e-4 |
| 7.0 | 2.68e-5 | 2.68e-5 | 2.68e-5 | 3.06e-5 | 6.93e-5 |
| 7.5 | | | | | 7.30e-6 |

TABLE 10

| SNR(dB) | R78H7Q8 | R78H6Q8 | R78H5Q8 | R78H4Q8 | R78H3Q8 |
|---|---|---|---|---|---|
| 9.0 | 6.88e-2 | | | | |
| 9.5 | 3.02e-2 | 3.93e-2 | 4.04e-2 | 4.64e-2 | 5.31e-2 |
| 10.0 | 1.10e-2 | 1.33e-2 | 1.67e-2 | 2.31e-2 | 2.59e-2 |
| 10.5 | 4.01e-3 | 5.00e-3 | 6.71e-3 | 9.16e-3 | 1.10e-2 |
| 11.0 | 1.32e-3 | 1.71e-3 | 2.57e-3 | 3.73e-3 | 5.07e-3 |
| 11.5 | 5.31e-4 | 7.99e-4 | 1.12e-3 | 1.66e-3 | 2.19e-3 |
| 12.0 | 7.12e-5 | 1.31e-4 | 2.96e-4 | 5.25e-4 | 7.83e-4 |
| 12.5 | 7.12e-5 | 1.09e-4 | 2.13e-4 | 3.45e-4 | 5.14e-4 |
| 13.0 | | | 4.93e-5 | 1.15e-4 | 1.97e-4 |
| 13.5 | | | | | 3.28e-5 |

Synchronization

The synchronization strategy assumes a regularly spaced synchronization byte in the data stream. According to the noted European telecommunications standard, an inverted synchronization byte is transmitted in place of every 8th synchronization byte. The synchronization search unit 193 (FIG. 15) also assembles the two-bit output received from the traceback unit 191 on line 161 into bytes. This is accomplished by initially assembling 9-bits, and then evaluating two 8-bit bytes, each offset by one bit position. Both bytes thus assembled are evaluated, and a decision made for outputting one of them, according to which has a predefined synchronization bit pattern.

FIG. 15 shows the synchronization search unit 193. The synchronization search unit 193 starts a search for valid sync bytes after receiving a start sync signal 159 from the control block 195. The search unit reports back to the control unit its state on the sync active line 157. As discussed previously, the control unit enables the search unit after illegal state transitions are within tolerances.

Figures 35, 37:
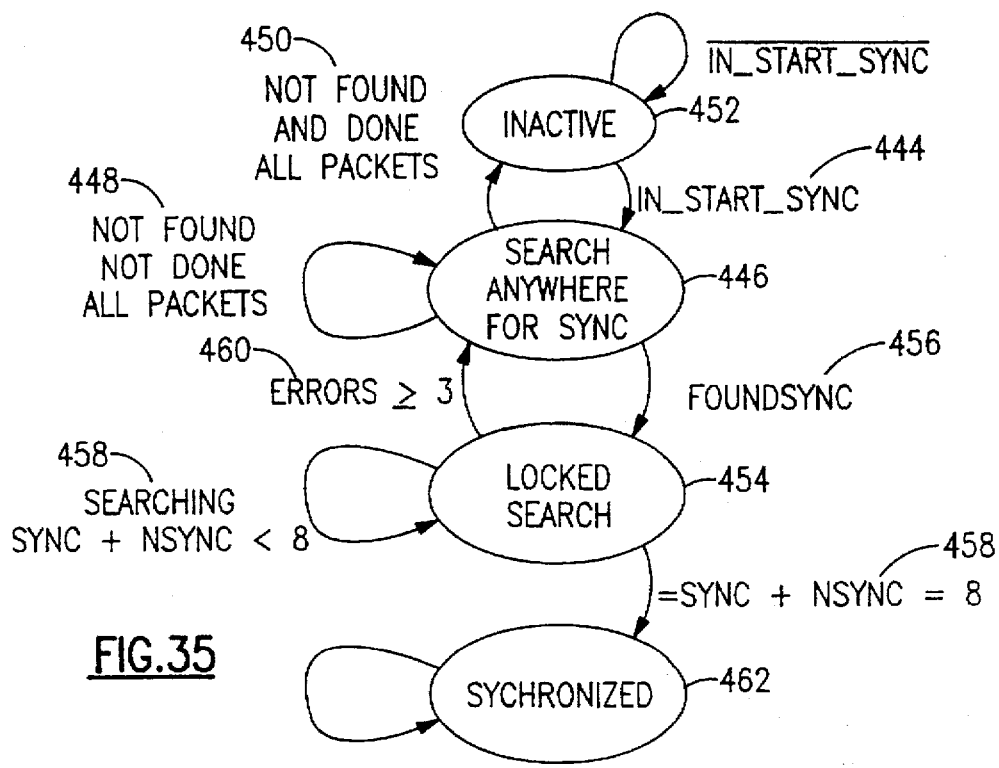
FIG. 35 is a state diagram explaining the operation of the synchronization search unit of the Viterbi decoder illustrated in FIG. 15.
FIG. 37 is a diagram of the logical organization of a random access memory used in the deinterleaver of the receiver illustrated in FIG. 1.
Figure 36A:
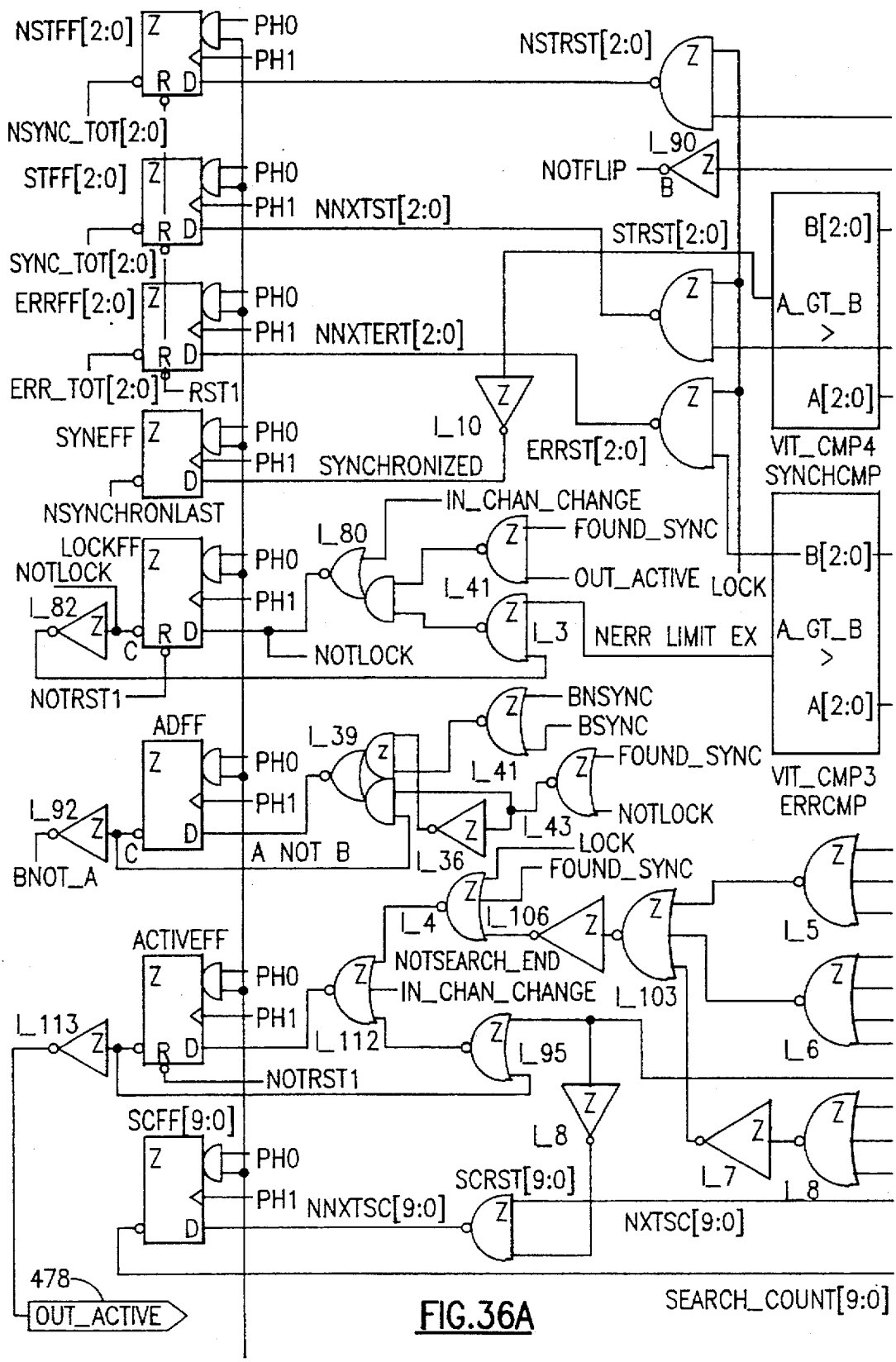
FIG. 36A–36D, referred to collectively as FIG. 36, are an electrical schematic logic of diagram of the synchronization search unit described in FIG. 35.
Figure 36B:
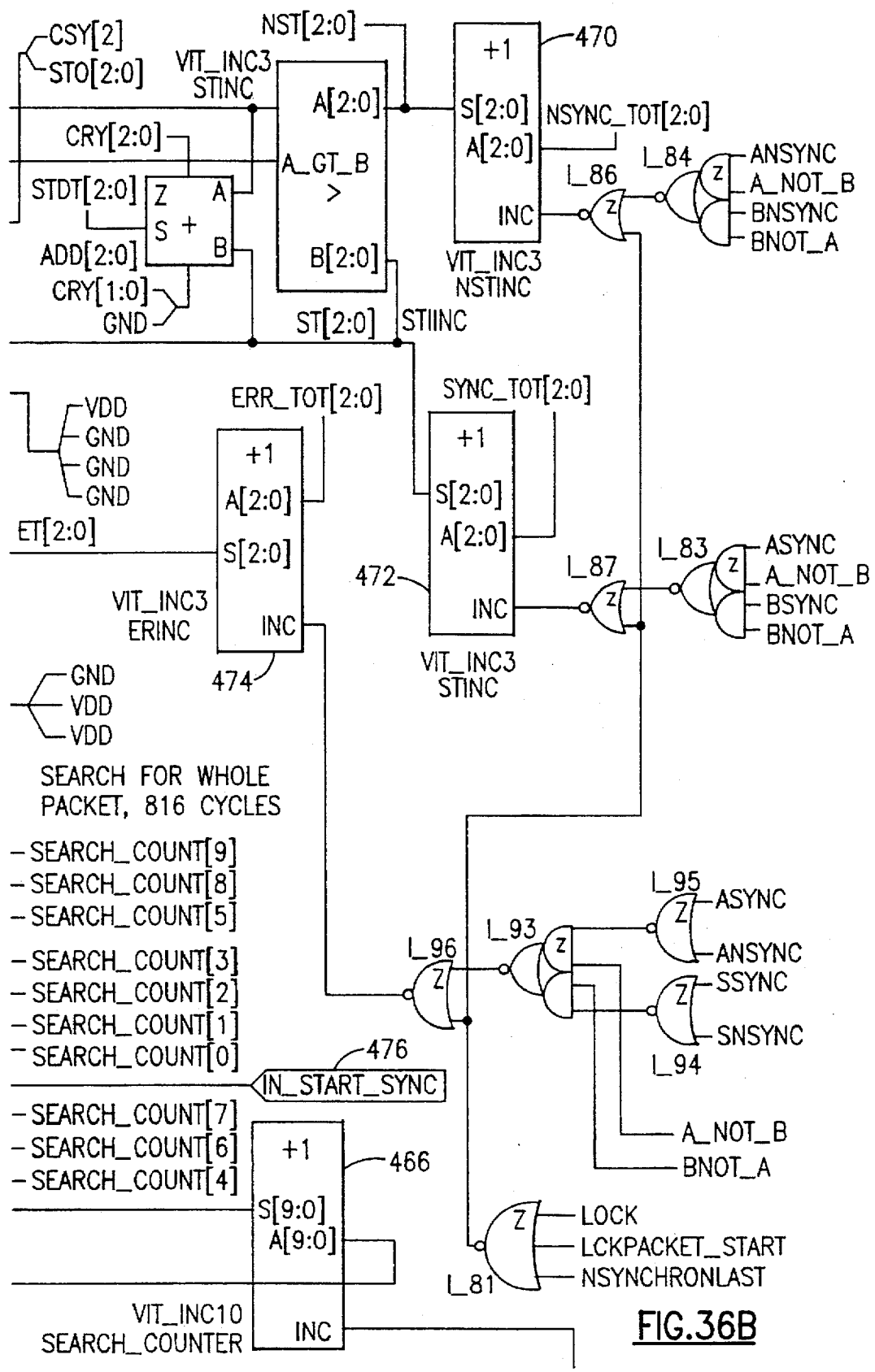
Figure 36C:
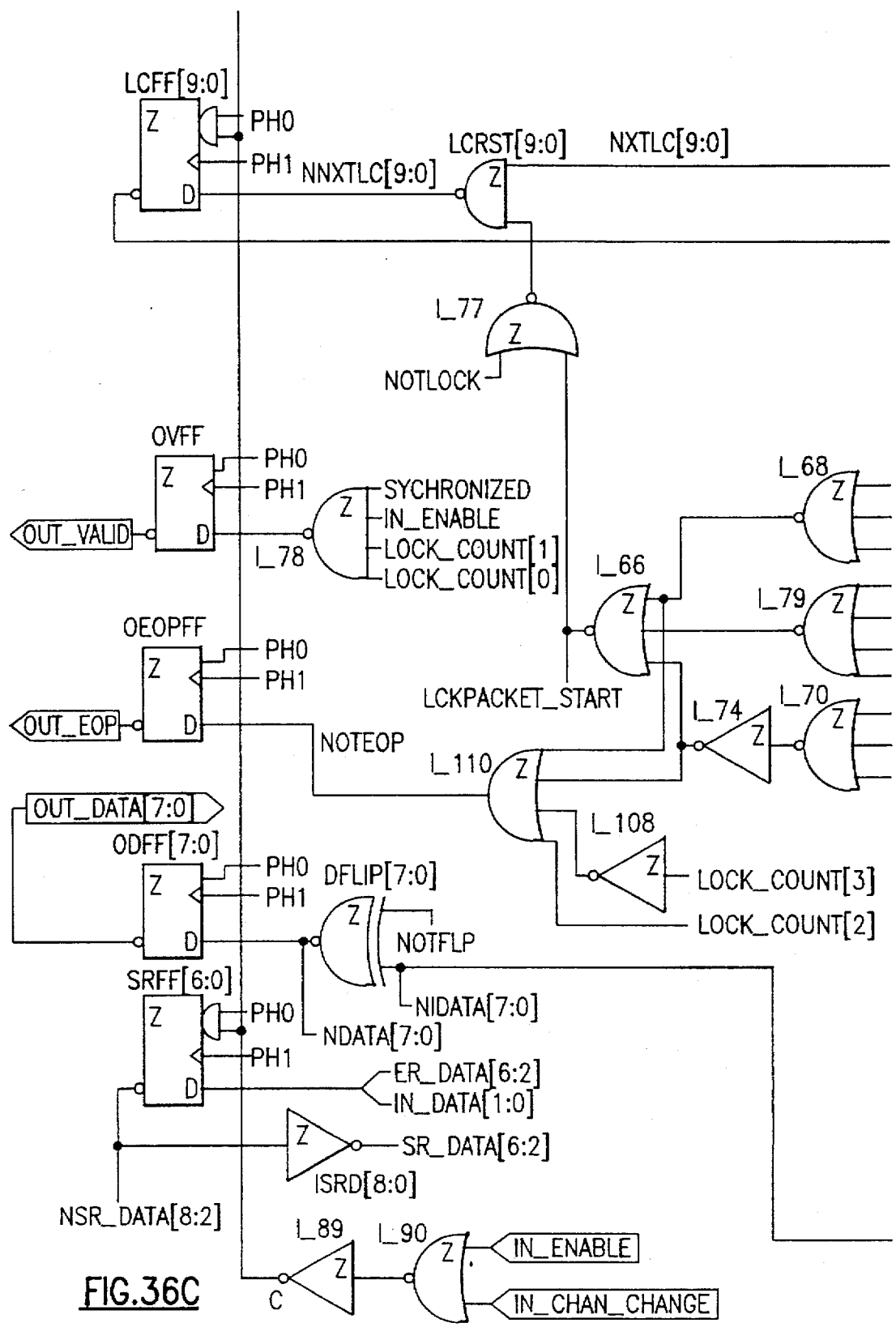
Figure 36D:
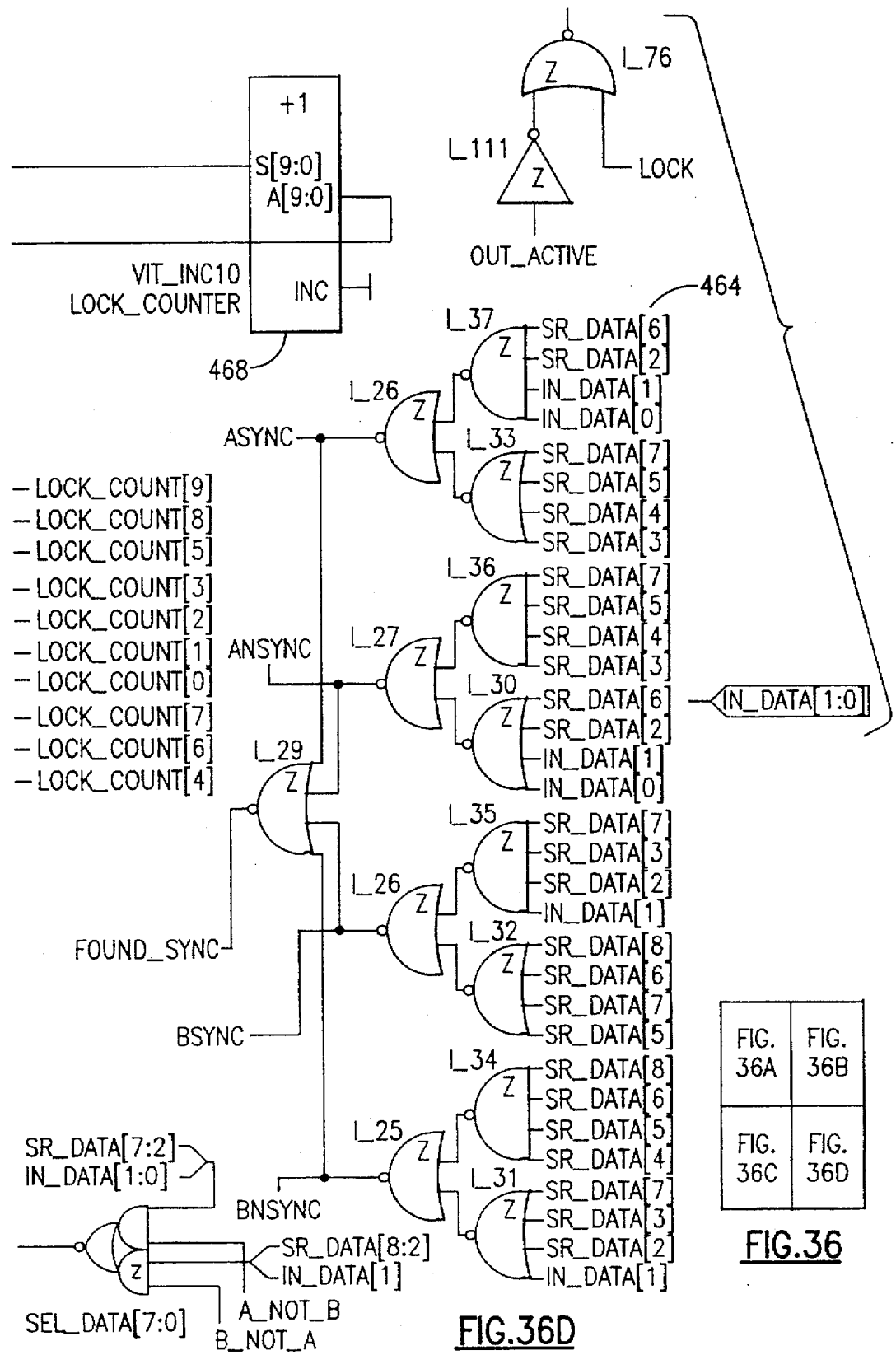

A state diagram of the operation of the synchronization search unit 193 is depicted in FIG. 35. At the INACTIVE state 452 the search unit is in an inactive state as shown. When signal IN_START_SYNC 444 is received from the control unit the search unit begins searching for a sync byte pattern of 47h or B8h in the SEARCH ANYWHERE state 446. The byte 47h corresponds to a positive sync pattern and B8h is an inverted sync pattern. The Viterbi decoder can operate on inverted data, a condition determined by noting the number of sync bytes, and the number of inverted sync bytes found by the synchronization search unit 193 (FIG. 15). The data that is being received from the traceback unit 191 (FIG. 15) is in 2-bit symbols. Because the decoder is utilizing a 2-step process, the start of a byte will be in one of two bit positions. The search unit therefore starts searching for the positive and negative sync byte pattern in two start bit positions. The search continues for every bit of a packet length of data as shown by the NOT FOUND AND NOT DONE ALL PACKET condition 448. If a full packet of data has been searched, and neither positive nor inverted sync has been found as shown by NOT FOUND DONE ALL PACKET condition 450, the search unit returns to the INACTIVE state 452 and signals the control unit 195 (FIG. 15) on sync active line 157 (FIG. 15) that the search was unsuccessful.

When a sync pattern is detected, the search unit enters a LOCKED SEARCH state 454 following step FOUNDSYNC 456. In this state the search unit assumes that it has found a valid positive or inverted sync byte, and attempts to validate the sync by searching for the sync pattern in successive packet intervals where sync would be expected to be found. While in this state a count of successive valid and invalid sync bytes found is maintained. The search unit remains in this state until one of two conditions are met as indicated by loop SEARCHING SYNC+NSYNC<8, referenced 458. If three or more sync bytes are erroneous within the scope of the search, the LOCKED SEARCH state 454 is exited and the search unit returns to the SEARCH ANYWHERE state 446 as shown by path ERROR>3 460. Here it resumes the bit by bit search from the relative position in the packet where it previously was. If eight sync or inverted sync bytes are found to be valid, without incurring three or more errors, the search unit enters the SYNCHRONIZED state 462. Thereupon valid data is output. The search unit remains in this state until a channel change occurs.

Referring now to FIGS. 35 and 36, there is shown the logic diagram of the synchronization search unit. The combinational logic for decoding the sync byte patterns from the input data is realized by logic gates 464. These gates decode the positive and inverted sync byte patterns from the two bit start locations in the above noted 9-bit assembly. The SEARCH_COUNTER 466 is the counter associated with the SEARCH ANYWHERE state 446. During the LOCKED SEARCH state 454, the LOOK_COUNTER 468 is used. When the search unit is in the LOCKED SEARCH state 454, counter 470 maintains a count of the inverted sync bytes found, counter 472 counts the positive sync bytes found, and counter 474 counts the erroneous sync bytes. The IN_START_SYNC signal from the control unit 195 (FIG.

15) is shown on line 476. The sync active signal to the control unit is shown as OUT_ACTIVE 478.

Deinterleaver

The deinterleaver 62 will be discussed with reference to FIGS. 1, 37 and 38. Twelve-way Forney deinterleaving of transmitted data is specified in the above noted European Telecommunications standard. According to the interleaving process, a first byte flows through the interleaver without delay. A second byte is delayed by 17 cycles; a third byte is delayed by 2×17 cycles, etc. In the deinterleaver, the first byte is delayed by 11×170 cycles; a second byte is delayed by 10 x 17 cycles; a third byte is delayed by 9 x 17 cycles, etc. In the preferred embodiment 11 separate shift registers for deinterleaving the data have been implemented as a single block of 3-cycle synchronous static random access memory (RAM) 480. Pointers to base addresses within the memory 480, such as representative base addresses 482 and 484, are generated by a circuit 486.

Within the memory 480 the first 11×17 bytes are used to implement an 11×17 byte shift register 488. A subsequent block of the memory 480 is allocated to a 10×17 byte shift register 490, and so on. Thus the memory 480 is logically divided into 11 different sections, monotonically decreasing in size.

Figure 38:
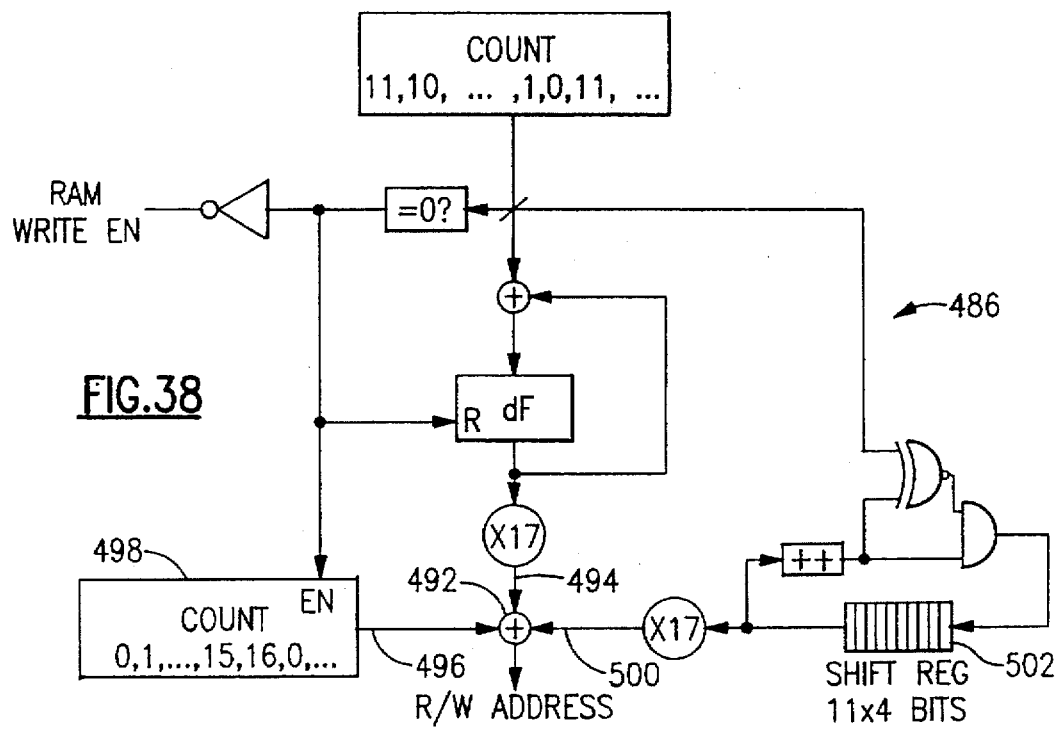
FIG. 38 is an electrical schematic of a portion of the deinterleaver indicated in FIG. 37.

In FIG. 38 an adder 492 outputs an effective address for accessing the memory 480. A first input 494 of the adder 492 is a base address of the current shift register, i.e. 482. A second input 496 is the output of a byte counter 498, represented modulo 17. The third input 500 is the shifted-out value of an 11×4 bit shift register 502 multiplied by 17, which is a packet index into the current shift register, modulo length of the current shift register.

Figure 39:
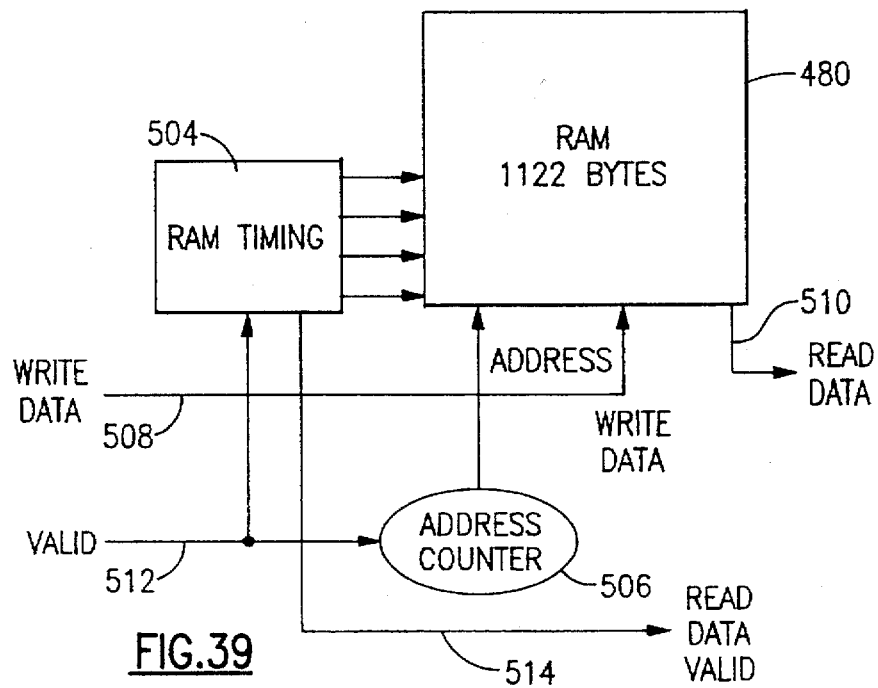
FIG. 39 is a block diagram of the deinterleaver illustrated in FIG. 38.

The organization of the deinterleaver 62 (FIG. 1) can be appreciated with reference to FIG. 39, wherein the memory 480 has 1122 bytes. Operation of the memory 480 is controlled by a timing block 504, which initiates a memory read-write cycle, and increments the address counter 506. The memory 480 is attached to a write data bus 508, and a read data bus 510. Control signals include a valid signal on line 512, which is propagated from previous stages, and a read data valid signal on line 514, which indicates whether a memory read operation was successful.

Central Control

Figure 40:
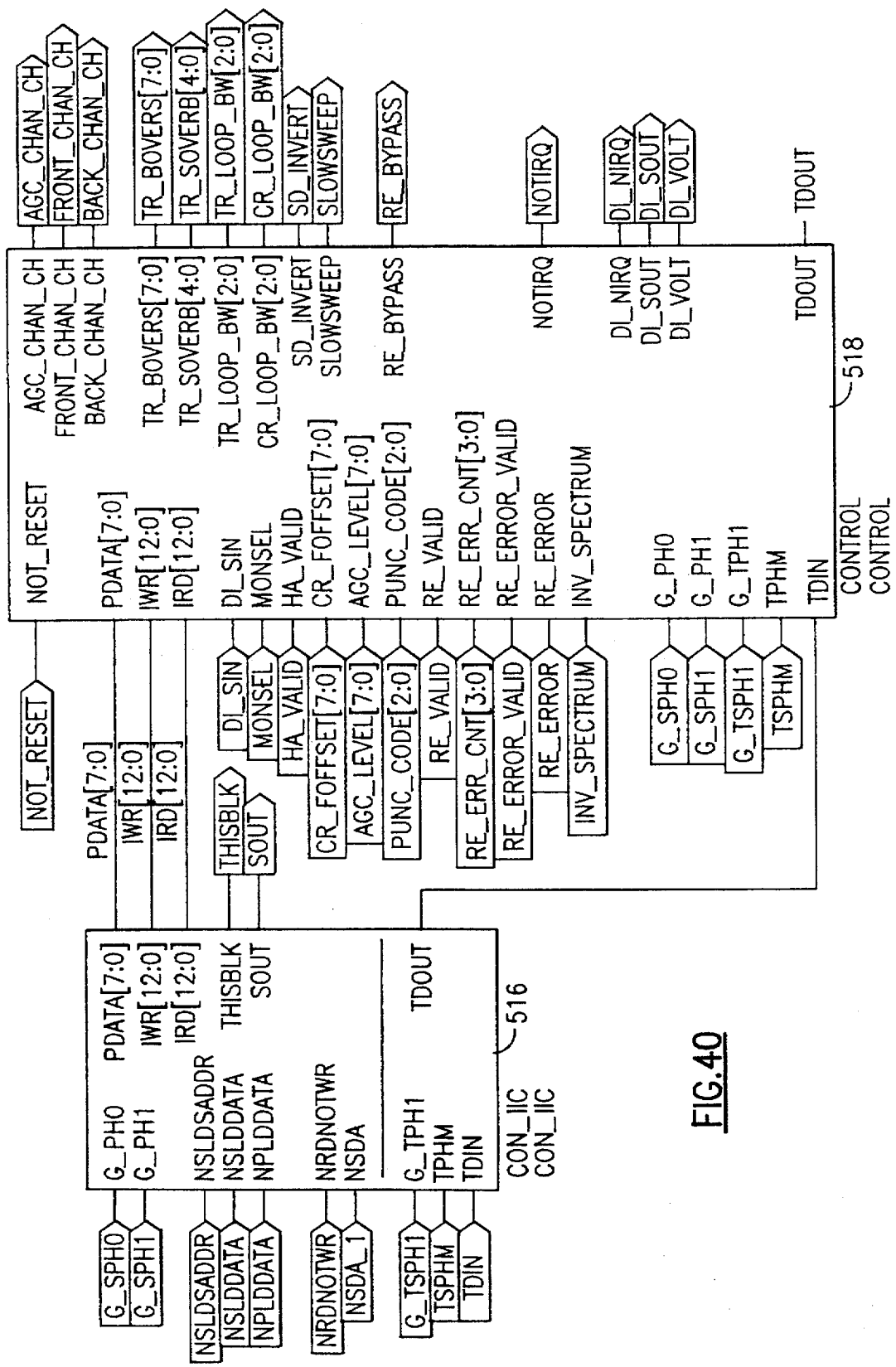
FIG. 40 is a block diagram of the central control block of the receiver illustrated in FIG. 1.
Figure 41A:
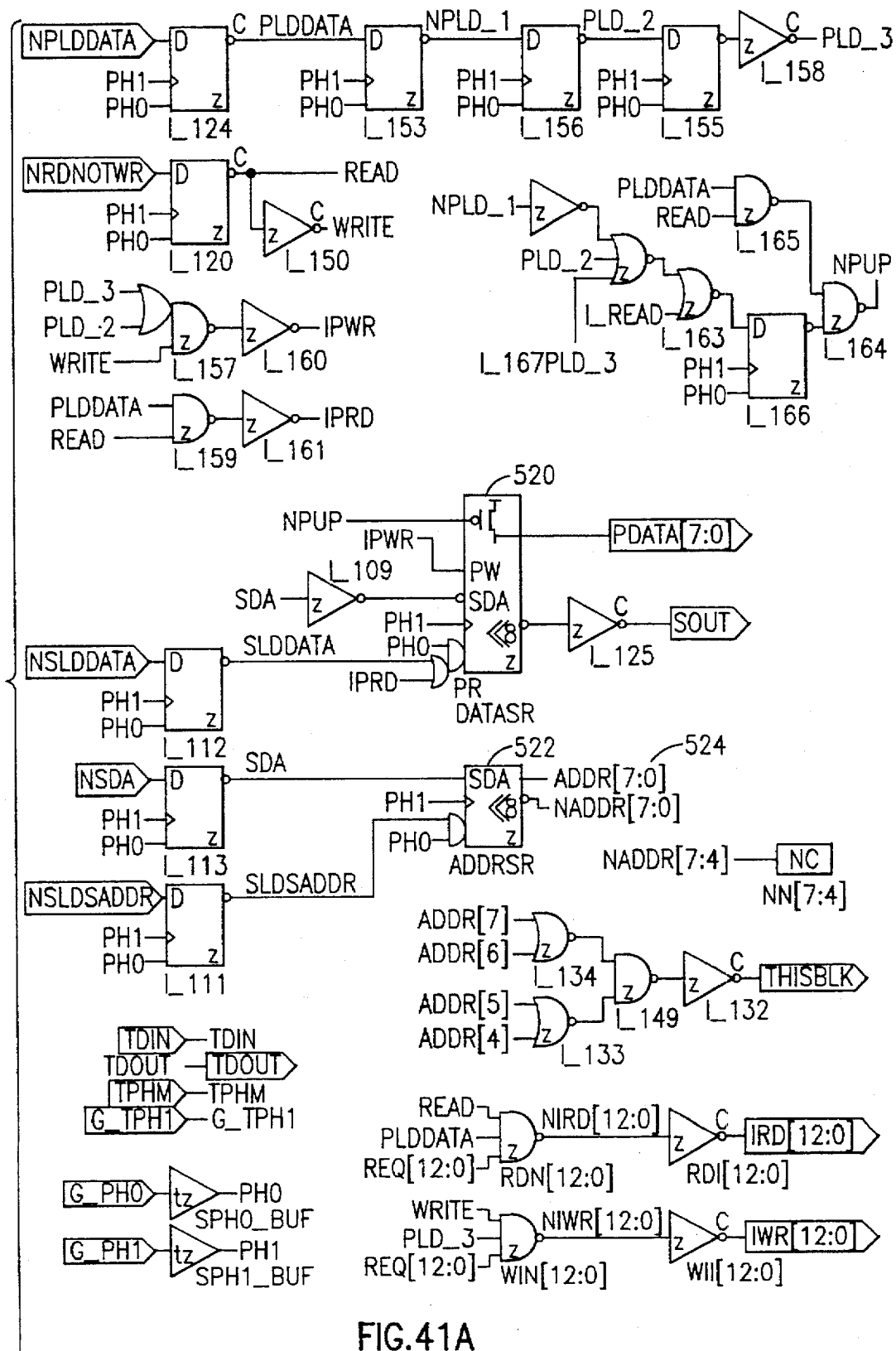
FIG. 41A–41B, referred to collectively as FIG. 41, are an electrical schematic of the control decode block in the circuitry of FIG. 40.
Figures 41, 41B:
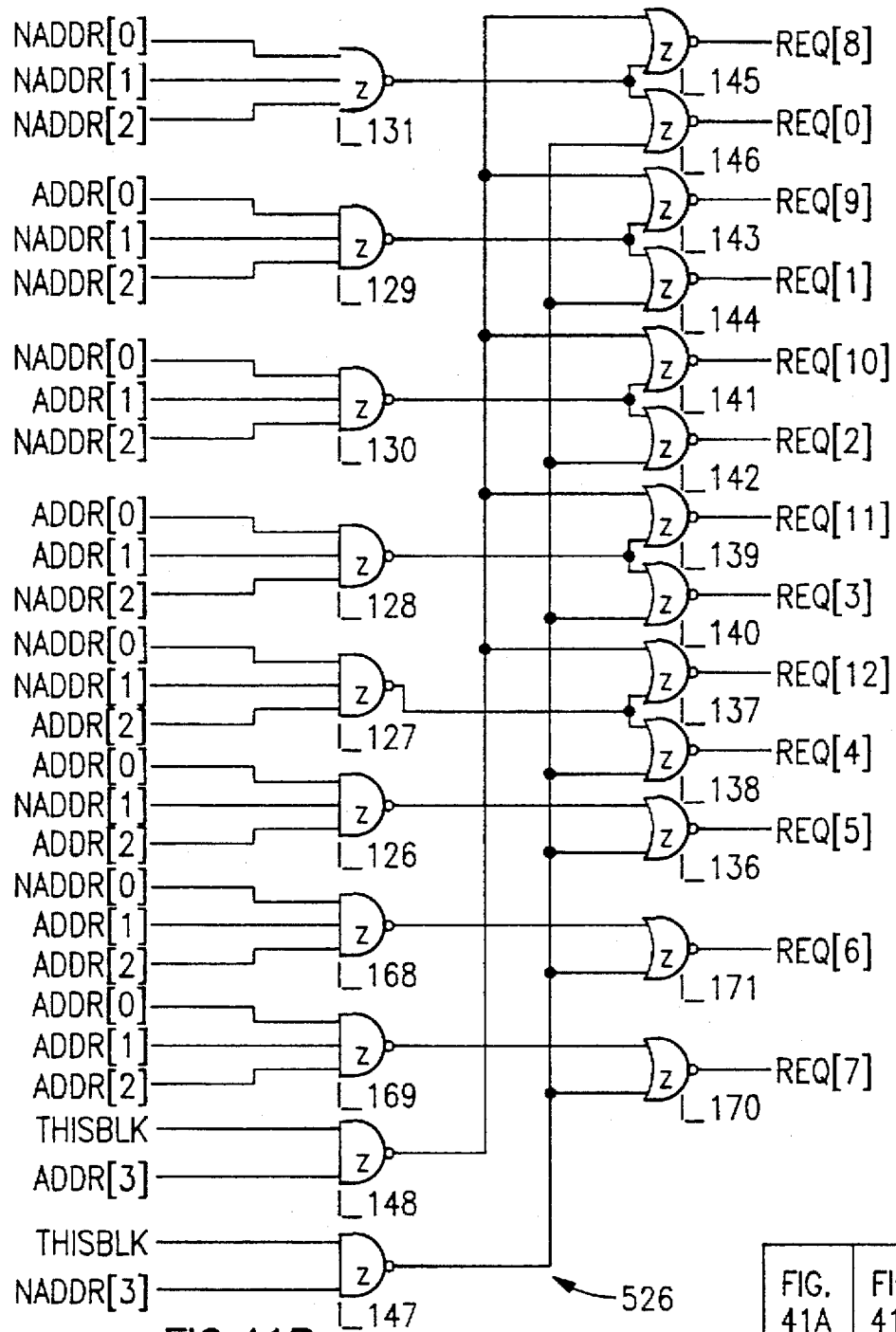

The central control block 98 (FIG. 1) is discussed initially with reference to FIG. 40. Block 516 is a control decode block for the I²C bus (not shown), used for writing to and reading from registers within the principal control block 518. The block 516 is discussed with reference to FIG. 41, which shows a serial data bus, and includes a first shift register 520 for decoding data, and a second shift register 522 for decoding addresses according to control signals. The output of the shift register 522 is placed on an 8-bit bus 524. The top 4 bits are used to decode the block currently being considered using logical network 526.

Figure 42A:
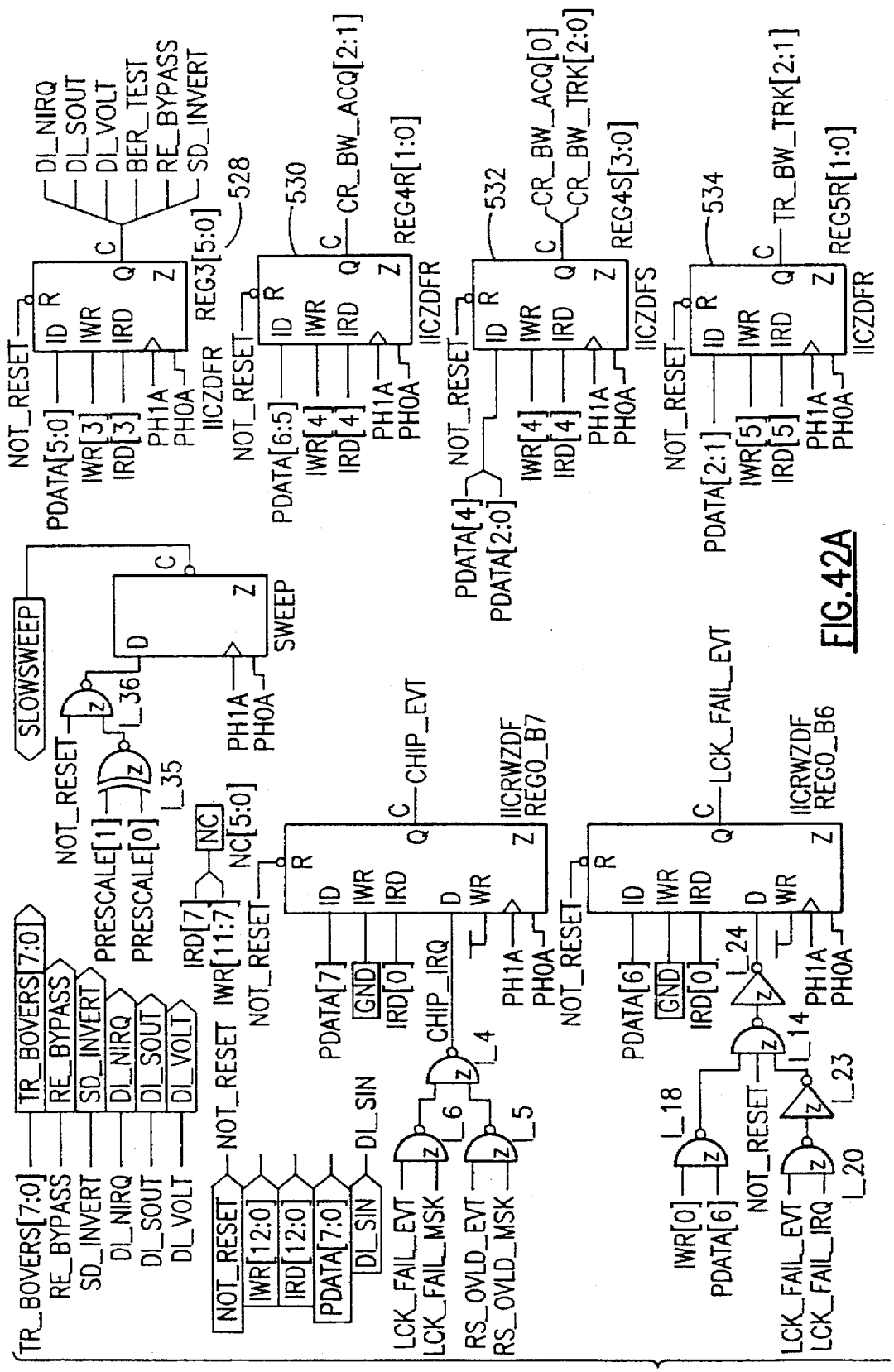
Figure 42B:
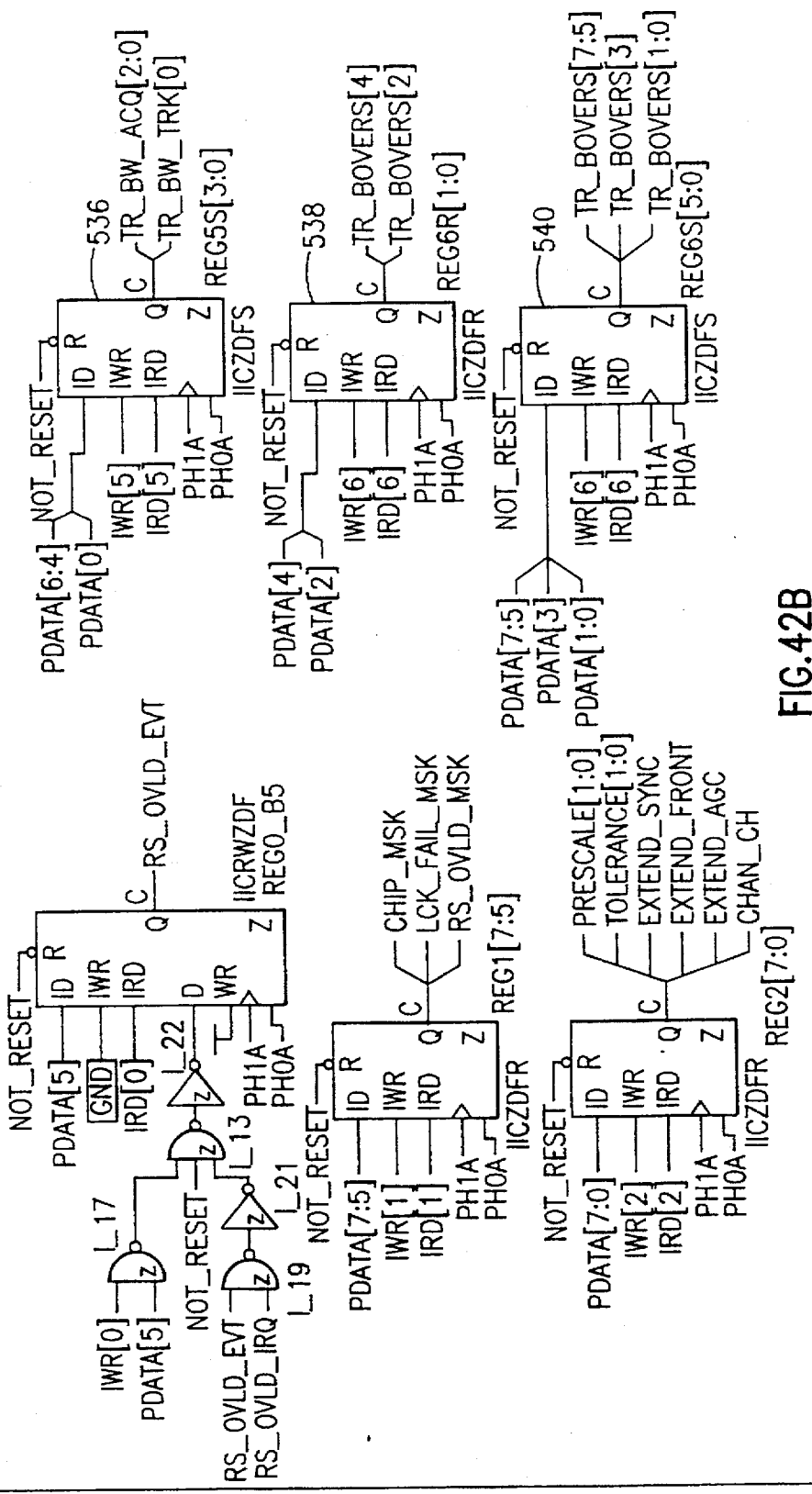

FIG. 42 illustrates all the registers used in the central control block 98. Registers 528, 530, 532, 534, 536, 538, and 540 are written by the I²C bus to configure the central control block 98 (FIG. 1). A column of registers, generally referenced 542, are employed for monitoring the internal status of the central control block 98, and for monitoring retimed input signals on lines generally referenced 544, line 546, and line 548. It is possible for the I2C bus to read the central control block 98, as it is intended to be used with an external control device, such as a microprocessor, to interrogate and control the central control block 98. The central control block 98 contains circuitry compatible with the digital satellite equipment control standard DiSEqC (trademark).

Figure 43A:
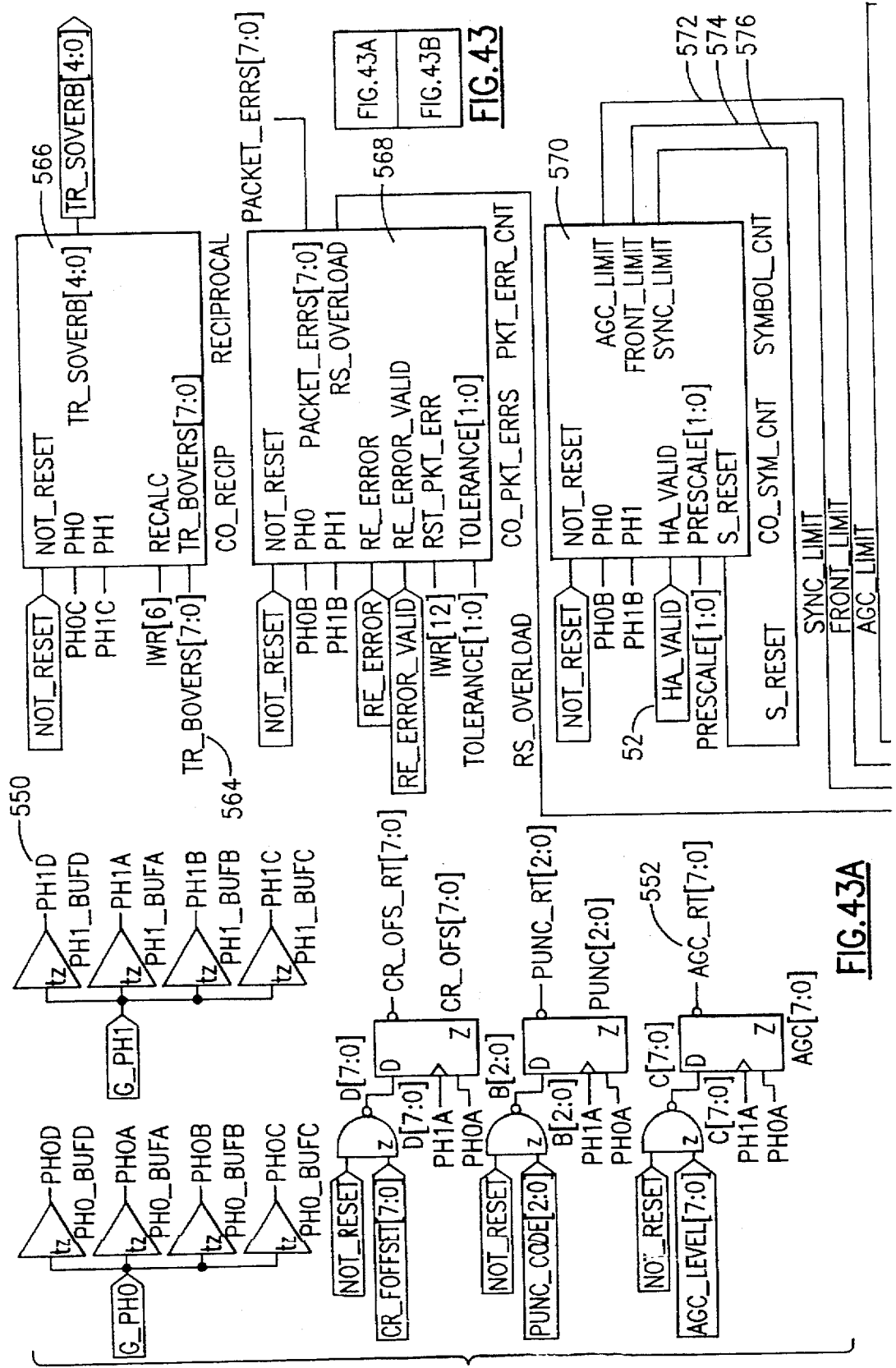
FIG. 43A–43B, referred to collectively as FIG. 43, are an electrical schematic showing certain details of the central control block of FIG. 40.
Figure 43B:
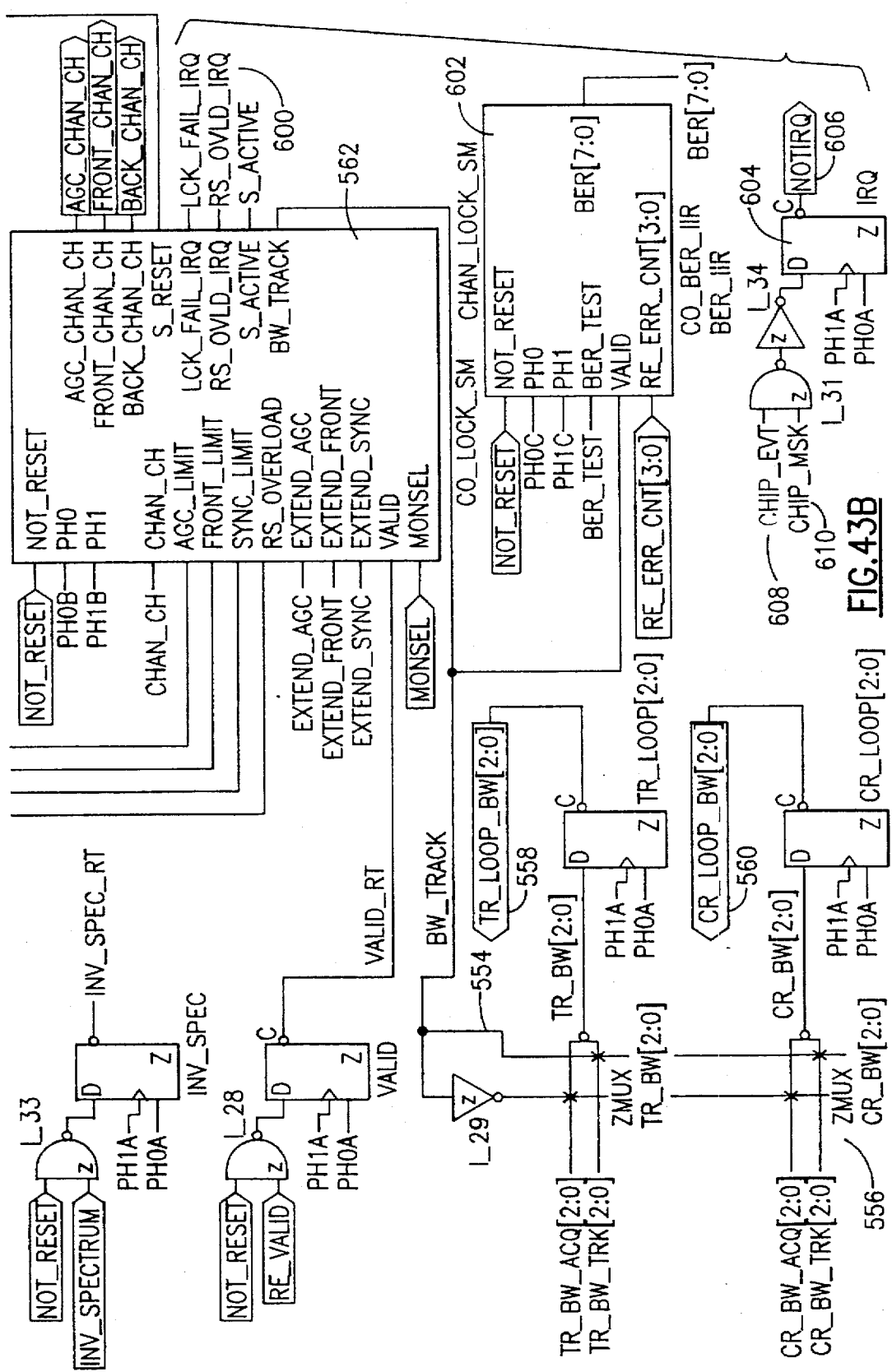

Further details of the central control block 98 are illustrated in FIG. 43. Several clock buffers are generally referenced 550. Retiming of inputs from other parts of the receiver 2 (FIG. 1 ) occurs in five flip-flops 552. Two multiplexers 554, 556 select outputs to the timing recovery circuitry 10, and the carrier recovery circuitry 20 (FIG. 1) on buses 558 and 560 respectively, according to the state of the channel lock state machine 562.

The reciprocal of the value on bus 564 is calculated in block 566, which corresponds to the reciprocal generator 118 (FIG. 4), and is used for timing recovery. Consecutive and cumulative packet errors detected in the Reed-Solomon decoder 70 (FIG. 1) are counted in block 568. Another counter block 570 counts the decoder symbols immediately prior to processing by the Viterbi decoder 56, accepting an input on line 52 (FIG. 1). It produces control signals on lines 572, 574, and 576 for indicating that channel lock state machine 562 is to transition to its next state.

Figure 44A:
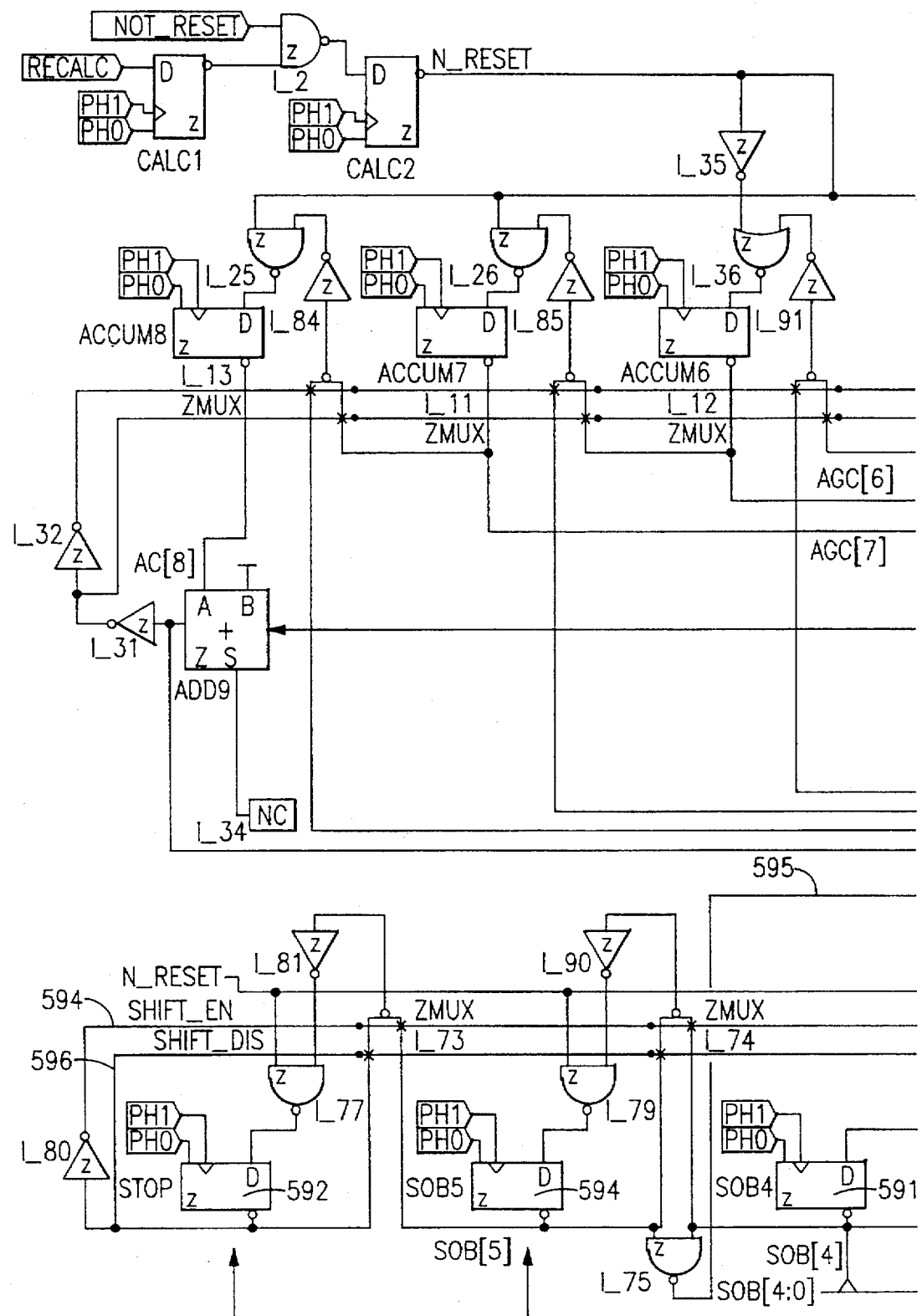
Figure 44C:
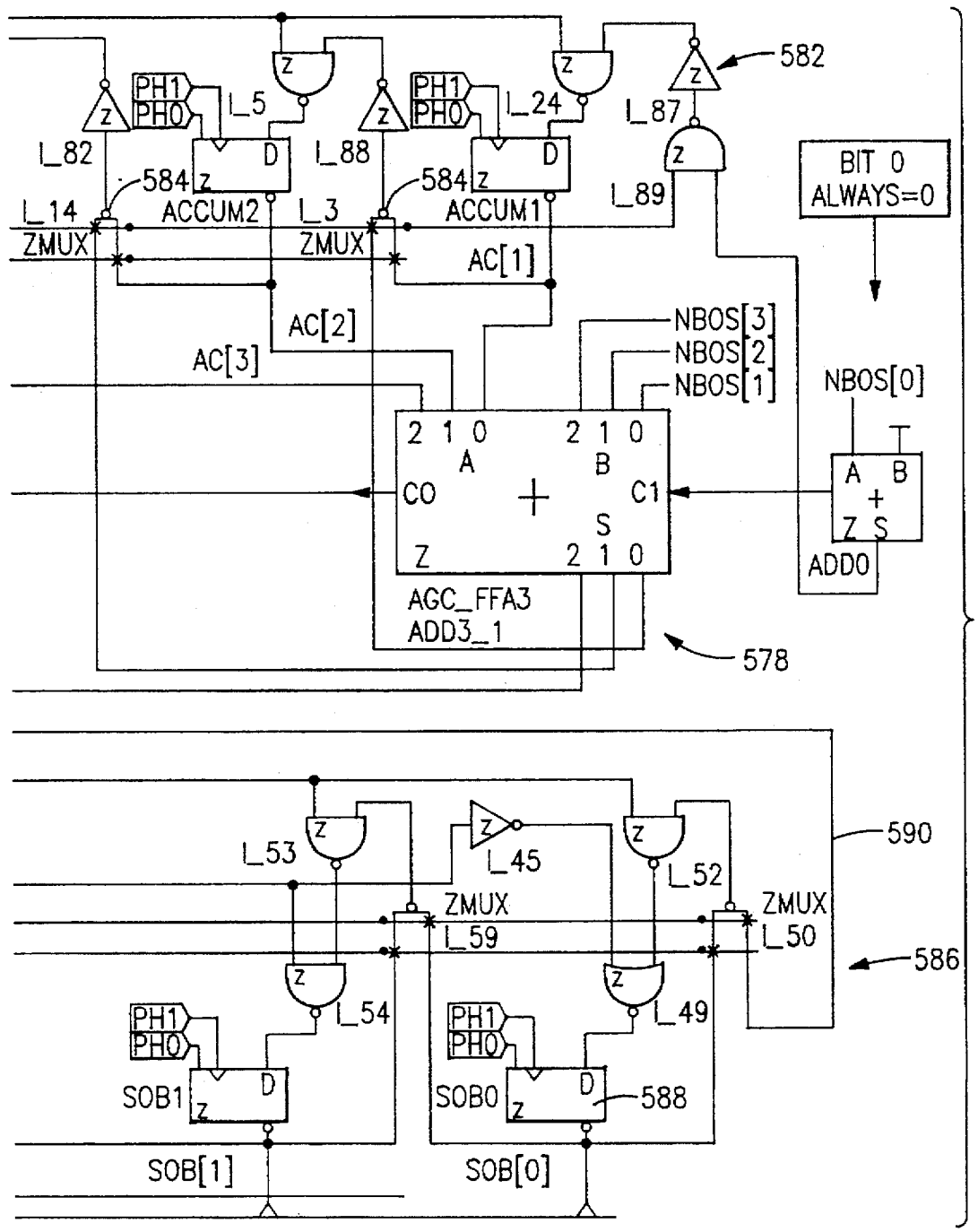

The details of the block 566 are illustrated in FIG. 44. A row of fast adders 578 repeatedly subtracts the data input, taken from a bus 580, from the value held in the shift register 582. If this operation does not result in an overflow, the result is selected in a plurality of multiplexers 584. If an overflow occurs, however, the original value in the shift register 586 is selected. the data is then shifted toward the most significant bit position of the shift register 580 at the left side of FIG. 44, and the subtract operation is repeated.

Detection of an overflow following a series of shift-subtract operations in the shift register 582 will now be described. A second shift register 586 is initialized to zero, except for the register 588 in the least significant bit position. The shift register 586 receives the final carry output from the row of adders 578 on line 590. The shift register 586 contains one extra register 592. Following a sequence of cycles of the shift register 582, the bit originally set in register 588 arrives in the register 594. The preceding register 591 is then tested for the presence of an overflow bit. If an overflow bit is present in register 591, a saturation signal is asserted on line 595, and the contents of the shift register 586 are all set to one. After one more cycle of the shift register 582, the original bit set in register 588 arrives in the register 592. The shift register 582 is then disabled according to control lines 596, 599. The reciprocal is output from the shift register 586 onto a bus 598.

The channel lock state machine 562 (FIG. 43) is partly controlled by the input and symbol count of block 570. The block 562 drives the channel change control signals to various parts of the receiver 2 (FIG. 1), and also signals interrupts according to various failures on interrupt lines 600. Block 562 also controls the multiplexers 554, 556.

Figure 45B:
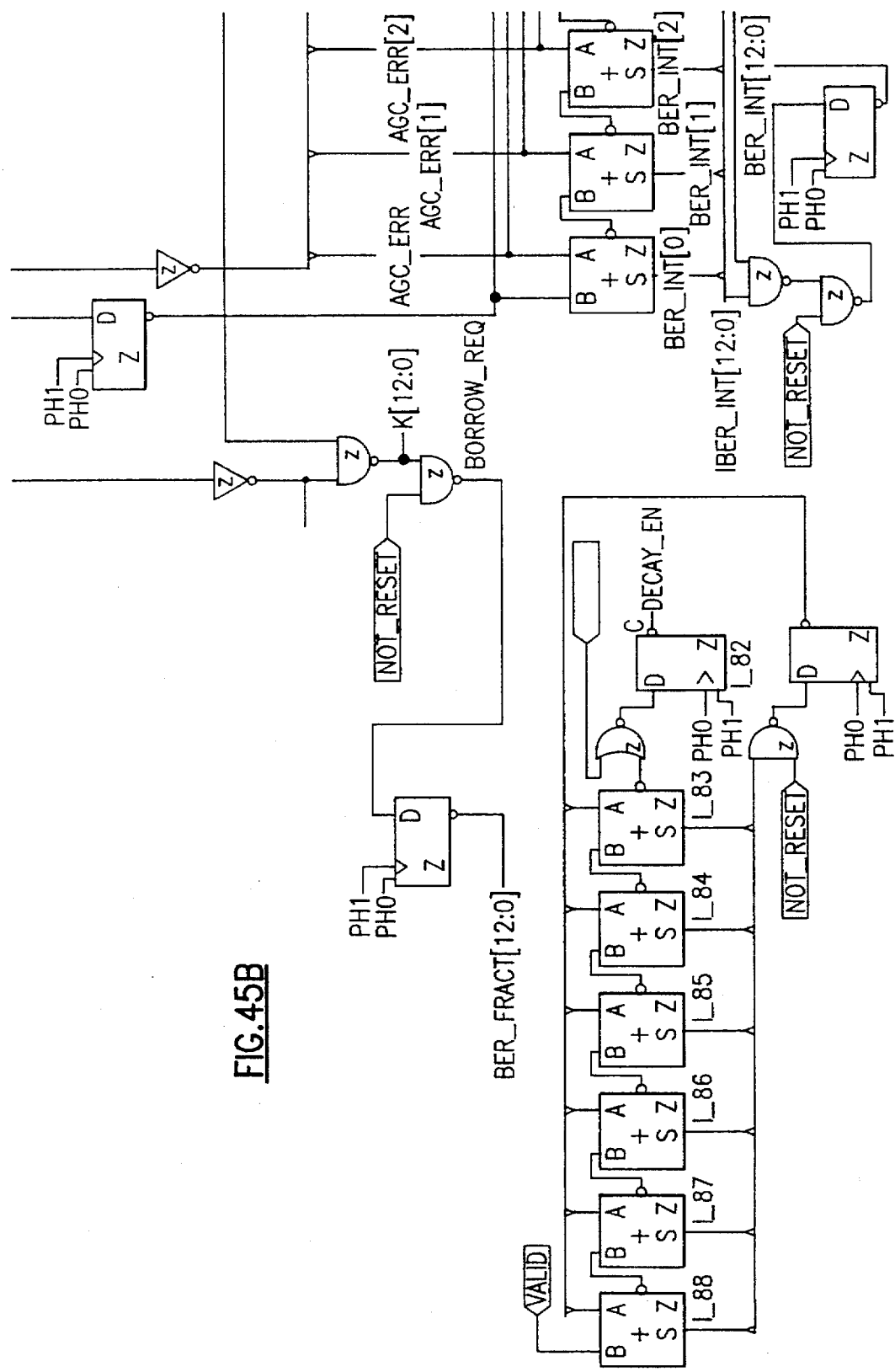
Figure 45C:
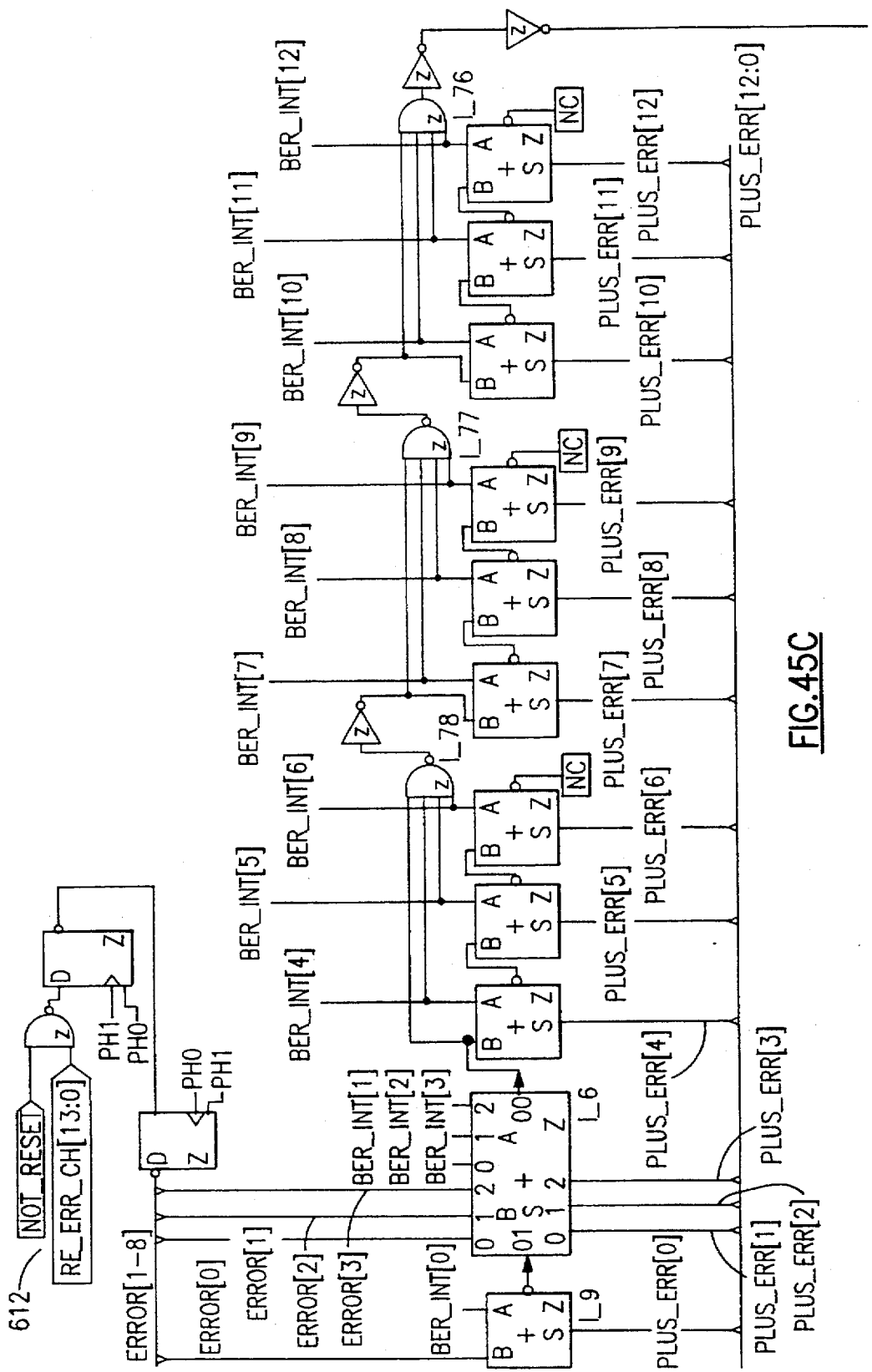
Figure 45D:
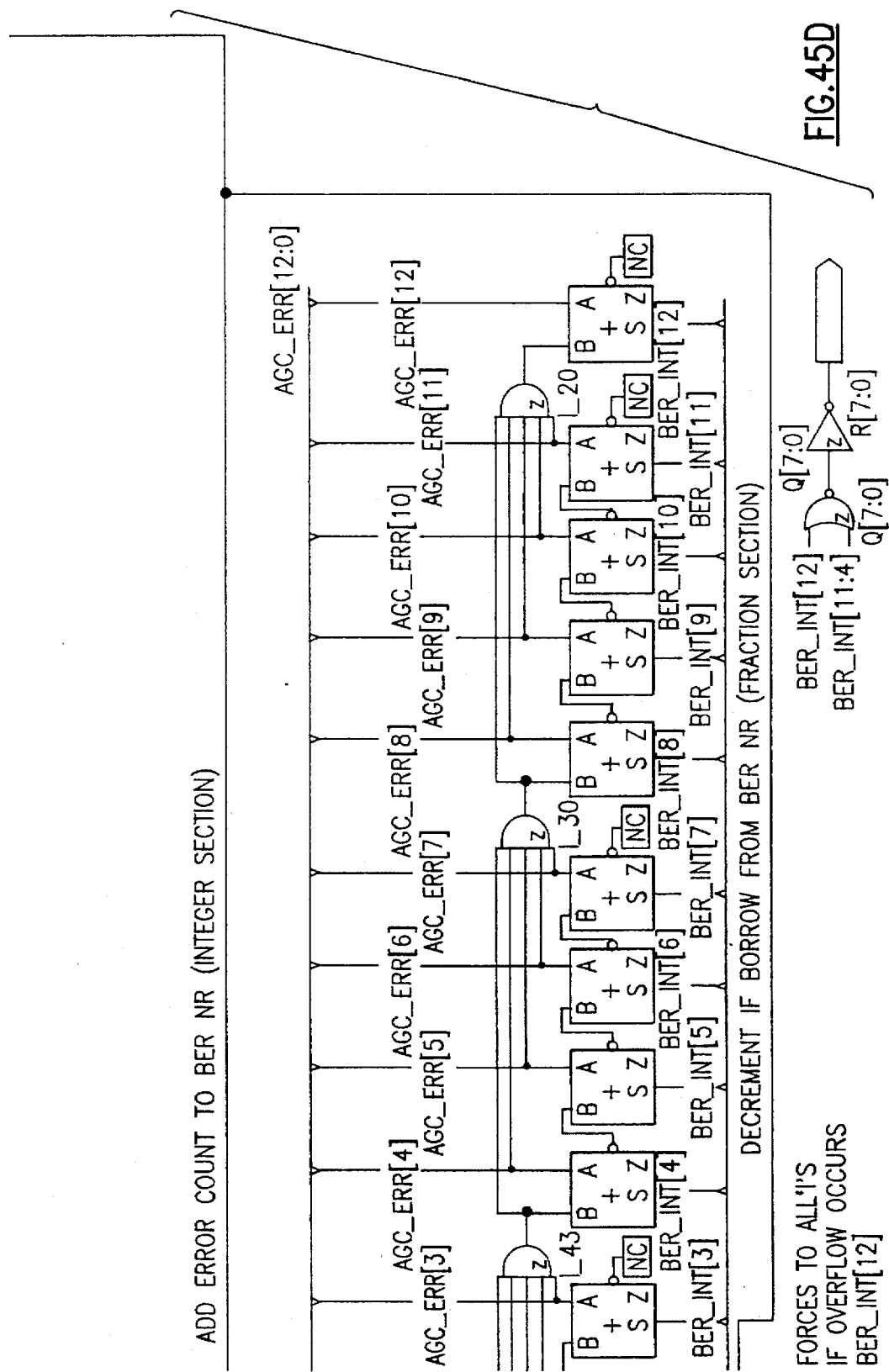

The block 602 provides a bit error rate indication, and incorporates an infinite impulse response filter, shown in FIG. 45. A flip-flop 604 retimes the main interrupt line 606 for the receiver, according to chip event control line 608, and the setting of an interrupt mask on line 610. Block 602, which monitors the output from the Reed-Solomon decoder 70 (FIG. 1), is illustrated in further detail in FIG. 45. The detected bit error count for each byte is received on a bus 612. A group of subtracters 614 subtract a fractional portion, $\frac{1}{2}^{13}$, of the bit error rate every 64 symbols, which is approximately equivalent to subtracting $\frac{1}{2}^{19}$ of the bit error rate once every symbol. This arrangement reduces the area required for the module, as the number of adders can be substantially reduced. More particularly, on each valid symbol, the module evaluates the scaled bit error rate (BER) according to the equation $$BER_{i+1} = BER_i + \frac{\text{Bit Error Count}}{2^4} - \frac{BER_i}{2^{19}}$$

The true bit error rate equals $3.8 \times 10^{-6} \times BER$

While this invention has been explained with reference to the structure disclosed herein, it is not confined to the details set forth, and this application is intended to cover any modifications and changes as may come within the scope of the following claims.

What is claimed is:

1. A decoder for received data symbols that are encoded according to a convolutional encoding scheme, the data being punctuated according to a puncturing matrix, the data having a plurality of state values and describing a sequence of state transitions from a first state to a succeeding state, wherein a path is defined by the sequence of state transitions, the decoder comprising:

a generation unit accepting said received data for calculating metrics of the transitions thereof from the first state to the succeeding state, wherein said metrics correspond to a likelihood that a measured path follows a path produced by an encoder of the data;

a selector responsive to said generation unit for selecting a path corresponding to the path produced by a transmitter of the data stream; a traceback unit for maintaining historical information representative of sequential decision operations of said selector;

a counter for counting illegal state transitions of the path selected by said selector; and a control unit, responsive to said counter, for determining a puncture rate and adjusting a puncture phase of the received data.

2. The decoder according to claim 1, wherein said generation unit comprises:

a branch metric generator for precalculating branch metrics, wherein said branch metrics are a measure of probability values associated with all legal transitions of received data from the first state to the succeeding state; and a path metric generator receiving said precalculated branch metrics from said branch metric generator.

3. The decoder according to claim 2, wherein said generator unit and said selector evaluate m succeeding transitions in a cycle of operation, and comprise a plurality of add-compare-select blocks, and each of said add-compare-select blocks transmits m symbols of data to said traceback unit in one clock cycle.

4. The decoder according to claim 1, wherein said generator unit evaluates m succeeding transitions in a cycle of operation, and comprises a plurality of add-compare-select blocks, and each of said add-compare-select blocks transmits m symbols of data to said traceback unit in one clock cycle.

5. The decoder according to claim 2, further comprising a rescaling unit linked to a said add-compare-select block, for rescaling the path metric of said selected path to a non-negative number.

6. The decoder according to claim 5, wherein the non-negative number is derived from a value of said path metric determined in an previous cycle of operation of said linked add-compare-select block.

7. A decoder of symbols of received data encoded according to a convolutional encoding scheme, the data being punctuated according to a puncturing matrix, the data having a plurality of state values and describing a sequence of state transitions from a first state to a succeeding state, wherein a path is defined by the sequence of state transitions, the decoder comprising:

a generation unit accepting said received data for calculating metrics of the transitions thereof from the first state to the succeeding state, wherein said metrics correspond to a likelihood that a measured path follows a path produced by an encoder of the data;

a selector responsive to said generation unit for selecting a path corresponding to the path produced by a transmitter of the data stream;

a traceback unit for maintaining historical information representative of sequential decision operations of said selector, wherein said traceback unit has a succession of traceback columns, each column maintaining a portion of said historical information, each traceback column having a plurality of traceback elements, wherein a traceback element of a said traceback column is addressed by predecoded select lines according to contents of at least one previous traceback column, and wherein an output of each said traceback column is placed on a precharged line.

8. The decoder according to claim 7, wherein each said traceback element accepts m bits of traceback data in a clock cycle.

9. The decoder according to claim 7, further comprising:

a counter for counting illegal state transitions of the path selected by said selector; and a control unit, responsive to said counter, for determining a puncture rate and adjusting a puncture phase of the received data.

10. An error detection and correction system for a stream of data which is randomized, convolutionally interleaved and punctured at a puncture rate and a puncture phase, wherein the data is in symbols and is transmitted at a symbol rate in a signal constellation, comprising:

an m-step inner decoder operating in a first mode and a second mode, said m-step inner decoder including:

a branch metric calculation unit for outputting branch metrics for a selected puncture rate and a selected puncture phase;

a plurality of add-compare-select blocks for outputting values of path metrics from said branch metrics, comparing said values and selecting a one of said values corresponding to a minimum value;

a rescaling unit operating on said outputs of said add-compare-select blocks for rescaling said outputs according to said minimum value;

a state transition module operative in said first mode of operation for detecting illegal state transitions of said value of said path metrics selected by said add-compare select blocks, said state transition module outputting estimates of the puncture rate, and the puncture phase of the symbols for controlling said branch metric calculation unit for varying said selected puncture rate and said selected puncture phase;

a synchronization search unit enabled in said second mode of operation and responsive to said state transition module for identifying synchronization information in the data stream;

a traceback module linked to said add-compare-select blocks having a succession of traceback columns wherein each column represents all historical data of selected values of paths determined at a point in time by said add-compare-select blocks, said traceback columns having a plurality of traceback elements each accepting m bits of traceback data, wherein said traceback elements are addressed by predecoded select lines according to contents of at least one previous traceback column;

a deinterleaver coupled to said m-step inner decoder;

an outer decoder receiving deinterleaved data from said deinterleaver; and a derandomizer coupled to said outer decoder.

11. The system according to claim 10 wherein said state transition controls said branch metric calculation unit for varying said selected puncture rate and said selected puncture phase when said detected illegal state transitions exceeds a predetermined value.

12. The system according to claim 11 wherein said rescale unit operates on said add-compare-select outputs to rescale said outputs to non-negative numbers.

13. The system according to claim 11 or claim 12, wherein an output of each said traceback column is placed on a precharged line.

14. The system according to claim 10, claim 11, or claim 12, wherein said branch metric calculation unit processes m symbols at a time.

15. The system according to claim 14, wherein said synchronization search unit provides a signal to said first control unit indicative of a search result wherein said first control unit resumes a state of said first mode of operation when said signal indicates a failed search result.

16. The system according to claim 15 wherein said synchronization search unit additionally searches for inverted sync bytes.

17. A transmission receiving system for a quadrature phase shift keyed stream of data which is randomized, convolutionally interleaved and punctured at a puncture rate and a puncture phase, wherein the data is in symbols and is transmitted at a symbol rate in a signal constellation, and outputting an error corrected data stream, comprising:

an I, Q demodulator which accepts the data at said transmitted symbol rate;

an analog-to-digital converter for converting an analog output of said I,Q demodulator;

a sinc interpolator receiving samples from said analog-to-digital converter at a sampling rate;

a timing recovery circuit comprising:

a first numerically controlled oscillator operative at periods T;

a first loop filter, coupled to said interpolator and said first numerically controlled oscillator and having an output responsive to a difference between said periods T and said received symbol rate wherein said first numerically controlled oscillator is responsive to said first loop filter and generates an output signal that is representative of an interpolation distance between succeeding samples, and said interpolator interpolates said received samples according to said interpolation distance, and produces an output signal representative of said interpolated samples;

a matched Nyquist filter coupled to said interpolator;

a carrier recovery circuit for controlling said I,Q demodulator, comprising:

a second numerically controlled oscillator;

a digital derotation circuit responsive to said second numerically controlled oscillator and accepting an in phase component and a quadrature component of sampled signals;

a phase error estimation circuit, coupled to an output of said derotation circuit; and a second loop filter coupled to an output of said phase error estimation circuit; wherein said second numerically controlled oscillator is responsive to said second loop filter;

a constellation rotation unit for rotating the signal constellation of the symbols;

an m-step inner decoder operating in a first mode and a second mode, said m-step inner decoder including:

a branch metric calculation unit for outputting branch metrics for a selected puncture rate and a selected puncture phase;

a plurality of add-compare-select blocks for outputting values of path metrics from said branch metrics, comparing said values and selecting a one of said values corresponding to a minimum value;

a rescaling unit operating on said outputs of said add-compare-select blocks for rescaling said outputs according to said minimum value;

a state transition module operative in said first mode of operation for detecting illegal state transitions of said value of said path metrics selected by said add-compare select blocks, said state transition module outputting estimates of the puncture rate, the puncture phase and a rotation correction for the symbols, said state transition module controlling said branch metric calculation unit for varying said selected puncture rate and said selected puncture phase controlling according to said estimates of the puncture rate and the puncture phase, and said state transition module controlling said constellation rotation unit using said estimate of rotation correction;

a synchronization search unit enabled in said second mode of operation and responsive to said state transition module for identifying synchronization information in the data stream;

a traceback module linked to said add-compare-select blocks having a succession of traceback columns wherein each column represents all historical data of selected values of paths determined at a point in time by said add-compare-select blocks, said traceback columns having a plurality of traceback elements each accepting m bits of traceback data, wherein said traceback elements are addressed by predecoded select lines according to contents of at least one previous traceback column;

a deinterleaver coupled to said m-step inner decoder;

an outer decoder receiving deinterleaved data from said deinterleaver;

a derandomizer coupled to said outer decoder;

an output interface coupled to said derandomizer for outputting the error corrected data stream; and a second control means for controlling interaction of said demodulator, said timing recovery circuit, said carrier recovery circuit, and said output interface.

18. The system according to claim 17 wherein said state transition controls said branch metric calculation unit for varying said selected puncture rate and said selected puncture phase when said detected illegal state transitions exceed a predetermined value.

19. The system according to claim 17 wherein said rescale unit operates on said add-compare-select outputs to rescale said outputs to non-negative numbers.

20. The system according to claim 17 wherein an output of each said traceback column is placed on a precharged line.

21. The system according to claim 17 wherein said branch metric calculation unit processes m symbols at a time.

22. The system according to claim 17 wherein said synchronization search unit provides a signal to said first control unit indicative of a search result wherein said first control unit resumes a state of said first mode of operation when said signal indicates a failed search result.

23. The system according to claim 17 wherein said synchronization search unit additionally searches for inverted sync bytes.

24. The system according to claim 17, wherein said timing recovery circuit receives an error signal that is derived in a feed-back loop from a point beyond said timing recovery circuit.

25. The system according to claim 17, wherein said carrier recovery circuit receives an error signal that is derived in a feed-back loop from a point beyond said carrier recovery circuit.

26. A method of decoding symbols of received data that are encoded according to a convolutional encoding scheme, the data being punctuated according to a puncturing matrix, the data having a plurality of state values and describing a sequence of state transitions from a first state to a succeeding state, wherein a path is defined by the sequence of state transitions, the method comprising:

receiving the data and calculating metrics of the transitions thereof from the first state to the succeeding state, wherein said metrics correspond to a likelihood that a measured path follows a path produced by an encoder of the data;

responsive to said step of calculating, selecting a path corresponding to the path produced by a transmitter of the data stream;

maintaining historical information representative of sequential decision operations of said selector;

counting illegal state transitions of the path selected by said selector; and thereafter determining a puncture rate and adjusting a puncture phase of the received data responsive to said step of counting.

27. The method according to claim 26, wherein in said step of calculating metrics m succeeding transitions are evaluated in a cycle of operation.

28. The method according to claim 26, wherein said step of calculating metrics comprises:

precalculating branch metrics, wherein said branch metrics are a measure of probability values associated with all legal transitions of received data from the first state to the succeeding state; and calculating path metrics according to said precalculated branch metrics.

29. The method according to claim 28, wherein said steps of precalculating branch metrics and calculating path metrics evaluate m succeeding transitions in a cycle of operation.

30. The method according to claim 26, further comprising the step of rescaling the path metric associated with said selected path to a non-negative number.

31. The method according to claim 30, wherein the non-negative number is derived from a value of said rescaled path metric that was determined in a previous performance of said steps of rescaling.

32. A method of error detection and correction method for a stream of data which is randomized, convolutionally encoded, punctured at a puncture rate and a puncture phase, and interleaved, wherein the data is in symbols and is transmitted at a symbol rate in a signal constellation, comprising the steps of:

m-step inner decoding in a first mode and in a second mode by the steps of:

precalculating branch metrics for a selected puncture rate and a selected puncture phase;

calculating path metrics from said precalculated branch metrics;

comparing said path metrics and selecting a minimum path metric thereof;

rescaling values according to said minimum path metric;

detecting in said first mode illegal state transitions of a path corresponding to said minimum path metric;

estimating the puncture rate, and the puncture phase of the symbols in response to a number of illegal state transitions detected;

varying said selected puncture rate and said selected puncture phase in response to said step of estimating;

identifying synchronization information in the data stream in said second mode in response to detected illegal state transitions; and executing a traceback, processing m bits of traceback data at a time, by predecoding select lines in a first traceback column for addressing a traceback element thereof, according to contents of at least one other traceback column;

deinterleaving the m-step inner-decoded data;

outer-decoding the deinterleaved data; and derandomizing the outer-decoded data.

33. The method according to claim 32, wherein said number of illegal state transitions has a predetermined value.

34. The method according to claim 33, wherein said step of rescaling results in non-negative values.

35. The method according to claim 33 or claim 34, further comprising the step of precharging a line for placement of an output of a said traceback column thereon.

36. The method according to claim 32, claim 33, or claim 34, wherein said step of precalculating branch metrics comprises processing m symbols at a time.

37. The method according to claim 36, wherein said first mode resumes when said step of identifying synchronization information is unsuccessful.

38. The method according to claim 32, wherein said step of identifying synchronization information comprises identifying inverted sync bytes.

39. A transmission receiving system for a quadrature phase shift keyed stream of randomized data being convolutionally interleaved and punctured at a puncture rate and a puncture phase, wherein the data is in symbols and is transmitted at a symbol rate in a signal constellation to output an error corrected data stream, said system comprising:

an I, Q demodulator which accepts the data at said transmitted symbol rate;

an analog-to-digital converter for converting an analog output of said I,Q demodulator;

a sinc interpolator receiving samples from said analog-to-digital converter at a sampling rate;

a timing recovery circuit;

a matched Nyquist filter coupled to said sinc interpolator;

a carrier recovery circuit for controlling said I,Q demodulator;

a constellation rotation unit for rotating the signal constellation of the symbols;

an m-step inner decoder operating in a first mode and a second mode;

a deinterleaver coupled to said m-step inner decoder;

an outer decoder receiving deinterleaved data from said deinterleaver;

a derandomizer coupled to said outer decoder;

an output interface coupled to said derandomizer for outputting the error corrected data stream; and a second control means for controlling interaction of said demodulator, said timing recovery circuit, and said carrier recovery circuit.

40. The system according to claim 39 wherein said timing recovery circuit includes a first numerically controlled oscillator operative at periods T, and a first loop filter coupled to said interpolator and said first numerically controlled oscillator, said timing recovery circuit having an output responsive to a difference between said periods T and said received symbol rate wherein said first numerically controlled oscillator is responsive to said first loop filter thereby generating an output signal representative of an interpolation distance between succeeding samples, and said interpolator interpolates said received samples according to said interpolation distance to produce an output signal representative of said interpolated samples.

41. The system according to claim 39 wherein said carrier recovery circuit for controlling said I,Q demodulator, comprises:

a second numerically controlled oscillator;

a digital derotation circuit responsive to said second numerically controlled oscillator and accepting an in phase component and a quadrature component of sampled signals;

a phase error estimation circuit, coupled to an output of said derotation circuit; and a second loop filter coupled to an output of said phase error estimation circuit wherein said second numerically controlled oscillator is responsive to said second loop filter.

42. The system according to claim 39 wherein said m-step inner decoder comprises:

a branch metric calculation unit for outputting branch metrics for a selected puncture rate and a selected puncture phase;

a plurality of add-compare-select blocks for outputting values of path metrics from said branch metrics, comparing said values, and selecting a one of said values corresponding to a minimum value;

a rescaling unit operating on said outputs of said add-compare-select blocks for rescaling said outputs according to said minimum value;

a state transition module operative in said first mode of operation for detecting illegal state transitions of said value of said path metrics selected by said add-compare select blocks, said state transition module outputting estimates of the puncture rate, the puncture phase, and a rotation correction for the symbols, said state transition module controlling said branch metric calculation unit for varying said selected puncture rate and said selected puncture phase controlling according to said estimates of the puncture rate and the puncture phase, and said state transition module controlling said constellation rotation unit using said estimate of rotation correction;

a synchronization search unit enabled in said second mode of operation and responsive to said state transition module for identifying synchronization information in the data stream; and a traceback module linked to said add-compare-select blocks having a succession of traceback columns wherein each column represents all historical data of selected values of paths determined at a point in time by said add-compare-select blocks, said traceback columns having a plurality of traceback elements each accepting m bits of traceback data, wherein said traceback elements are addressed by predecoded select lines according to contents of at least one previous traceback column.

\* \* \* \* \*